US007096434B2

(12) United States Patent
Roesner et al.

(10) Patent No.: US 7,096,434 B2
(45) Date of Patent: Aug. 22, 2006

(54) METHOD, SYSTEM AND PROGRAM PRODUCT PROVIDING A CONFIGURATION SPECIFICATION LANGUAGE SUPPORTING ARBITRARY MAPPING FUNCTIONS FOR CONFIGURATION CONSTRUCTS

(75) Inventors: Wolfgang Roesner, Austin, TX (US); Derek Edward Williams, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 262 days.

(21) Appl. No.: 10/749,759

(22) Filed: Dec. 31, 2003

(65) Prior Publication Data

US 2005/0149883 A1 Jul. 7, 2005

(51) Int. Cl.
*G06F 17/50* (2006.01)
(52) U.S. Cl. .................................. 716/1; 716/3; 716/4
(58) Field of Classification Search .............. 716/3, 716/4, 1
See application file for complete search history.

(56) References Cited

U.S. PATENT DOCUMENTS 6,618,839 B1 * 9/2003 Beardslee et al. ............. 716/4
2003/0093735 A1 * 5/2003 Stong et al. ................ 714/733

* cited by examiner

*Primary Examiner*—Vuthe Siek
*Assistant Examiner*—Tuyen To
(74) *Attorney, Agent, or Firm*—Mark E. McBurney; Dillon & Yudell LLP

(57) ABSTRACT

A method is disclosed of associating a mapping function with a configuration construct of a digital design defined by one or more hardware description language (HDL) files. According to the method, in the HDL files, a configuration latch is specified within a design entity forming at least a portion of the digital design. In addition, a Dial is specified that defines a relationship between each of a plurality of input values and a respective one of a plurality of different output values. The HDL files also include a statement that instantiates an instance of the Dial in association with the configuration latch such that a one-to-one correspondence exists between a value contained within the configuration latch and an input value of the instance of the Dial. The HDL files further include a statement associating the Dial with a mapping function that applies a selected transformation to values read from or written to the instance of the Dial.

18 Claims, 29 Drawing Sheets

```
                                        ┌─ 400
ENTITY A IS
    PORT
    (

402 {    ...                          -- port_list

);
END A

404 { ARCHITECTURE A OF A IS
    ...                               -- signal declarations BEGIN
      ...                             -- HDL code describing design --## statementA  ⎫
      --## statementB  ⎬ 408
      --## statementC  ⎭
406 {  ...                             -- HDL code describing design --## statementD  ⎫
      --## statementE  ⎬ 410
      --## statementF  ⎭
      ....
    END;
```

*Fig. 4A*

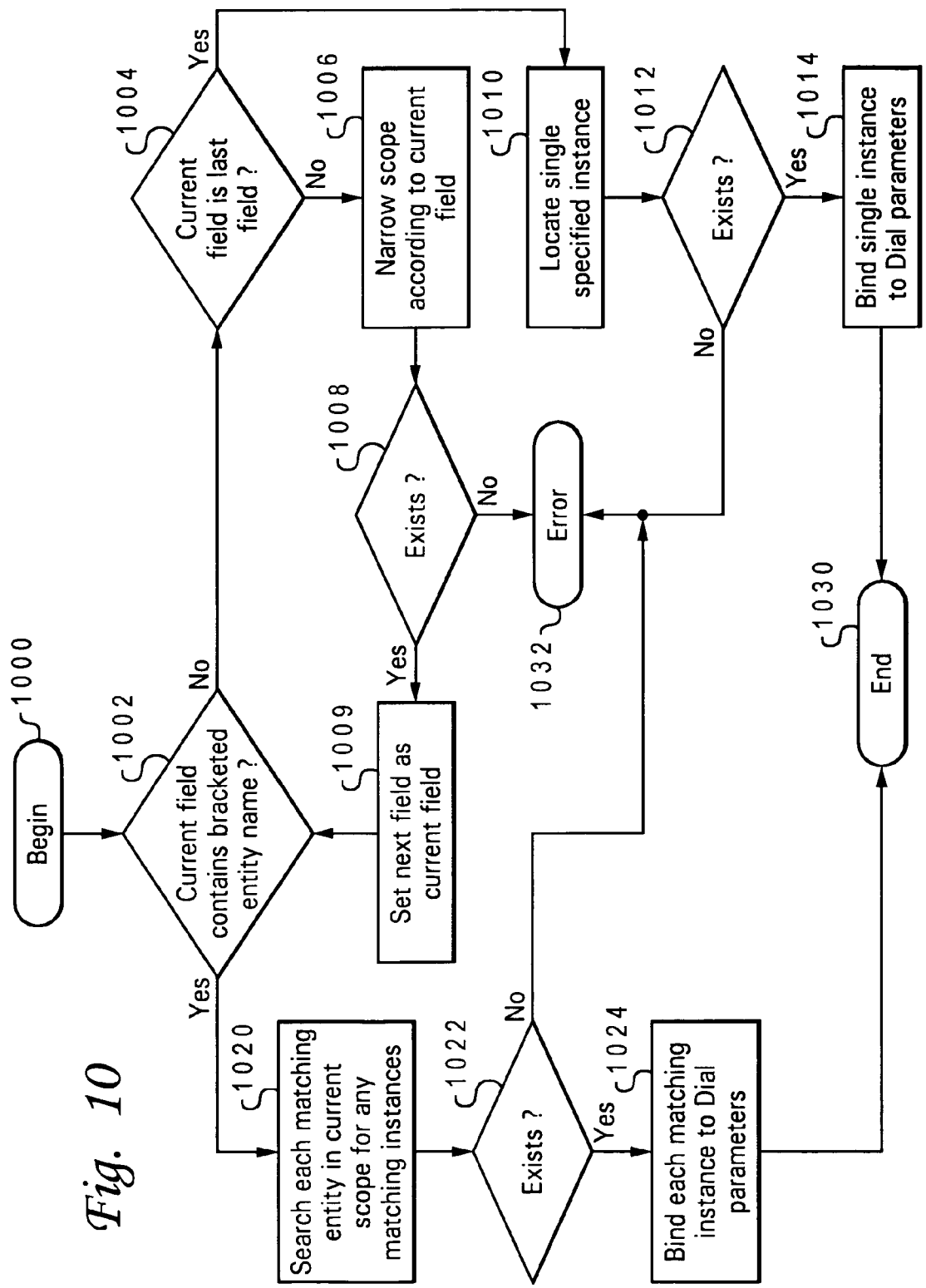

Mapping Control File 1320

| Mapping Function Name 1322 | Read Input Width 1324 | Read Output Width 1326 | Set Input Width 1328 | Set Output Width 1330 |
|---|---|---|---|---|
| ... | ... | ... | ... | ... |

*Fig. 13B*

```
mapX
  mapX_Read(in, out)
  {
    C/C++ code to implement
    mapping function
  }
  mapX_Set(in, out)
  {
    C/C++ code to implement
    mapping function
  }
```

1300
1302 — mapX
1306 — mapX_Read(in, out)
1304 — C/C++ code to implement mapping function
1310 — mapX_Set(in, out)
1308 — C/C++ code to implement mapping function

*Fig. 13A*

METHOD, SYSTEM AND PROGRAM PRODUCT PROVIDING A CONFIGURATION SPECIFICATION LANGUAGE SUPPORTING ARBITRARY MAPPING FUNCTIONS FOR CONFIGURATION CONSTRUCTS

CROSS-REFERENCE TO RELATED APPLICATIONS

The present application is related to co-pending U.S. patent application Ser. No. 10/425,096, which is assigned to the assignee of the present application and incorporated herein by reference in its entirety.

BACKGROUND OF THE INVENTION

1. Technical Field

The present invention relates in general to designing, simulating and configuring digital devices, modules and systems, and in particular, to methods and systems for computer-aided design, simulation, and configuration of digital devices, modules and systems described by a hardware description language (HDL) model.

2. Description of the Related Art

In a typical digital design process, verifying the logical correctness of a digital design and debugging the design (if necessary) are important steps of the design process performed prior to developing a circuit layout. Although it is certainly possible to test a digital design by actually building the digital design, digital designs, particularly those implemented by integrated circuitry, are typically verified and debugged by simulating the digital design on a computer, due in part to the time and expense required for integrated circuit fabrication.

In a typical automated design process, a circuit designer enters into an electronic computer-aided design (ECAD) system a high-level description of the digital design to be simulated utilizing a hardware description language (HDL), such as VHDL, thus producing a digital representation of the various circuit blocks and their interconnections. In the digital representation, the overall circuit design is frequently divided into smaller parts, hereinafter referred to as design entities, which are individually designed, often by different designers, and then combined in a hierarchical manner to create an overall model. This hierarchical design technique is very useful in managing the enormous complexity of the overall design and facilitates error detection during simulation.

The ECAD system compiles the digital representation of the design into a simulation model having a format best suited for simulation. A simulator then exercises the simulation model to detect logical errors in the digital design.

A simulator is typically a software tool that operates on the simulation model by applying a list of input stimuli representing inputs of the digital system. The simulator generates a numerical representation of the response of the circuit to the input stimuli, which response may then either be viewed on the display screen as a list of values or further interpreted, often by a separate software program, and presented on the display screen in graphical form. The simulator may be run either on a general-purpose computer or on another piece of electronic apparatus specially designed for simulation. Simulators that run entirely in software on a general-purpose computer are referred to as "software simulators," and simulators that run with the assistance of specially designed electronic apparatus are referred to as "hardware simulators."

As digital designs have become increasingly complex, digital designs are commonly simulated at several levels of abstraction, for example, at functional, logical and circuit levels. At the functional level, system operation is described in terms of a sequence of transactions between registers, adders, memories and other functional units. Simulation at the functional level is utilized to verify the high-level design of digital systems. At the logical level, a digital system is described in terms of logic elements such as logic gates and flip-flops. Simulation at the logical level is utilized to verify the correctness of the logic design. At the circuit level, each logic gate is described in terms of its circuit components such as transistors, impedances, capacitances, and other such devices. Simulation at the circuit level provides detailed information about voltage levels and switching speeds.

In order to verify the results of any given simulation run, custom-developed programs written in high-level languages such as C or C++, referred to as a reference model, are written to process input stimuli (also referred to as test vectors) to produce expected results of the simulation run. The test vector is then run against the simulation execution model by the simulator. The results of the simulation run are then compared to the results predicted by the reference model to detect discrepancies, which are flagged as errors. Such a simulation check is known in the verification art as an "end-to-end" check.

In modern data processing systems, especially large server-class computer systems, the number of latches that must be loaded to configure the system for operation (or simulation) is increasing dramatically. One reason for the increase in configuration latches is that many chips are being designed to support multiple different configurations and operating modes in order to improve manufacturer profit margins and simplify system design. For example, memory controllers commonly require substantial configuration information to properly interface memory cards of different types, sizes, and operating frequencies.

A second reason for the increase in configuration latches is the ever-increasing transistor budget within processors and other integrated circuit chips. Often the additional transistors available within the next generation of chips are devoted to replicated copies of existing functional units in order to improve fault tolerance and parallelism. However, because transmission latency via intra-chip wiring is not decreasing proportionally to the increase in the operating frequency of functional logic, it is generally viewed as undesirable to centralize configuration latches for all similar functional units. Consequently, even though all instances of a replicated functional unit are frequently identically configured, each instance tends to be designed with its own copy of the configuration latches. Thus, configuring an operating parameter having only a few valid values (e.g., the ratio between the bus clock frequency and processor clock frequency) may involve setting hundreds of configuration latches in a processor chip.

Conventionally, configuration latches and their permitted range of values have been specified by error-prone paper documentation that is tedious to create and maintain. Compounding the difficulty in maintaining accurate configuration documentation and the effort required to set configuration latches is the fact that different constituencies within a single company (e.g., a functional simulation team, a laboratory debug team, and one or more customer firmware teams) often separately develop configuration software from the configuration documentation. As the configuration software is separately developed by each constituency, each team may introduce its own errors and employ its own terminology and naming conventions. Consequently, the configuration software developed by the different teams is not compatible and cannot easily be shared between the different teams.

In addition to the foregoing shortcomings in the process of developing configuration code, conventional configuration software is extremely tedious to code. In particular, the vocabulary used to document the various configuration bits is often quite cumbersome. For example, in at least some implementations, configuration code must specify, for each configuration latch bit, a full latch name, which may include fifty or more ASCII characters. In addition, valid binary bit patterns for each group of configuration latches must be individually specified.

In view of the foregoing, the above-referenced co-pending patent application introduces a configuration specification language that permits configuration information for a digital system described by an HDL model to be specified in a logical manner with a reasonable amount of input and then shared among the various organizational constituencies involved in the design, simulation, and commercial implementation of the digital system. This configuration specification language provides a configuration construct, referred to as a Dial, that permits configuration latch values to be easily specified and accessed, as well as other configuration constructs that allow a designer to define various relationships between Dials. As described further herein, a Dial's function is to map between an input value and one or more output values. In general, the Dial output values ultimately directly or indirectly reflect configuration values of configuration latches within the digital design.

The present invention recognizes that, for at least some Dials, the specific implementation of the underlying configuration latches in the digital design do not identically correspond to the configuration values to be loaded into the configuration latches. For example, the configuration value may be unaligned with respect to the underlying configuration latch. In addition, the present invention recognizes that it may be desirable to apply a known transform to the configuration value before setting or reading the configuration value. Accordingly, the present invention supports the definition of arbitrary mapping functions and the association of such mapping functions with particular Dials.

SUMMARY OF THE INVENTION

Methods, data processing systems, and program products are disclosed that support the definition of arbitrary mapping functions and the association of such mapping functions with configuration constructs of a digital design defined by one or more hardware description language (HDL) files. According to one method, in the HDL files, a configuration latch is specified within a design entity forming at least a portion of the digital design. In addition, a Dial is specified that defines a relationship between each of a plurality of input values and a respective one of a plurality of different output values. The HDL files also include a statement that instantiates an instance of the Dial in association with the configuration latch such that a one-to-one correspondence exists between a value contained within the configuration latch and an input value of the instance of the Dial. The HDL files further include a statement associating the Dial with a mapping function that applies a selected transformation to values read from or written to the instance of the Dial.

All objects, features, and advantages of the present invention will become apparent in the following detailed written description.

BRIEF DESCRIPTION OF THE DRAWINGS

The novel features believed characteristic of the invention are set forth in the appended claims. However, the invention, as well as a preferred mode of use, will best be understood by reference to the following detailed description of an illustrative embodiment when read in conjunction with the accompanying drawings, wherein:

FIG. 4A depicts an exemplary HDL file including embedded configuration specification statements in accordance with the present invention;

FIG. 10 is a high level logical flowchart of an exemplary method by which a configuration compiler parses each signal or Dial identification within a configuration specification statement in accordance with a preferred embodiment of the present invention;

FIG. 13A illustrates an exemplary mapping function module that may be associated with a Dial in accordance with the present invention;

FIG. 13B depicts an exemplary mapping control file utilized by a compiler to validate mapping functions declared within configuration specification language statements in accordance with the present invention;

DETAILED DESCRIPTION OF ILLUSTRATIVE EMBODIMENT

The present invention discloses a configuration specification language and associated methods, systems, and program products for configuring and controlling the setup of a digital system (e.g., one or more integrated circuits or a simulation model thereof). In at least one embodiment, configuration specifications for signals in the digital system are created in HDL code by the designer responsible for an associated design entity. Thus, designers at the front end of the design process, who are best able to specify the signal names and associated legal values, are responsible for creating the configuration specification. The configuration specification is compiled at model build time together with the HDL describing the digital system to obtain a configuration database that can then be utilized by downstream organizational groups involved in the design, simulation, and hardware implementation processes.

Figure 1:
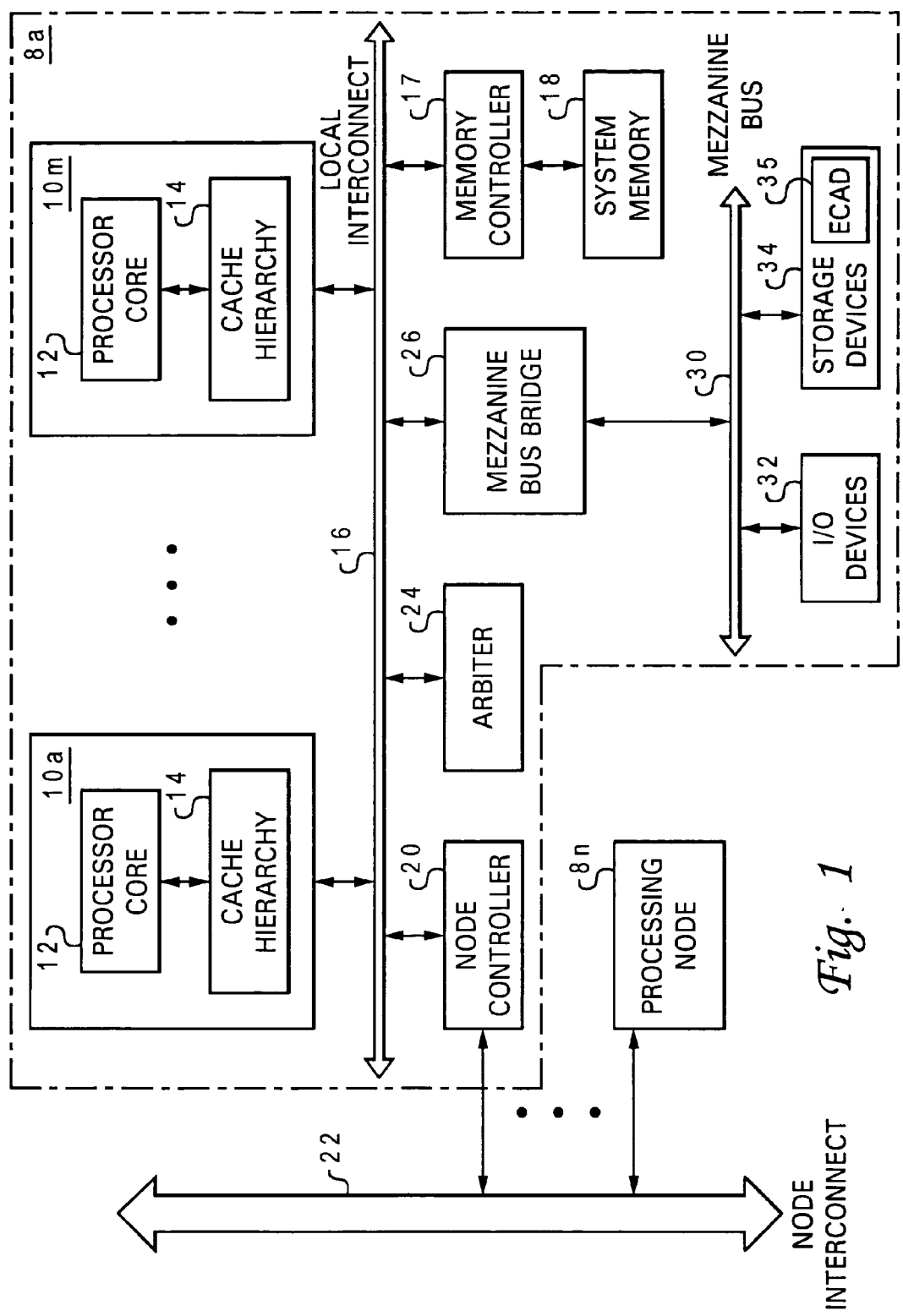
FIG. 1 is a high level block diagram of a data processing system that may be utilized to implement the present invention.

With reference now to the figures, and in particular with reference to FIG. 1, there is depicted an exemplary embodiment of a data processing system in accordance with the present invention. The depicted embodiment can be realized, for example, as a workstation, server, or mainframe computer.

As illustrated, data processing system 6 includes one or more processing nodes 8a–8n, which, if more than one processing node 8 is implemented, are interconnected by node interconnect 22. Processing nodes 8a–8n may each include one or more processors 10, a local interconnect 16, and a system memory 18 that is accessed via a memory controller 17. Processors 10a–10m are preferably (but not necessarily) identical and may comprise a processor within the PowerPC™ line of processors available from International Business Machines (IBM) Corporation of Armonk, N.Y. In addition to the registers, instruction flow logic and execution units utilized to execute program instructions, which are generally designated as processor core 12, each of processors 10a–10m also includes an on-chip cache hierarchy that is utilized to stage data to the associated processor core 12 from system memories 18.

Each of processing nodes 8a–8n further includes a respective node controller 20 coupled between local interconnect 16 and node interconnect 22. Each node controller 20 serves as a local agent for remote processing nodes 8 by performing at least two functions. First, each node controller 20 snoops the associated local interconnect 16 and facilitates the transmission of local communication transactions to remote processing nodes 8. Second, each node controller 20 snoops communication transactions on node interconnect 22 and masters relevant communication transactions on the associated local interconnect 16. Communication on each local interconnect 16 is controlled by an arbiter 24. Arbiters 24 regulate access to local interconnects 16 based on bus request signals generated by processors 10 and compile coherency responses for snooped communication transactions on local interconnects 16.

Local interconnect 16 is coupled, via mezzanine bus bridge 26, to a mezzanine bus 30. Mezzanine bus bridge 26 provides both a low latency path through which processors 10 may directly access devices among I/O devices 32 and storage devices 34 that are mapped to bus memory and/or I/O address spaces and a high bandwidth path through which I/O devices 32 and storage devices 34 may access system memory 18. I/O devices 32 may include, for example, a display device, a keyboard, a graphical pointer, and serial and parallel ports for connection to external networks or attached devices. Storage devices 34 may include, for example, optical or magnetic disks that provide non-volatile storage for operating system, middleware and application software. In the present embodiment, such application software includes an ECAD system 35, which can be utilized to develop, verify and simulate a digital circuit design in accordance with the methods and systems of the present invention.

Figure 2:
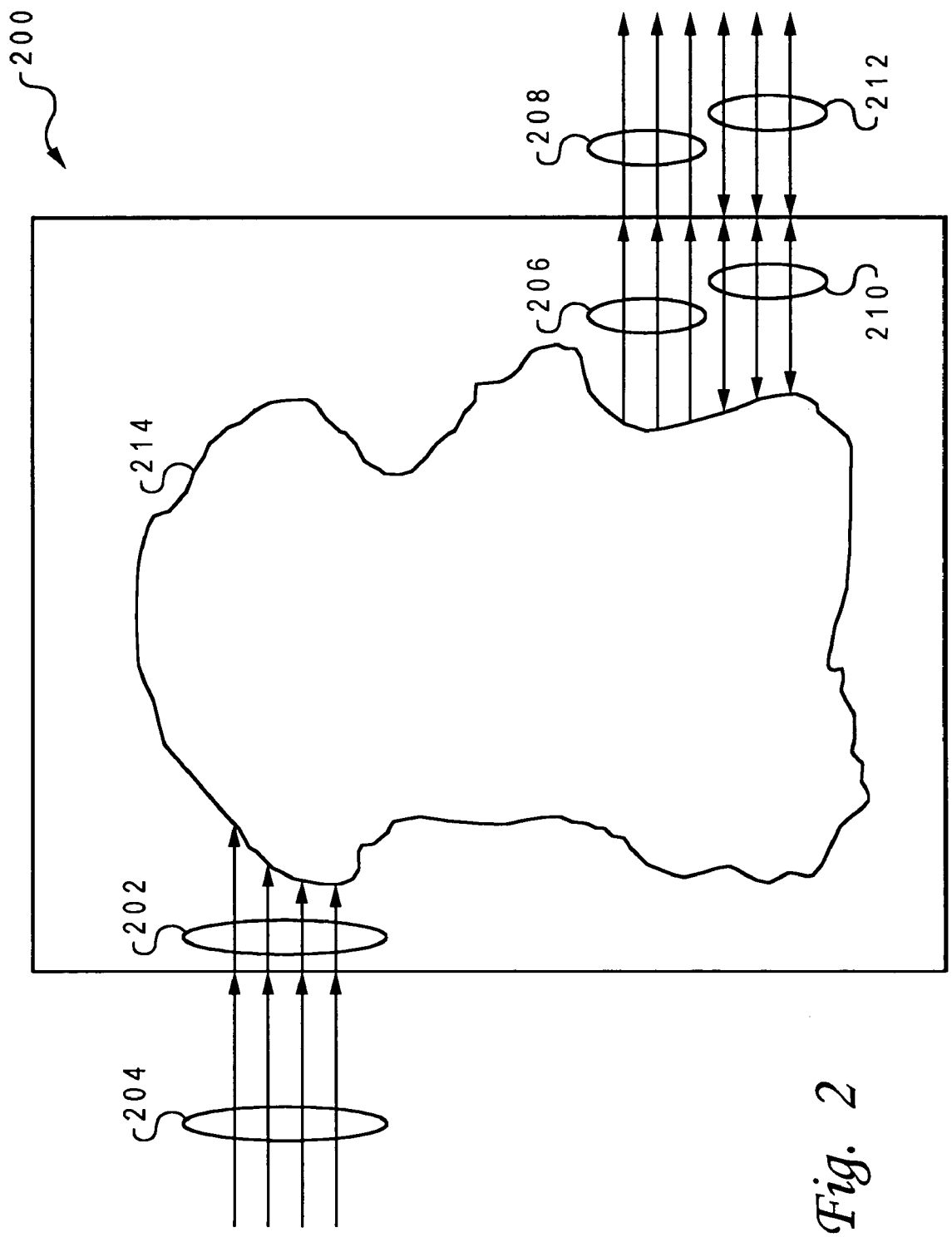
FIG. 2 is a diagrammatic representation of a design entity described by HDL code.

Simulated digital circuit design models created utilizing ECAD system 35 are comprised of at least one, and usually many, sub-units referred to hereinafter as design entities. Referring now to FIG. 2, there is illustrated a block diagram representation of an exemplary design entity 200 which may be created utilizing ECAD system 35. Design entity 200 is defined by a number of components: an entity name, entity ports, and a representation of the function performed by design entity 200. Each design entity within a given model has a unique entity name (not explicitly shown in FIG. 2) that is declared in the HDL description of the design entity. Furthermore, each design entity typically contains a number of signal interconnections, known as ports, to signals outside the design entity. These outside signals may be primary input/outputs (I/Os) of an overall design or signals connected to other design entities within an overall design.

Typically, ports are categorized as belonging to one of three distinct types: input ports, output ports, and bi-directional ports. Design entity 200 is depicted as having a number of input ports 202 that convey signals into design entity 200. Input ports 202 are connected to input signals 204. In addition, design entity 200 includes a number of output ports 206 that convey signals out of design entity 200. Output ports 206 are connected to a set of output signals 208. Bi-directional ports 210 are utilized to convey signals into and out of design entity 200. Bi-directional ports 210 are in turn connected to a set of bi-directional signals 212. A design entity, such as design entity 200, need not contain ports of all three types, and in the degenerate case, contains no ports at all. To accomplish the connection of entity ports to external signals, a mapping technique, known as a "port map", is utilized. A port map (not explicitly depicted in FIG. 2) consists of a specified correspondence between entity port names and external signals to which the entity is connected. When building a simulation model, ECAD software 35 is utilized to connect external signals to appropriate ports of the entity according to a port map specification.

As further illustrated in FIG. 2, design entity 200 contains a body section 214 that describes one or more functions performed by design entity 200. In the case of a digital design, body section 214 contains an interconnection of logic gates, storage elements, etc., in addition to instantiations of other entities. By instantiating an entity within another entity, a hierarchical description of an overall design is achieved. For example, a microprocessor may contain multiple instances of an identical functional unit. As such, the microprocessor itself will often be modeled as a single entity. Within the microprocessor entity, multiple instantiations of any duplicated functional entities will be present.

Each design entity is specified by one or more HDL files that contain the information necessary to describe the design entity. Although not required by the present invention, it will hereafter be assumed for ease of understanding that each design entity is specified by a respective HDL file.

Figure 3:
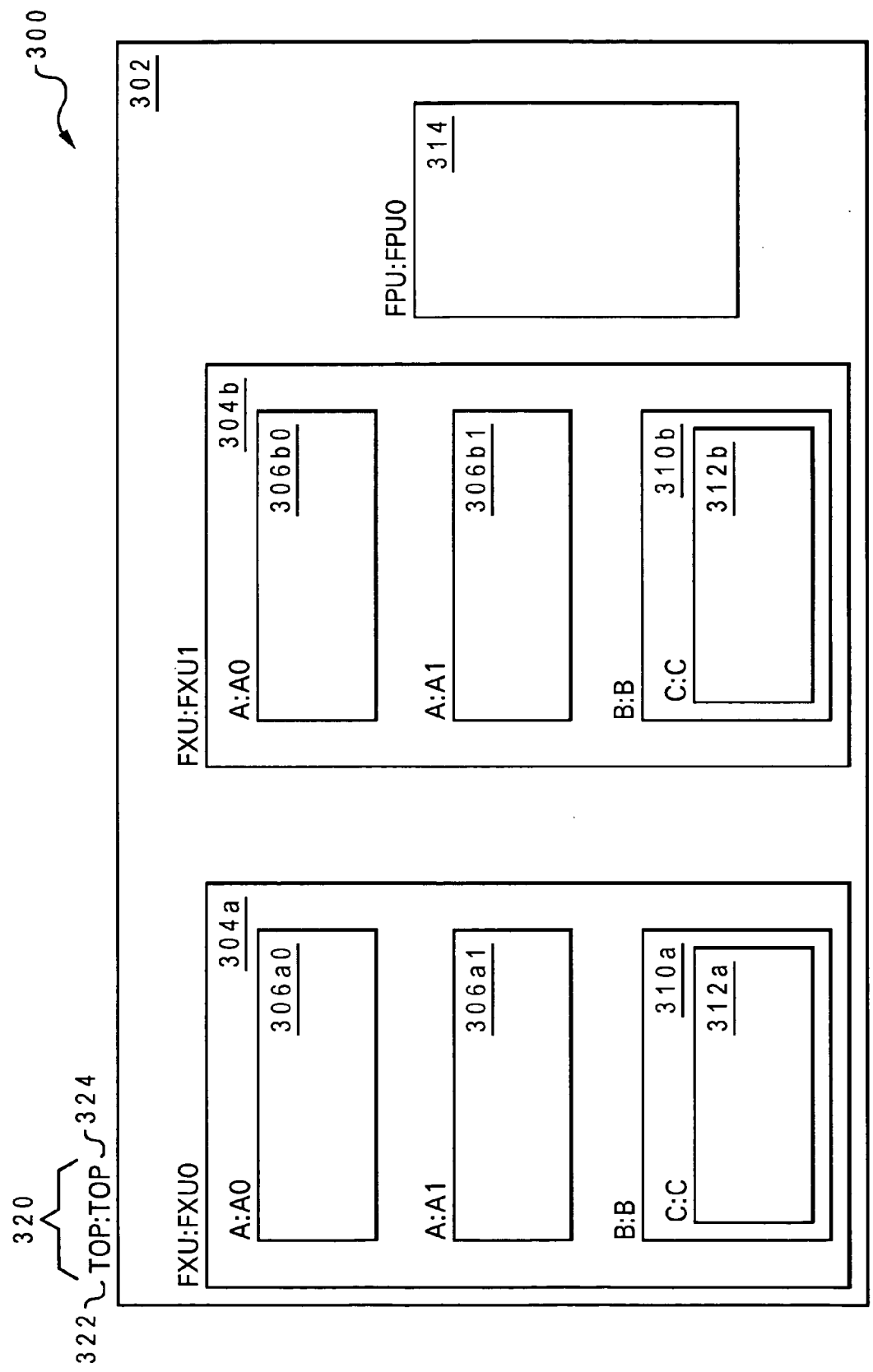
FIG. 3 illustrates an exemplary digital design including a plurality of hierarchically arranged design entities.

With reference now to FIG. 3, there is illustrated a diagrammatic representation of an exemplary simulation model 300 that may be employed by ECAD system 35 to represent a digital design (e.g., an integrated circuit chip or a computer system) in a preferred embodiment of the present invention. For visual simplicity and clarity, the ports and signals interconnecting the design entities within simulation model 300 have not been explicitly shown.

Simulation model 300 includes a number of hierarchically arranged design entities. As within any simulation model, simulation model 300 includes one and only one "top-level entity" encompassing all other entities within simulation model 300. That is to say, top-level entity 302 instantiates, either directly or indirectly, all descendant entities within the digital design. Specifically, top-level entity 302 directly instantiates (i.e., is the direct ancestor of) two instances, 304a and 304b, of the same FiXed-point execution Unit (FXU) entity 304 and a single instance of a Floating Point Unit (FPU) entity 314. FXU entity instances 304, having instantiation names FXU0 and FXU1, respectively, in turn instantiate additional design entities, including multiple instantiations of entity A 306 having instantiation names A0 and A1, respectively.

Each instantiation of a design entity has an associated description that contains an entity name and an instantiation name, which must be unique among all descendants of the direct ancestor entity, if any. For example, top-level entity 302 has a description 320 including an entity name 322 (i.e., the "TOP" preceding the colon) and also includes an instantiation name 324 (i.e., the "TOP" following the colon). Within an entity description, it is common for the entity name to match the instantiation name when only one instance of that particular entity is instantiated within the ancestor entity. For example, single instances of entity B 310 and entity C 312 instantiated within each of FXU entity instantiations 304a and 304b have matching entity and instantiation names. However, this naming convention is not required by the present invention as shown by FPU entity 314 (i.e., the instantiation name is FPU0, while the entity name is FPU).

The nesting of entities within other entities in a digital design can continue to an arbitrary level of complexity, provided that all entities instantiated, whether singly or multiply, have unique entity names and the instantiation names of all descendant entities within any direct ancestor entity are unique with respect to one another.

Associated with each design entity instantiation is a so called "instantiation identifier". The instantiation identifier for a given instantiation is a string including the enclosing entity instantiation names proceeding from the top-level entity instantiation name. For example, the design instantiation identifier of instantiation 312a of entity C 312 within instantiation 304a of FXU entity 304 is "TOP.FXU0.B.C". This instantiation identifier serves to uniquely identify each instantiation within a simulation model.

As discussed above, a digital design, whether realized utilizing physical integrated circuitry or as a software model such as simulation model 300, typically includes configuration latches utilized to configure the digital design for proper operation. In contrast to prior art design methodologies, which employ stand-alone configuration software created after a design is realized to load values into the configuration latches, the present invention introduces a configuration specification language that permits a digital designer to specify configuration values for signals as a natural part of the design process. In particular, the configuration specification language of the present invention permits a design configuration to be specified utilizing statements either embedded in one or more HDL files specifying the digital design (as illustrated in FIG. 4A) or in one or more external configuration files referenced by the one or more HDL files specifying the digital design (as depicted in FIG. 4B).

Referring now to FIG. 4A, there is depicted an exemplary HDL file 400, in this case a VHDL file, including embedded configuration statements in accordance with the present invention. In this example, HDL file 400 specifies entity A 306 of simulation model 300 and includes three sections of VHDL code, namely, a port list 402 that specifies ports 202, 206 and 210, signal declarations 404 that specify the signals within body section 214, and a design specification 406 that specifies the logic and functionality of body section 214. Interspersed within these sections are conventional VHDL comments denoted by an initial double-dash ("--"). In addition, embedded within design specification 406 are one or more configuration specification statements in accordance with the present invention, which are collectively denoted by reference numerals 408 and 410. As shown, these configuration specification statements are written in a special comment form beginning with "--##" in order to permit a compiler to easily distinguish the configuration specification statements from the conventional HDL code and HDL comments. Configuration specification statements preferably employ a syntax that is insensitive to case and white space.

Figure 4B:
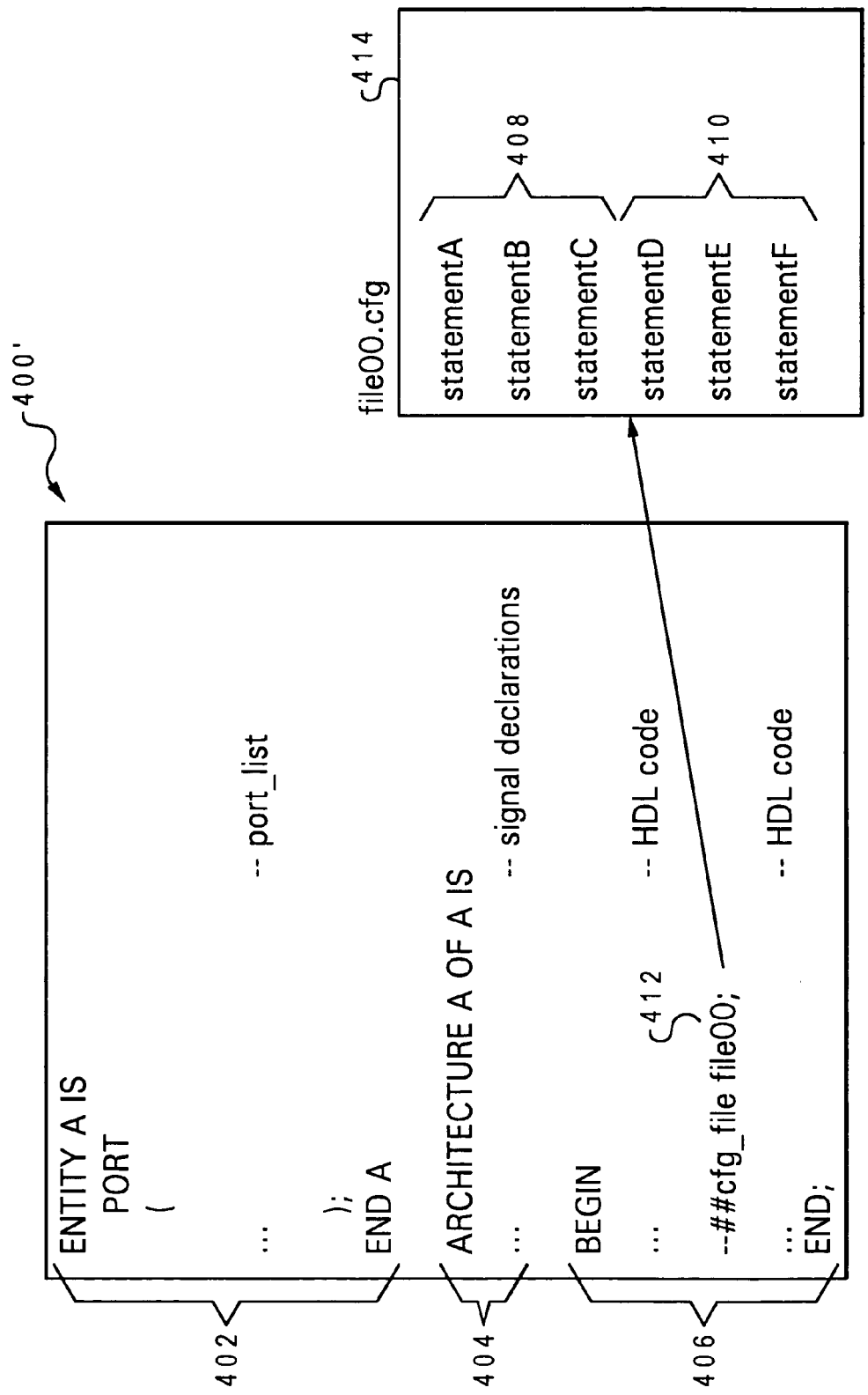
FIG. 4B illustrates an exemplary HDL file including an embedded configuration file reference statement referring to an external configuration file containing a configuration specification statement in accordance with the present invention.

With reference now to FIG. 4B, there is illustrated an exemplary HDL file 400' that includes a reference to an external configuration file containing one or more configuration specification statements in accordance with the present invention. As indicated by prime notation ('), HDL file 400' is identical to HDL file 400 in all respects except that configuration specification statements 408, 410 are replaced with one or more (and in this case only one) configuration file reference statement 412 referencing a separate configuration file 414 containing configuration specification statements 408, 410.

Configuration file reference statement 412, like the embedded configuration specification statements illustrated in FIG. 4A, is identified as a configuration statement by the identifier "--##". Configuration file reference statement 412 includes the directive "cfg_file", which instructs the compiler to locate a separate configuration file 414, and the filename of the configuration file (i.e., "file00"). Configuration files, such as configuration file 412, preferably all employ a selected filename extension (e.g., ".cfg") so that they can be easily located, organized, and managed within the file system employed by data processing system 6.

As discussed further below with reference to FIG. 8, configuration specification statements, whether embedded within an HDL file or collected in one or more configuration files 414, are processed by a compiler together with the associated HDL files.

In accordance with a preferred embodiment of the present invention, configuration specification statements, such as configuration specification statements 408, 410, facilitate configuration of configuration latches within a digital design by instantiating one or more instances of a configuration entity referred to herein generically as a "Dial." A Dial's function is to map between an input value and one or more output values. In general, such output values ultimately directly or indirectly specify configuration values of configuration latches. Each Dial is associated with a particular design entity in the digital design, which by convention is the design entity specified by the HDL source file containing the configuration specification statement or configuration file reference statement that causes the Dial to be instantiated. Consequently, by virtue of their association with particular design entities, which all have unique instantiation identifiers, Dials within a digital design can be uniquely identified as long as unique Dial names are employed within any given design entity. As will become apparent, many different types of Dials can be defined, beginning with a Latch Dial (or "LDial").

Figure 5A:
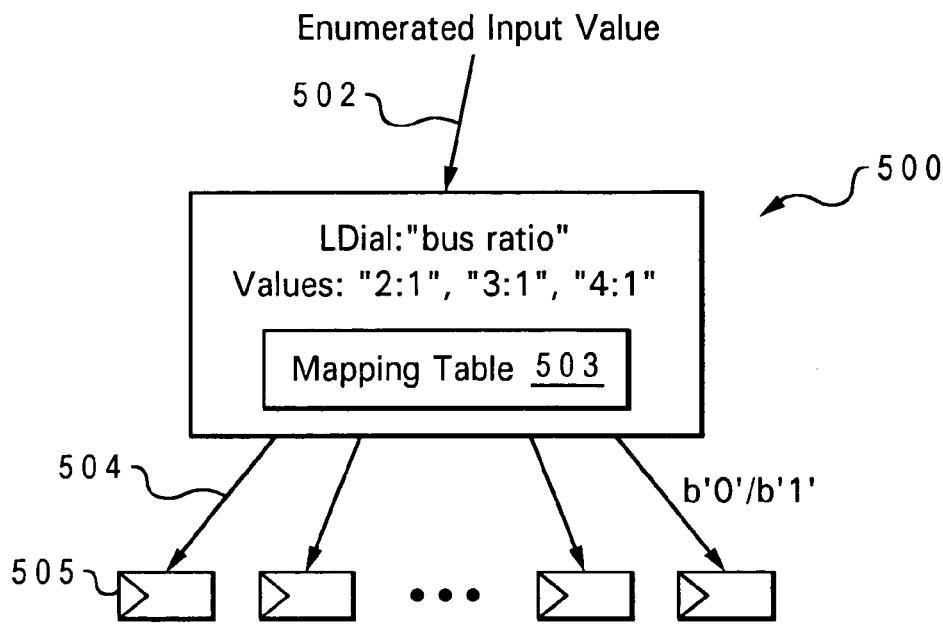
FIG. 5A is a diagrammatic representation of an LDial primitive in accordance with the present invention

Referring now to FIG. 5A, there is depicted a representation of an exemplary LDial 500. In this particular example, LDial 500, which has the name "bus ratio", is utilized to specify values for configuration latches in a digital design in accordance with an enumerated input value representing a selected ratio between a component clock frequency and bus clock frequency.

As illustrated, LDial 500, like all Dials, logically has a single input 502, one or more outputs 504, and a mapping table 503 that maps each input value to a respective associated output value for each output 504. That is, mapping table 503 specifies a one-to-one mapping between each of one or more unique input values and a respective associated unique output value. Because the function of an LDial is to specify the legal values of configuration latches, each output 504 of LDial 500 logically controls the value loaded into a respective configuration latch 505. To prevent conflicting configurations, each configuration latch 505 is directly specified by one and only one Dial of any type that is capable of setting the configuration latch 505.

At input 502, LDial 500 receives an enumerated input value (i.e., a string) among a set of legal values including "2:1", "3:1" and "4:1". The enumerated input value can be provided directly by software (e.g., by a software simulator or service processor firmware) or can be provided by the output of another Dial, as discussed further below with respect to FIG. 7A. For each enumerated input value, the mapping table 503 of LDial 500 indicates a selected binary value (i.e., "0" or "1") for each configuration latch 505.

Figure 5D:
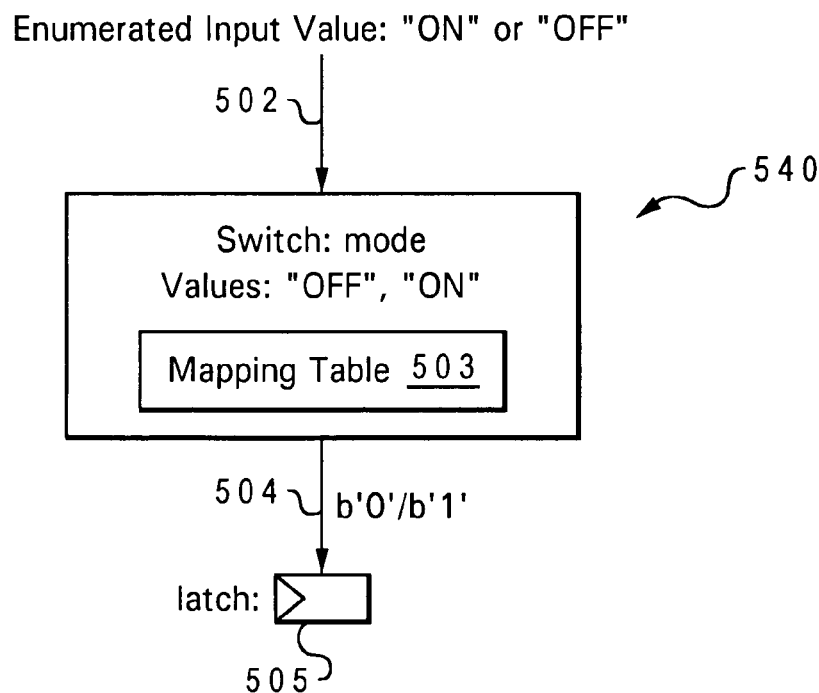
FIG. 5D is a diagrammatic representation of a Switch in accordance with the present invention.
Figure 5B:
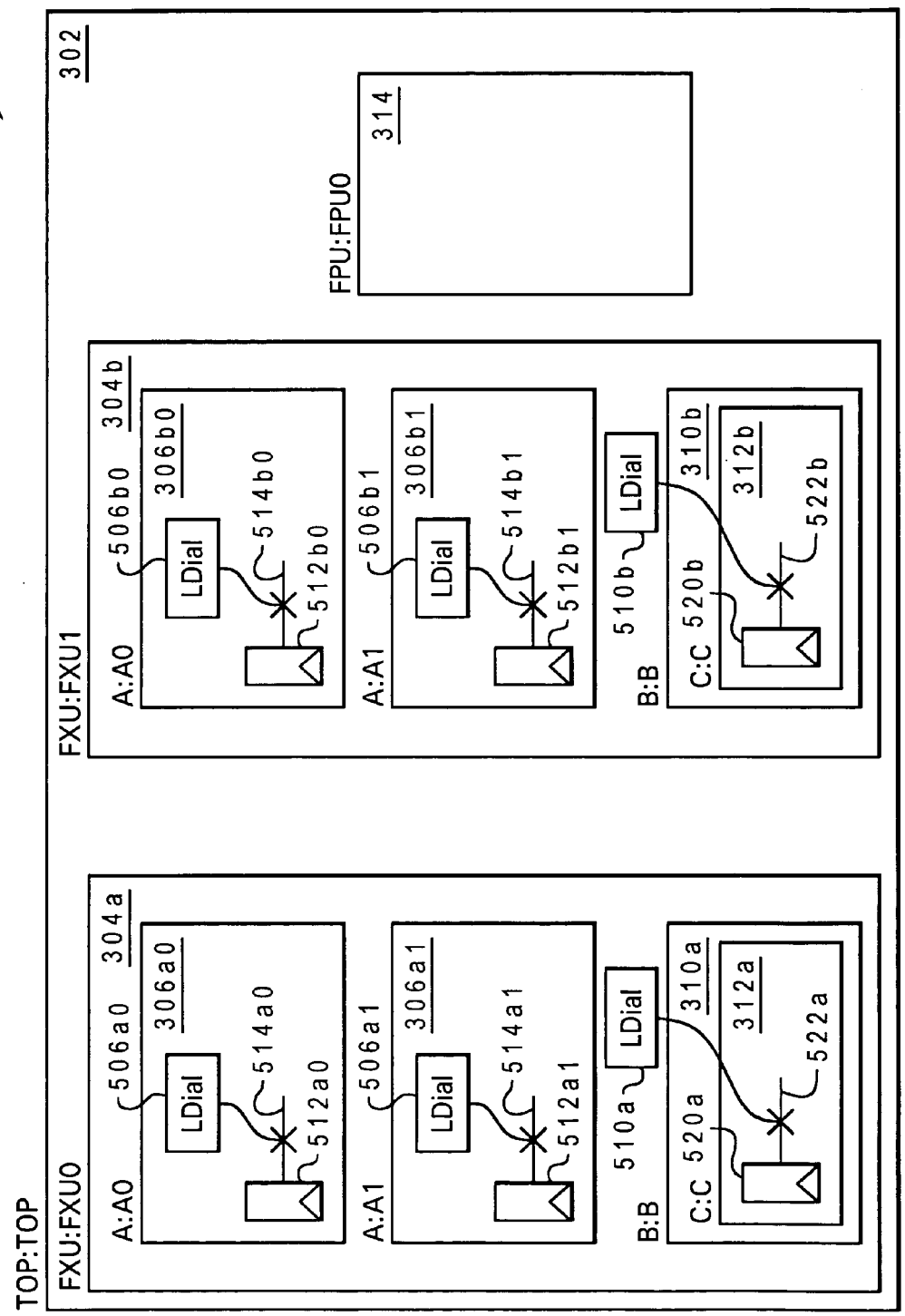
FIG. 5B depicts an exemplary digital design including a plurality of hierarchically arranged design entities in which LDials are instantiated in accordance with the present invention.

With reference now to FIG. 5B, there is illustrated a diagrammatic representation of a simulation model logically including Dials. Simulation model 300' of FIG. 5B, which as indicated by prime notation includes the same design entities arranged in the same hierarchical relation as simulation model 300 of FIG. 3, illustrates two properties of Dials, namely, replication and scope.

Replication is a process by which a Dial that is specified in or referenced by an HDL file of a design entity is automatically instantiated each time that the associated design entity is instantiated. Replication advantageously reduces the amount of data entry a designer is required to perform to create multiple identical instances of a Dial. For example, in order to instantiate the six instances of LDials illustrated in FIG. 5B, the designer need only code two LDial configuration specification statements utilizing either of the two techniques illustrated in FIGS. 4A and 4B. That is, the designer codes a first LDial configuration specification statement (or configuration file reference statement pointing to an associated configuration file) into the HDL file of design entity A 306 in order to automatically instantiate LDials 506a0, 506a1, 506b0 and 506b1 within entity A instantiations 306a0, 306a1, 306b0 and 306b1, respectively. The designer codes a second LDial configuration specification statement (or configuration file reference statement pointing to an associated configuration file) into the HDL file of design entity FXU 304 in order to automatically instantiate LDials 510a and 510b within FXU entity instantiations 304a and 304b, respectively. The multiple instances of the LDials are then created automatically as the associated design entities are replicated by the compiler. Replication of Dials within a digital design can thus significantly reduce the input burden on the designer as compared to prior art methodologies in which the designer had to individually enumerate in the configuration software each configuration latch value by hand. It should be noted that the property of replication does not necessarily require all instances of a Dial to generate the same output values; different instances of the same Dial can be set to generate different outputs by providing them different inputs.

The "scope" of a Dial is defined herein as the set of entities to which the Dial can refer in its specification. By convention, the scope of a Dial comprises the design entity with which the Dial is associated (i.e., the design entity specified by the HDL source file containing the configuration specification statement or configuration file reference statement that causes the Dial to be instantiated) and any design entity contained within the associated design entity (i.e., the associated design entity and its descendents). Thus, a Dial is not constrained to operate at the level of the design hierarchy at which it is instantiated, but can also specify configuration latches at any lower level of the design hierarchy within its scope. For example, LDials 510a and 510b, even though associated with FXU entity instantiations 304a and 304b, respectively, can specify configuration latches within entity C instantiations 312a and 312b, respectively.

FIG. 5B illustrates another important property of LDials (and other Dials that directly specify configuration latches). In particular, as shown diagrammatically in FIG. 5B, designers, who are accustomed to specifying signals in HDL files, are permitted in a configuration specification statement to specify signal states set by a Dial rather than values to be loaded into an "upstream" configuration latch that determines the signal state. Thus, in specifying LDial 506, the designer can specify possible signal states for a signal 514 set by a configuration latch 512. Similarly, in specifying LDial 510, the designer can specify possible signal states for signal 522 set by configuration latch 520. The ability to specify signal states rather than latch values not only coincides with designers' customary manner of thinking about a digital design, but also reduces possible errors introduced by the presence of inverters between the configuration latch 512, 520 and the signal of interest 514, 522, as discussed further below.

Figure 5C:
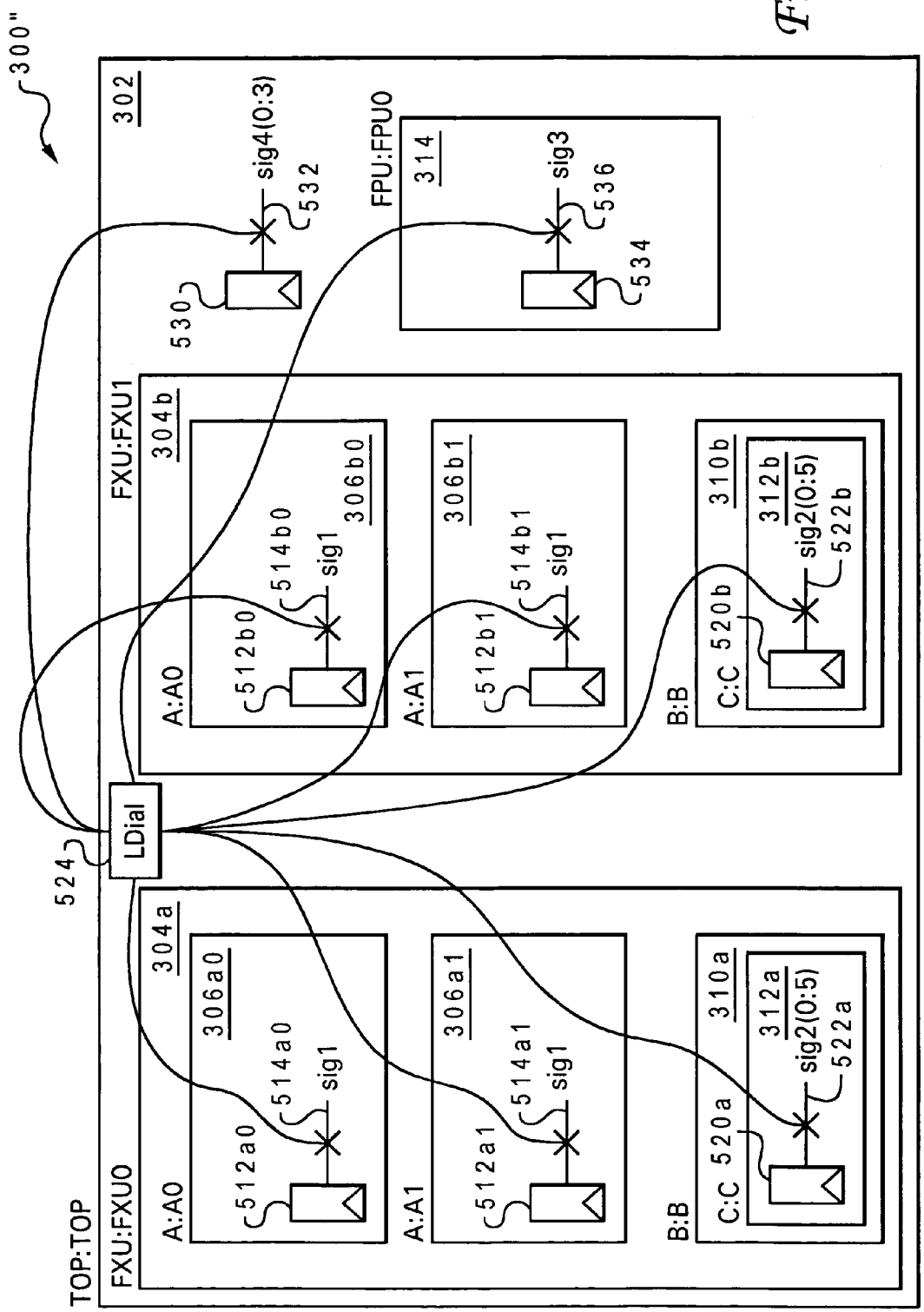
FIG. 5C illustrates an exemplary digital design including a plurality of hierarchically arranged design entities in which an LDial is employed to configure signal states at multiple different levels of the design hierarchy.

Referring now to FIG. 5C, there is depicted another diagrammatic representation of a simulation model including an LDial. As indicated by prime notation, simulation model 300" of FIG. 5C includes the same design entities arranged in the same hierarchical relation as simulation model 300 of FIG. 3.

As shown, simulation model 300" of FIG. 5C includes an LDial 524 associated with top-level design entity 302. LDial 524 specifies the signal states of each signal sig1 514, which is determined by a respective configuration latch 512, the signal states of each signal sig2 522, which is determined by a respective configuration latch 520, the signal state of signal sig4 532, which is determined by configuration latch 530, and the signal state of signal sig3 536, which is determined by configuration latch 534. Thus, LDial 524 configures the signal states of numerous different signals, which are all instantiated at or below the hierarchy level of LDial 524 (which is the top level).

As discussed above with respect to FIGS. 4A and 4B, LDial 524 is instantiated within top-level entity 302 of simulation model 300" by embedding within the HDL file of top-level entity 302 a configuration specification statement specifying LDial 524 or a configuration file reference statement referencing a separate configuration file containing a configuration specification statement specifying LDial 524. In either case, an exemplary configuration specification statement for LDial 524 is as follows:

```
LDial bus ratio (FXU0.A0.SIG1, FXU0.A1.SIG1,
        FXU0.B.C.SIG2(0..5),
        FXU1.A0.SIG1, FXU1.A1.SIG1,
        FXU1.B.C.SIG2(0..5),
        FPU0.SIG3, SIG4(0..3)
        ) =
        {2:1 =>0b0, 0b0, 0x00,
            0b0, 0b0, 0x00,
            0b0, 0x0;
        3:1 => 0b1, 0b1, 0x01,
            0b1, 0b1, 0x01,
            0b0, 0x1;
        4:1 => 0b1, 0b1, 0x3F,
            0b1, 0b1, 0x3F,
            0b1, 0xF
        };
```

The exemplary configuration specification statement given above begins with the keyword "LDial," which specifies that the type of Dial being declared is an LDial, and the Dial name, which in this case is "bus ratio." Next, the configuration specification statement enumerates the signal names whose states are controlled by the LDial. As indicated above, the signal identifier for each signal is specified hierarchically (e.g., FXU0.A0.SIG1 for signal 514a0) relative to the default scope of the associated design entity so that different signal instances having the same signal name are distinguishable. Following the enumeration of the signal identifiers, the configuration specification statement includes a mapping table listing the permitted enumerated input values of the LDial and the corresponding signal values for each enumerated input value. The signal values are associated with the signal names implicitly by the order in which the signal names are declared. It should again be noted that the signal states specified for all enumerated values are unique, and collectively represent the only legal patterns for the signal states.

Several different syntaxes can be employed to specify the signal states. In the example given above, signal states are specified in either binary format, which specifies a binary constant preceded by the prefix "0b", or in hexadecimal format, which specifies a hexadecimal constant preceded by the prefix "0x". Although not shown, signal states can also be specified in integer format, in which case no prefix is employed. For ease of data entry, the configuration specification language of ECAD system 35 also preferably supports a concatenated syntax in which one constant value, which is automatically extended with leading zeros, is utilized to represent the concatenation of all of the desired signal values. In this concatenated syntax, the mapping table of the configuration specification statement given above can be rewritten as:

```
{2:1 =>          0,
3:1 =>           0x183821,
4:1 =>           0x1FFFFF
};
``` in order to associate enumerated input value 2:1 with a concatenated bit pattern of all zeros, to associate the enumerated input value 3:1 with the concatenated bit pattern '0b110000011100000100001', and to associate the enumerated input value 4:1 with a concatenated bit pattern of all ones.

With reference now to FIG. 5D, there is illustrated a diagrammatic representation of a special case of an LDial having a one-bit output, which is defined herein as a Switch. As shown, a Switch 540 has a single input 502, a single 1-bit output 504 that controls the setting of a configuration latch 505, and a mapping table 503 that maps each enumerated input value that may be received at input 502 to a 1-bit output value driven on output 504.

Because Switches frequently comprise a significant majority of the Dials employed in a digital design, it is preferable if the enumerated value sets for all Switches in a simulation model of a digital design are the same (e.g., "ON"/"OFF"). In a typical embodiment of a Switch, the "positive" enumerated input value (e.g., "ON") is mapped by mapping table 503 to an output value of 0b1 and the "negative" enumerated input value (e.g., "OFF") is mapped to an output value of 0b0. In order to facilitate use of logic of the opposite polarity, a Negative Switch or NSwitch declaration is also preferably supported that reverses this default correspondence between input values and output values in mapping table 503.

The central advantage to defining a Switch primitive is a reduction in the amount of input that designers are required to enter. In particular, to specify a comparable 1-bit LDial, a designer would be required to enter a configuration specification statement of the form:

```
LDial mode (signal) =
    {ON =>b1;
     OFF =>b0
    };
```

A Switch performing the same function, on the other hand, can be specified with the configuration specification statement:

Switch mode (signal);

Although the amount of data entry eliminated by the use of Switches is not particularly significant when only a single Switch is considered, the aggregate reduction in data entry is significant when the thousands of switches in a complex digital design are taken into consideration.

Figure 6A:
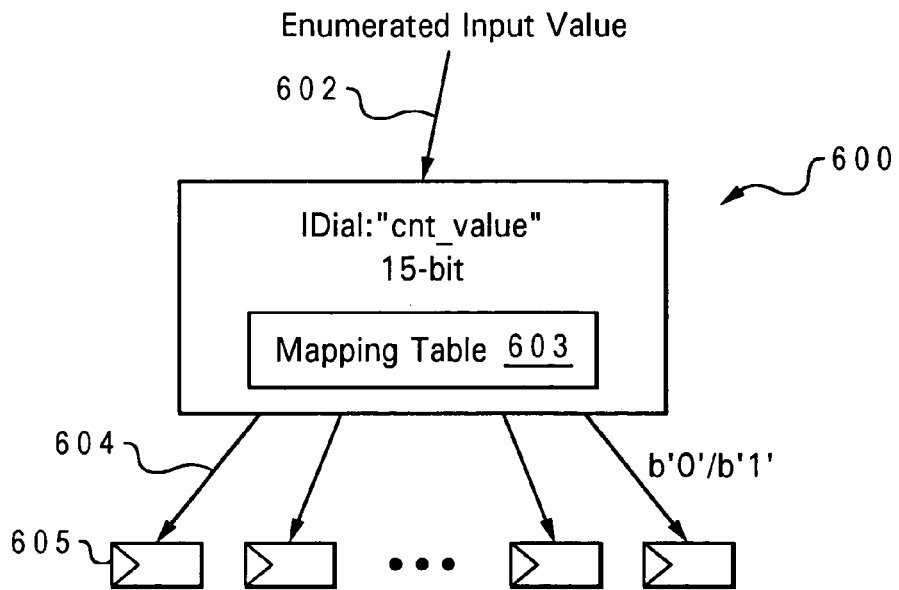
FIG. 6A is a diagrammatic representation of an IDial in accordance with the present invention.

Referring now to FIG. 6A, there is depicted a diagrammatic representation of an Integer Dial ("IDial") in accordance with a preferred embodiment of the present invention. Like an LDial, an IDial directly specifies the value loaded into each of one or more configuration latches 605 by indicating within mapping table 603 a correspondence between each input value received at an input 602 and an output value for each output 604. However, unlike LDials, which can only receive as legal input values the enumerated input values explicitly set forth in their mapping tables 503, the legal input value set of an IDial includes all possible integer values within the bit size of output 604. (Input integer values containing fewer bits than the bit size of output(s) 604 are right justified and extended with zeros to fill all available bits.) Because it would be inconvenient and tedious to enumerate all of the possible integer input values in mapping table 603, mapping table 603 simply indicates the manner in which the integer input value received at input 602 is applied to the one or more outputs 604.

IDials are ideally suited for applications in which one or more multi-bit registers must be initialized and the number of legal values includes most values of the register(s). For example, if a 4-bit configuration register comprising 4 configuration latches and an 11-bit configuration register comprising 11 configuration latches were both to be configured utilizing an LDial, the designer would have to explicitly enumerate up to $2^{15}$ input values and the corresponding output bit patterns in the mapping table of the LDial. This case can be handled much more simply with an IDial utilizing the following configuration specification statement:

IDial cnt_value (sig1(0 . . . 3), sig2(0 . . . 10));

In the above configuration specification statement, "IDial" declares the configuration entity as an IDial, "cnt_value" is the name of the IDial, "sig1" is a 4-bit signal output by the 4-bit configuration register and "sig2" is an 11-bit signal coupled to the 11-bit configuration register. In addition, the ordering and number of bits associated with each of sig1 and sig2 indicate that the 4 high-order bits of the integer input value will be utilized to configure the 4-bit configuration register associated with sig1 and the 11 lower-order bits will be utilized to configure the 11-bit configuration register associated with sig2. Importantly, although mapping table 603 indicates which bits of the integer input values are routed to which outputs, no explicit correspondence between input values and output values is specified in mapping table 603.

Figure 6B:
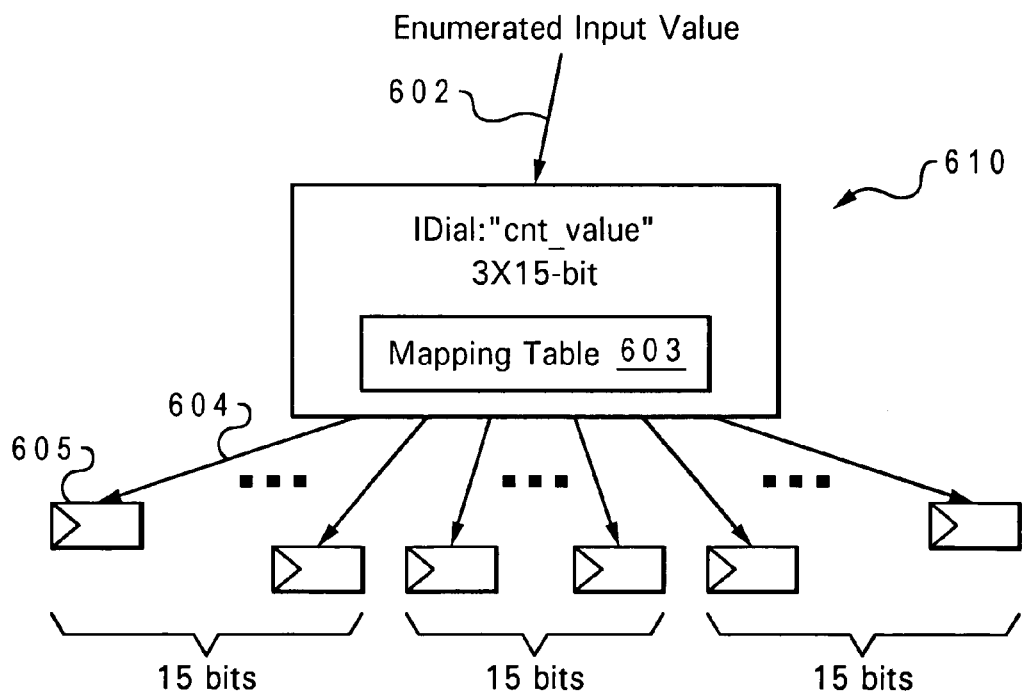
FIG. 6B is a diagrammatic representation of an IDial having a split output in accordance with the present invention.

IDials may also be utilized to specify the same value for multiple replicated configuration registers, as depicted in FIG. 6B. In the illustrated embodiment, an IDial 610, which can be described as an IDial "splitter", specifies the configuration of three sets of replicated configuration registers each comprising 15 configuration latches 605 based upon a single 15-bit integer input value. An exemplary configuration specification statement for instantiating IDial 610 may be given as follows:

```
IDial cnt_value(A0.sig1(0..7), A0.sig2(8..14);
               A1.sig1(0..7), A1.sig2(8..14);
               A3.sig1(0..7), A3.sig2(8..14)
              );
```

In the above configuration specification statement, "IDial" declares the configuration entity as an IDial, and "cnt_value" is the name of the IDial. Following the IDial name are three scope fields separated by semicolons (";"). Each scope field indicates how the bits of the input integer value are applied to particular signals. For example, the first scope field specifies that the 8 high-order bits of the integer input value will be utilized to configure the 8-bit configuration register associated with the signal A0.sig1 and the 7 lower-order bits will be utilized to configure the 7-bit configuration register associated with A0.sig2. The second and third scope fields specify that the corresponding configuration registers within design entities A1 and A3 will be similarly configured. Importantly, the integer input bits can be allocated differently in each scope field as long as the total number of bits specified in each scope field is the same.

Although the configuration of a digital design can be fully specified utilizing LDials alone or utilizing LDials and IDials, in many cases it would be inefficient and inconvenient to do so. In particular, for hierarchical digital designs such as that illustrated in FIG. 5C, the use of LDials and/or IDials alone would force many Dials to higher levels of the design hierarchy, which, from an organizational standpoint, may be the responsibility of a different designer or design group than is responsible for the design entities containing the configuration latches controlled by the Dials. As a result, proper configuration of the configuration latches would require not only significant organizational coordination between design groups, but also that designers responsible for higher levels of the digital design learn and include within their HDL files details regarding the configuration of lower level design entities. Moreover, implementing Dials at higher levels of the hierarchy means that lower levels of the hierarchy cannot be independently simulated since the Dials controlling the configuration of the lower level design entities are not contained within the lower level design entities themselves.

In view of the foregoing, the present invention recognizes the utility of providing a configuration entity that supports the hierarchical combination of Dials to permit configuration of lower levels of the design hierarchy by lower-level Dials and control of the lower-level Dials by one or more higher-level Dials. The configuration specification language of the present invention terms a higher-level Dial that controls one or more lower-level Dials as a Control Dial ("CDial").

Figure 7A:
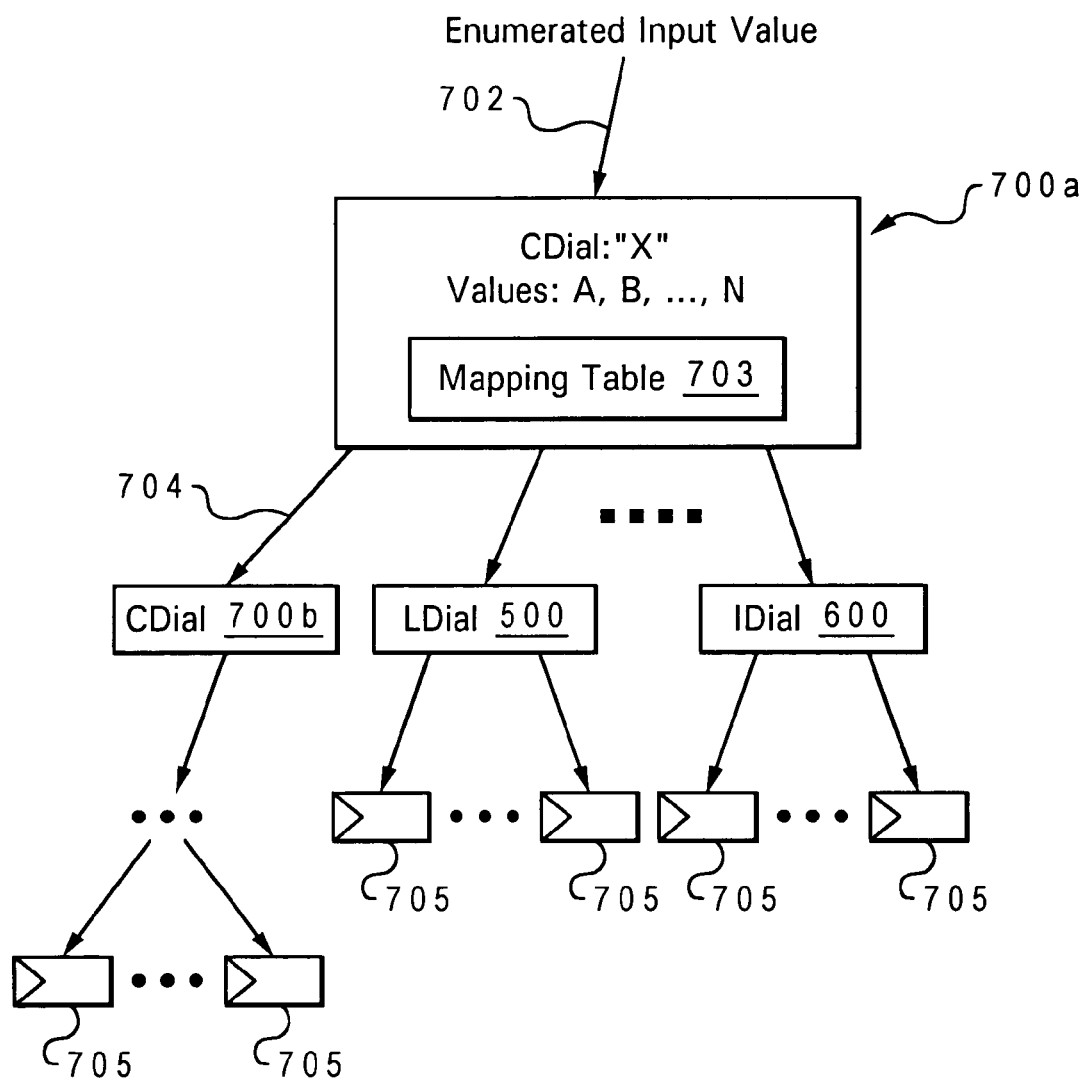
FIG. 7A is a diagrammatic representation of a CDial employed to control other Dials in accordance with the present invention.

Referring now to FIG. 7A, there is depicted a diagrammatic representation of a CDial 700 a in accordance with the present invention. CDial 700a, like all Dials, preferably has a single input 702, one or more outputs 704, and a mapping table 703 that maps each input value to a respective associated output value for each output 704. Unlike LDials and IDials, which directly specify configuration latches, a CDial 700 does not directly specify configuration latches. Instead, a CDial 700 controls one or more other Dials (i.e., CDials and/or LDials and/or IDials) logically coupled to CDial 700 in an n-way "Dial tree" in which each lower-level Dial forms at least a portion of a "branch" that ultimately terminates in "leaves" of configuration latches. Dial trees are preferably constructed so that no Dial is instantiated twice in any Dial tree.

In the exemplary embodiment given in FIG. 7A, CDial 700a receives at input 702 an enumerated input value (i.e., a string) among a set of legal values including "A", . . . , "N". If CDial 700a (or an LDial or IDial) is a top-level Dial (i.e., there are no Dials "above" it in a Dial tree), CDial 700a receives the enumerated input value directly from software (e.g., simulation software or firmware). Alternatively, if CDial 700a forms part of a "branch" of a dial tree, then CDial 700a receives the enumerated input value from the output of another CDial. For each legal enumerated input value that can be received at input 702, CDial 700a specifies a selected enumerated value or bit value for each connected Dial (e.g., Dials 700b, 500 and 600) in mapping table 703. The values in mapping table 703 associated with each output 704 are interpreted by ECAD system 35 in accordance with the type of lower-level Dial coupled to the output 704. That is, values specified for LDials and CDials are interpreted as enumerated values, while values specified for IDials are interpreted as integer values. With these values, each of Dials 700b, 500 and 600 ultimately specifies, either directly or indirectly, the values for one or more configuration latches 705.

Figure 7B:
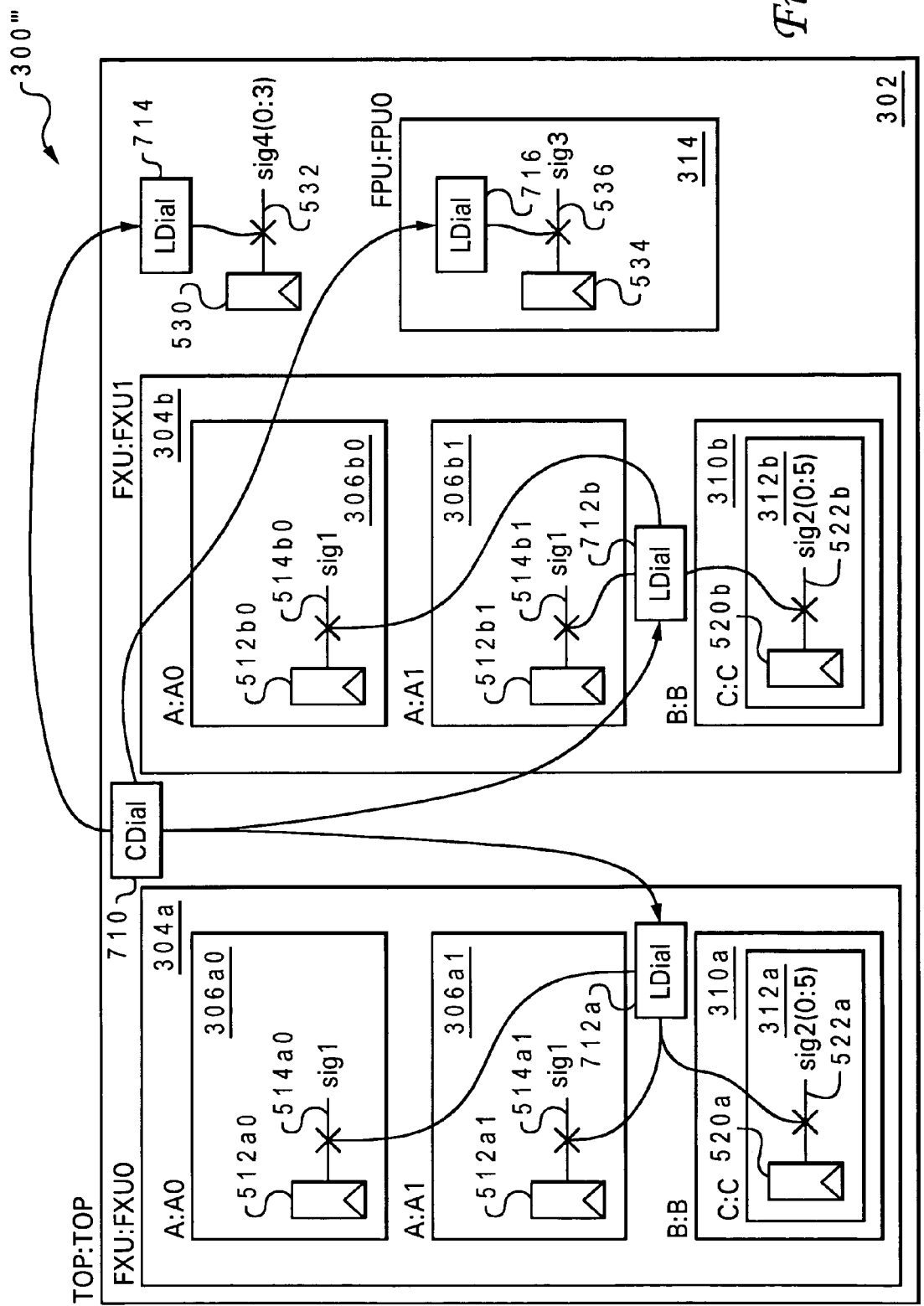
FIG. 7B depicts an exemplary digital design including a plurality of hierarchically arranged design entities in which a CDial is employed to control lower-level Dials utilized to configure signal states.

With reference now to FIG. 7B, there is illustrated another diagrammatic representation of a simulation model containing a Dial tree including a top-level CDial that controls multiple lower-level LDials. As indicated by prime notation, simulation model 300'''' of FIG. 7B includes the same design entities arranged in the same hierarchical relation as simulation model 300 of FIG. 3 and contains the same configuration latches and associated signals as simulation model 300'' of FIG. 5C.

As shown, simulation model 300'''' of FIG. 7B includes a top-level CDial 710 associated with top-level design entity 302. Simulation model 300'''' further includes four LDials 712a, 712b, 714 and 716. LDial 712a, which is associated with entity instantiation A0 304a, controls the signal states of each signal sig1 514a, which is determined by a respective configuration latch 512a, and the signal state of signal sig2 522a, which is determined by configuration latch 520a. LDial 712b, which is a replication of LDial 712a associated with entity instantiation A1 304b, similarly controls the signal states of each signal sig1 514b, which is determined by a respective configuration latch 512b, and the signal state of signal sig2 522b, which is determined by configuration latch 520b. LDial 714, which is associated with top-level entity 302, controls the signal state of signal sig4 532, which is determined by configuration latch 530. Finally, LDial 716, which is associated with entity instantiation FPU0 314, controls the signal state of signal sig3 536, which is determined by configuration latch 534. Each of these four LDials is controlled by CDial 710 associated with top-level entity 302.

As discussed above with respect to FIGS. 4A and 4B, CDial 710 and each of the four LDials depicted in FIG. 7B is instantiated within the associated design entity by embedding a configuration specification statement (or a configuration file reference statement pointing to a configuration file containing a configuration specification statement) within the HDL file of the associated design entity. An exemplary configuration specification statement utilized to instantiate each Dial shown in FIG. 7B is given below:

```
CDial BusRatio (FXU0.BUSRATIO, FXU1.BUSRATIO,
FPU0.BUSRATIO,
        BUSRATIO2)=
        {2:1 => 2:1, 2:1, 2:1, 2:1;
        3:1 => 3:1, 3:1, 3:1, 3:1;
        4:1 => 4:1, 4:1, 4:1, 4:1
        };
LDial BusRatio (A0.sig1, A1.sig1, B.C.sig2(0..5)) =
        {2:1 => 0b0, 0b0, 0x00;
        3:1 => 0b1, 0b1, 0x01;
        4:1 => 0b1, 0b1, 0x3F;
        };
LDial BusRatio (sig3) =
        {2:1 => 0b0;
        3:1 => 0b0;
        4:1 => 0b1
        };
LDial BusRatio2 (sig4(0..3)) =
        {2:1 => 0x0;
        3:1 => 0x1;
        4:1 => 0xF
        };
```

By implementing a hierarchical Dial tree in this manner, several advantages are realized. First, the amount of software code that must be entered is reduced since the automatic replication of LDials 712 within FXU entity instantiations 304a and 304b allows the code specifying LDials 712 to be entered only once. Second, the organizational boundaries of the design process are respected by allowing each designer (or design team) to specify the configuration of signals within the design entity for which he is responsible. Third, coding of upper level Dials (i.e., CDial 710) is greatly simplified, reducing the likelihood of errors. Thus, for example, the CDial and LDial collection specified immediately above performs the same function as the "large" LDial specified above with reference to FIG. 5C, but with much less complexity in any one Dial.

Many Dials, for example, Switches utilized to disable a particular design entity in the event an uncorrectable error is detected, have a particular input value that the Dial should have in nearly all circumstances. For such Dials, the configuration specification language of the present invention permits a designer to explicitly specify in a configuration specification statement a default input value for the Dial. In an exemplary embodiment, a Default value is specified by including "32 default value" following the specification of a Dial and prior to the concluding semicolon. For example, a default value for a CDial, can be given as follows:

```
CDial BusRatio (FXU0.BUSRATIO, FXU1.BUSRATIO,
FPU0.BUSRATIO,
        BUSRATIO)=
        {2:1 => 2:1, 2:1, 2:1, 2:1;
        3:1 => 3:1, 3:1, 3:1, 3:1;
        4:1 => 4:1, 4:1, 4:1, 4:1
        } = 2:1;
```

It should be noted that for CDials and LDials, the specified default value is required to be one of the legal enumerated values, which are generally (i.e., except for Switches) listed in the mapping table. For Switches, the default value must be one of the predefined enumerated values of "ON" and "OFF".

A default value for an IDial can similarly be specified as follows:

```
IDial cnt_value(A0.sig1(0..7), A0.sig2(8..14);
        A1.sig1(0..7), A1.sig2(8..14);
        A3.sig1(0..7), A3.sig2(8..14)
        ) = 0x7FFF;
```

In this case, a constant, which can be given in hexadecimal, decimal or binary format, provides the default output value of each signal controlled by the IDial. In order to apply the specified constant to the indicated signal(s), high order bits are truncated or padded with zeros, as needed.

The use of default values for Dials is subject to a number of rules. First, a default value may be specified for any type of Dial including LDials, IDials (including those with split outputs) and CDials. Second, if default values are specified for multiple Dials in a multiple-level Dial tree, only the highest-level default value affecting each "branch" of the Dial tree is applied (including that specified for the top-level Dial), and the remaining default values, if any, are ignored. Despite this rule, it is nevertheless beneficial to specify default values for lower-level Dials in a Dial tree because the default values may be applied in the event a smaller portion of a model is independently simulated, as discussed above. In the event that the combination of default values specified for lower-level Dials forming the "branches" of a Dial tree do not correspond to a legal output value set for a higher-level Dial, the compiler will flag an error. Third, a default value is overridden when a Dial receives an input to actively set the Dial.

By specifying default values for Dials, a designer greatly simplifies use of Dials by downstream organizational groups by reducing the number of Dials that must be explicitly set for simulation or hardware configuration. In addition, as discussed further below, use of default values assists in auditing which Dials have been actively set.

In addition to defining syntax for configuration specification statements specifying Dials, the configuration specification language of the present invention supports at least two additional HDL semantic constructs: comments and attribute specification statements. A comment, which may have the form:

BusRatio.comment="The bus ratio Dial configures the circuit in accordance with a selected processor/interconnect frequency ratio";

permits designers to associate arbitrary strings delimited by quotation marks with particular Dial names. As discussed below with reference to FIG. 8, these comments are processed during compilation and included within a configuration documentation file in order to explain the functions, relationships, and appropriate settings of the Dials.

Attribute specification statements are statements that declare an attribute name and attribute value and associate the attribute name with a particular Dial name. For example, an attribute specification statement may have the form:

BusRatio.attribute (myattribute)=scom57 (0:9);

In this example, "BusRatio.attribute" declares that this statement is an attribute specification statement associating an attribute with a Dial having "BusRatio" as its Dial name, "myattribute" is the name of the attribute, and "scom57 (0:9)" is a string that specifies the attribute value. Attributes support custom features and language extensions to the base configuration specification language.

Figure 8:
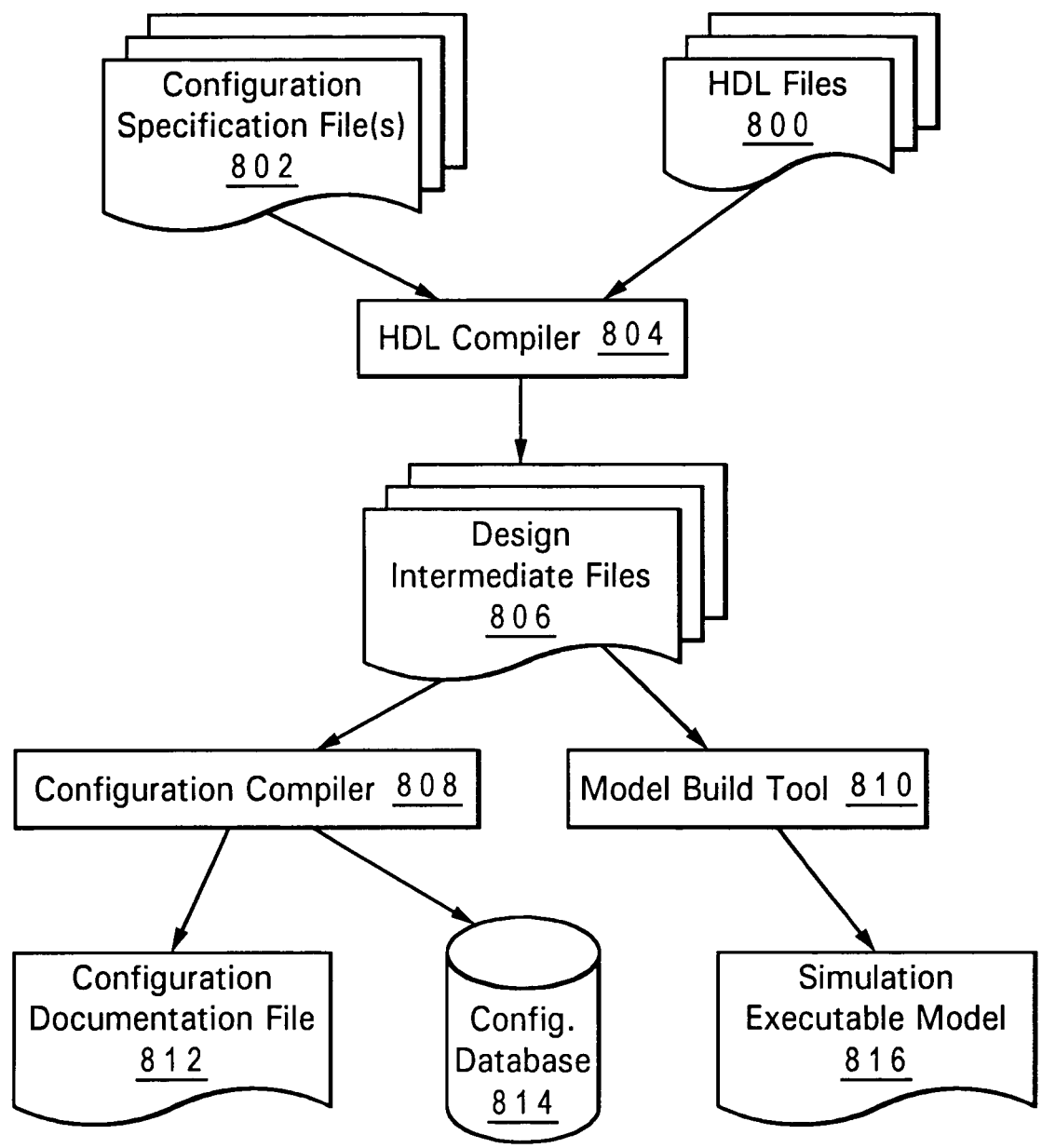
FIG. 8 is a high level flow diagram of a model build process utilized to produce a simulation executable model and associated simulation configuration database in accordance with the present invention.

Referring now to FIG. 8, there is depicted a high level flow diagram of a model build process in which HDL files containing configuration statements are compiled to obtain a simulation executable model and a simulation configuration database for a digital design. The process begins with one or more design entity HDL source code files 800, which include configuration specification statements and/or configuration file reference statements, and, optionally, one or more configuration specification reference files 802. HDL compiler 804 processes HDL file(s) 800 and configuration specification file(s) 802, if any, beginning with the top level entity of a simulation model and proceeding in a recursive fashion through all HDL file(s) 800 describing a complete simulation model. As HDL compiler 804 processes each HDL file 800, HDL compiler 804 creates "markers" in the design intermediate files 806 produced in memory to identify configuration statements embedded in the HDL code and any configuration specification files referenced by an embedded configuration file reference statement.

Thereafter, the design intermediate files 806 in memory are processed by a configuration compiler 808 and model build tool 810 to complete the model build process. Model build tool 810 processes design intermediate files 806 into a simulation executable model 816, that when executed, models the logical functions of the digital design, which may represent, for example, a portion of an integrated circuit, an entire integrated circuit or module, or a digital system including multiple integrated circuits or modules. Configuration compiler 808 processes the configuration specification statements marked in design intermediate files 806 and creates from those statements a configuration documentation file 812 and a configuration database 814.

Configuration documentation file 812 lists, in human-readable format, information describing the Dials associated with the simulation model. The information includes the Dials' names, their mapping tables, the structure of Dial trees, if any, instance information, etc. In addition, as noted above, configuration documentation file 812 includes strings contained in comment statements describing the functions and settings of the Dials in the digital design. In this manner, configuration documentation suitable for use with both a simulation model and a hardware implementation of a digital design is aggregated in a "bottom-up" fashion from the designers responsible for creating the Dials. The configuration documentation is then made available to all downstream organizational groups involved in the design, simulation, laboratory hardware evaluation, and commercial hardware implementation of the digital design.

Configuration database 814 contains a number of data structures pertaining to Dials. As described in detail below, these data structures include Dial data structures describing Dial entities, latch data structures, and Dial instance data structures. These data structures associate particular Dial inputs with particular configuration values used to configure the digital design (i.e., simulation executable model 816). In a preferred embodiment, the configuration values can be specified in terms of either signal states or configuration latch values, and the selection of which values are used is user-selectable. Configuration database 814 is accessed via Application Programming Interface (API) routines during simulation of the digital design utilizing simulation executable model 816 and is further utilized to generate similar configuration databases for configuring physical realizations of the digital design. In a preferred embodiment, the APIs are designed so that only top-level Dials (i.e., LDials, IDials or CDials without a CDial logically "above" them) can be set and all Dial values can be read.

As described above, the configuration specification language of the present invention advantageously permits the specification of the output values of LDials and IDials by reference to signal names (e.g., "sig1"). As noted above, a key motivation for this feature is that designers tend to think in terms of configuring operative signals to particular signal states, rather than configuring the associated configuration latches. In practice, however, a signal that a designer desires to configure to a particular state may not be directly connected to the output of an associated configuration latch. Instead, a signal to be configured may be coupled to an associated configuration latch through one or more intermediate circuit elements, such as buffers and inverters. Rather than burdening the designer with manually tracing back each configurable signal to an associated configuration latch and then determining an appropriate value for the configuration latch, configuration compiler 808 automatically traces back a specified signal to the first storage element (i.e., configuration latch) coupled to the signal and performs any necessary inversions of the designer-specified signal state value to obtain the proper value to load into the configuration latch.

Figure 9A:
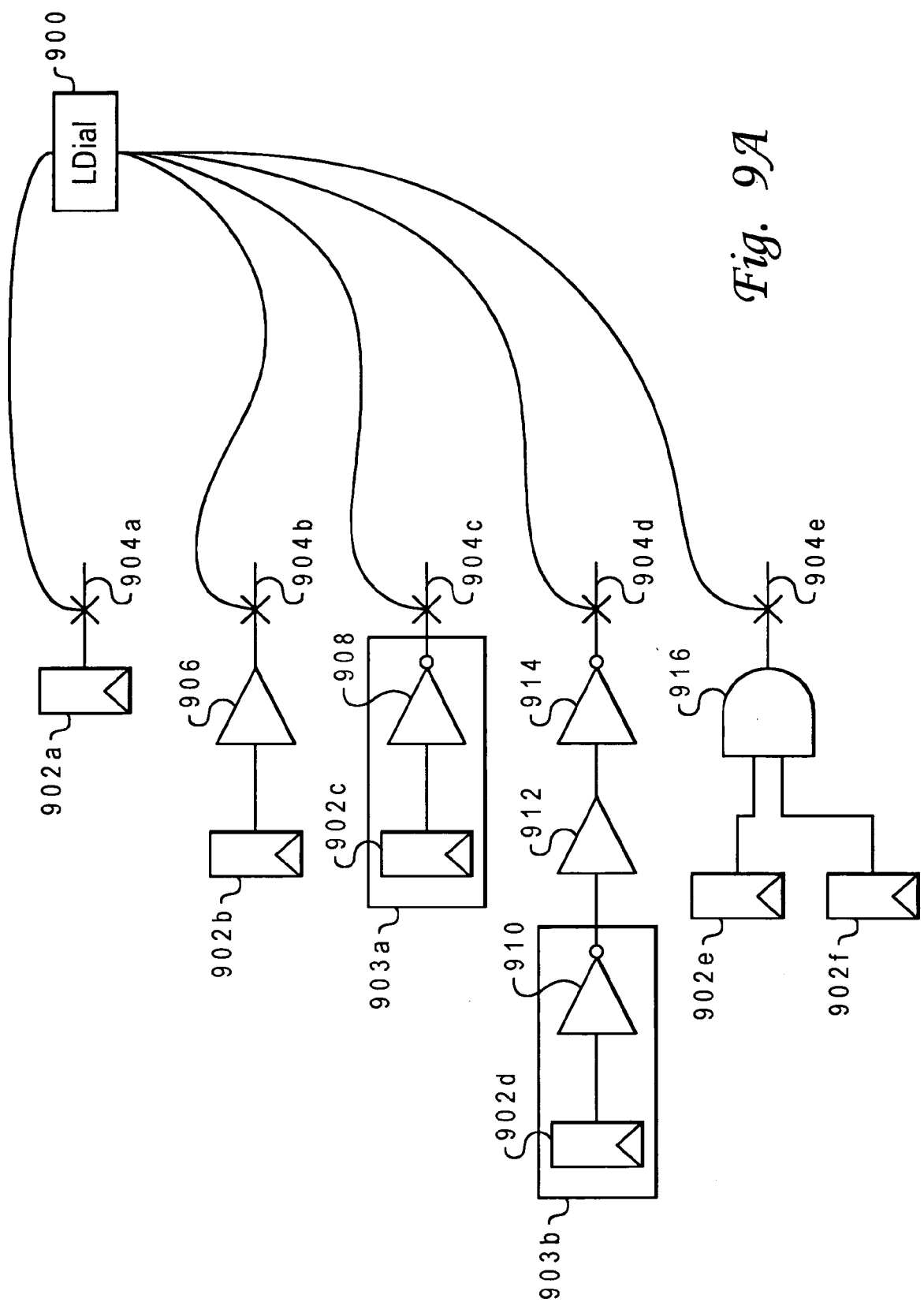
FIG. 9A illustrates a portion of a digital design illustrating the manner in which a traceback process implemented by a configuration compiler detects inverters in the signal path between a configured signal and an associated configuration latch.

With reference now to FIG. 9A, there is illustrated a portion of a digital design including an LDial 900 that controls the states of a plurality of signals 904a–904e within the digital design. When configuration compiler 808 performs a traceback of signal 904a, no inversion of the designer-specified signal states is required because signal 904a is directly connected to configuration latch 902a. Accordingly, configuration compiler 808 stores into configuration database 814 the designer-specified values from the configuration specification statement of LDial 900 as the values to be loaded into configuration latch 902a. Traceback of signal 904b to configuration latch 902b similarly does not result in the inversion of any designer-specified values from the configuration specification statement of LDial 900 because the only intervening element between signal 904b and configuration register 902b is a non-inverting buffer 906.

Configuration latches, such as configuration latches 902c and 902d, are frequently instantiated by designers through inclusion in an HDL file 800 of an HDL statement referencing a latch primitive in an HDL design library. The latch entity 903a, 903b inserted into the simulation executable model in response to such HDL library references may include inverters, such as inverters 908, 910, which are not explicitly "visible" to the designer in the HDL code. The automatic traceback performed by configuration compiler 808 nevertheless detects these inverters, thus preventing possible configuration errors.

Accordingly, when performing a traceback of signal 904c, configuration compiler 808 automatically inverts the designer-specified configuration value specified for signal 904c before storing the configuration value for configuration latch 902c in configuration database 814 because of the presence of an inverter 908 between signal 904c and configuration latch 902c. When configuration compiler 808 performs traceback of signal 904d, however, configuration compiler 808 does not invert the designer-specified signal state values despite the presence of inverters 910, 914 and buffer 912 in the signal path because the logic is collectively non-inverting. It should be noted that configuration compiler 808 can accurately process both "hidden" inverters like inverter 910 and explicitly declared inverters like inverter 914.

FIG. 9A finally illustrates a signal 904e that is coupled to multiple configuration latches 902e and 902f through an intermediate AND gate 916. In cases like this in which the traceback process detects fanout logic between the specified signal and the closest configuration latch, it is possible to configure configuration compiler 808 to generate appropriate configuration values for configuration latches 902e, 902f based upon the designer-specified signal state values for signal 904e. However, it is preferable if configuration compiler 808 flags the configuration specification statement for LDial 900 as containing an error because the compiler-selected values for configuration latches 902e, 902f may affect other circuitry that receives the configuration values from configuration latches 902 in unanticipated ways.

Figure 9B:
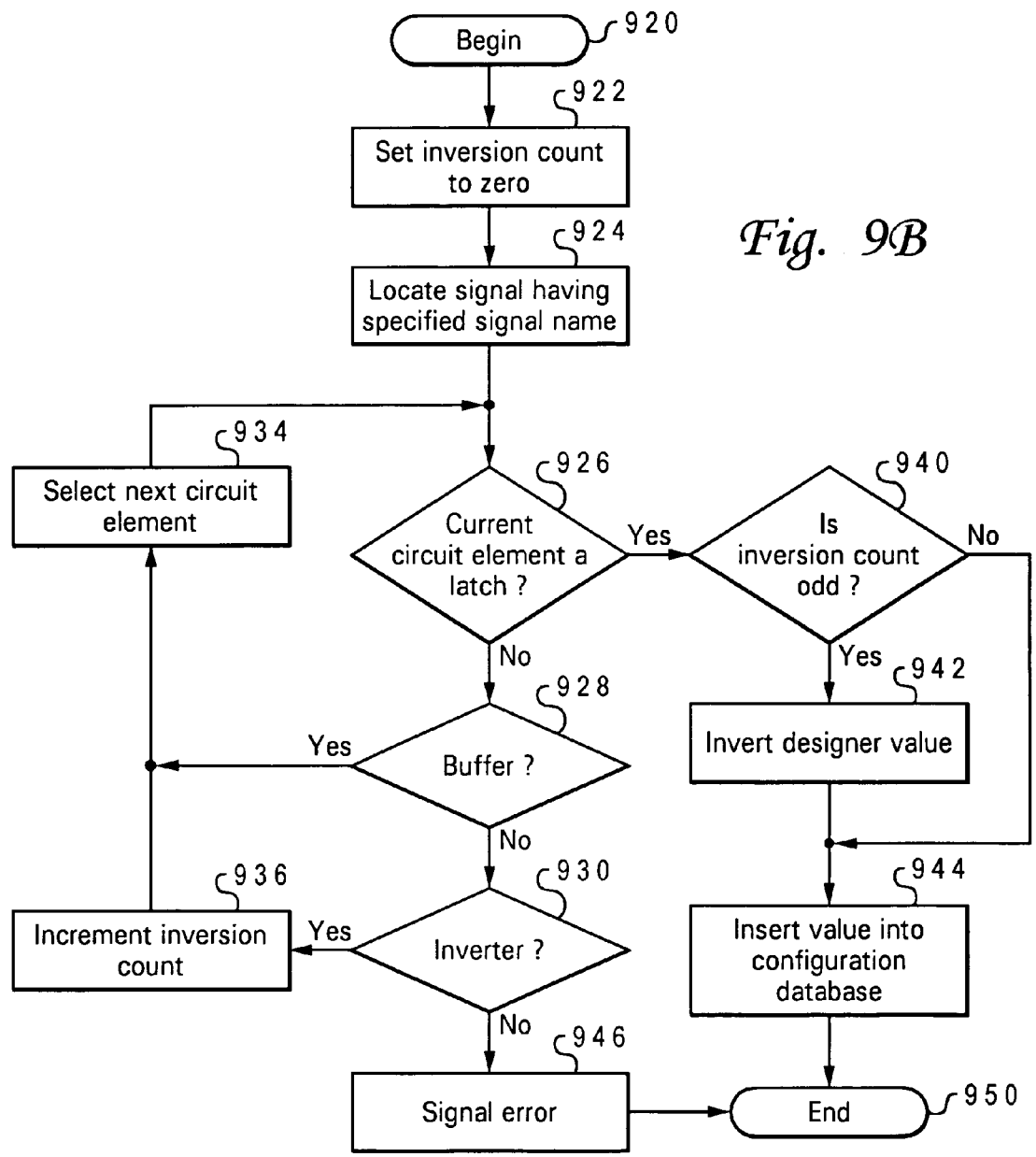
FIG. 9B is a high level flowchart of an exemplary traceback process implemented by a configuration compiler in accordance with a preferred embodiment of the present invention.

Referring now to FIG. 9B, there is depicted a high level logical flowchart of the traceback process implemented by configuration compiler 808 for each signal name specified in a configuration specification statement. As shown, the process begins at block 920 and then proceeds to block 922–924, which illustrate configuration compiler 808 initializing an inversion count to zero and then locating the signal identified by the signal name specified in a configuration specification statement.

The process then enters a loop comprising blocks 926–936, which collectively represent configuration compiler 808 tracing back the specified signal to the first latch element in the signal path. Specifically, as illustrated at blocks 926–930, configuration compiler 808 determines whether the next "upstream" circuit element in the signal path is a latch (926), buffer (928) or inverter (930). If the circuit element is a latch, the process exits the loop and passes to block 940, which is described below. If, however, the circuit element is a buffer, the process passes to block 934, which illustrates configuration compiler moving to the next upstream circuit element to be processed without incrementing the inversion count. If the circuit element is an inverter, the process passes to blocks 936 and 934, which depicts incrementing the inversion count and then moving to the next upstream circuit element to be processed. In this manner, configuration compiler traces back a specified signal to a configuration latch while determining a number of inversions of signal state implemented by the circuit elements in the path. As noted above, if configuration compiler 808 detects a circuit element other than a buffer or inverter in the signal path, configuration compiler 808 preferably flags an error, as shown at block 946. The process thereafter terminates at block 950.

Following detection of a configuration latch at block 926, configuration compiler 808 determines whether the inversion count is odd or even. As shown at blocks 940–944, if the inversion count is odd, configuration compiler inverts the designer-specified configuration values for the signal at block 942 prior to inserting the values into configuration database 814. No inversion is performed prior to inserting the configuration values into configuration database 814 if the inversion count is even. The process thereafter terminates at block 950.

As has been described, the present invention provides a configuration specification language that permits a designer of a digital system to specify a configuration for the digital system utilizing configuration statements embedded in the HDL design files describing the digital system. The configuration statements logically instantiate within the digital design one or more Dials, which provide configuration values for the digital design in response to particular inputs. The Dials, like the design entities comprising the digital design, may be hierarchically arranged. The configuration specification statements are compiled together with the HDL files describing the digital design to produce a configuration database that may be accessed to configure a simulation executable model or (after appropriate transformations) a physical realization of the digital design. The compilation of the configuration specification statements preferably supports a traceback process in which designer-specified configuration values for a signal are inverted in response to detection of an odd number of inverters coupled between the signal and an associated configuration latch.

With reference again to FIG. 5C, recall that an exemplary configuration specification statement for LDial 524 includes a parenthetical signal enumeration of the form:

```
LDial bus ratio (FXU0.A0.SIG1, FXU0.A1.SIG1,
    FXU0.B.C.SIG2(0..5),
    FXU1.A0.SIG1, FXU1.A1.SIG1,
    FXU1.B.C.SIG2(0..5),
    FPU0.SIG3, SIG4(0..3)
) =
...
```

It should be noted that the signal enumeration section of the configuration specification statement individually, hierarchically and explicitly enumerates the signal identifier of each signal instance configured by the Dial, beginning from the scope of the design entity with which the Dial is associated (which by convention is the design entity in whose HDL file the configuration specification statement or configuration reference statement instantiating the Dial is embedded). This syntax is referred to herein as a "full expression" of a signal identifier. Employing "full expression" syntax in the signal enumeration section of the configuration specification statement for an LDial or IDial or in the Dial enumeration section of the configuration specification statement of a CDial requires the designer to know and correctly enter the hierarchical identifier for each instance of a signal (or lower-level Dial) controlled by the Dial. Consequently, if a new instance of the same signal (or lower-level Dial) were later added to the digital design, the designer must carefully review the configuration specification statement of the Dial(s) referencing other instances of the same signal (or Dial) and update the signal (or Dial) enumeration section to include the full expression of the newly added instance.

In order to reduce the amount of input required to input the signal (or Dial) enumeration sections of configuration specification statements and to reduce the burden of code maintenance as new signal and Dial instances are added to the digital design, an ECAD system 35 in accordance with the present invention also supports a "compact expression" syntax for the signal (or Dial) enumeration sections of configuration specification statements. This syntax is referred to herein more specifically as "compact signal expression" when applied to the configuration specification statements of LDials and IDials and is referred to as "compact Dial expression" when referring to the configuration specification statements of CDials.

In a compact expression of a signal or Dial enumeration, all instances of an entity within a selected scope for which a common configuration is desired can be enumerated with a single identifier. For example, in FIG. 5C, if the designer wants a common configuration for all four instantiations of signal sig1 514, the designer could enumerate all four instantiations in the configuration specification statement of LDial 524 with the single compact signal expression "[A].sig1", where the bracketed term is the name of the entity in which the signal of interest occurs. In compact expressions, the default scope of the expression is implied as the scope of the design entity (in this case top-level entity 302) with which the Dial is associated. The identifier "[A].sig1" thus specifies all four instantiations of signal sig1 514 within A entity instantiations 304 within the default scope of top-level entity 302.

The scope of the identifier in a compact expression can further be narrowed by explicitly enumerating selected levels of the design hierarchy. For example, the compact expression "FXU1.[A].sig1" refers only to signal sig1 instantiations 514b0 and 514b1 within FXU1 entity instantiation 304b, but does not encompass signal sig1 instantiations 514a0 and 514a1 within FXU0 entity instantiation 304a.

Of course, when only a single instance of a signal or Dial is instantiated at higher levels of the design hierarchy, the compact expression and the full expression will require approximately the same amount of input (e.g., "FPU0.sig3" versus "[FPU].sig3" to identify signal sig3 536). However, it should be noted that if another FPU entity 314 were later added to simulation model 300", the compact expression of the identification would advantageously apply to any later added FPU entities within the scope of top-level entity 302.

Utilizing compact expression, the configuration specification statement for LDial 524 can now be rewritten more compactly as follows:

```
LDial bus ratio ([A].SIG1, [C].SIG2(0..5),
    FPU0.SIG3, SIG4(0..3)
)=
{2:1 => 0b0, 0x00, 0b0, 0x0;
3:1 => 0b1, 0x01, 0b0, 0x1;
4:1 => 0b1, 0x3F, 0b1, 0xF
};
```

If the concatenation syntax described above is applied to the mapping table, the mapping table can be further reduced to:

```
{2:1 =>0;
 3:1 =>0x821;
 4:1 =>0xFFF
};
```

In the concatenation syntax, the signal values are specified in the mapping table with a single respective bit field for each entity identifier, irrespective of the number of actual entity instances. For example, all instances encompassed by "[A].sig1" are represented by 1 bit of the specified configuration value, all instances encompassed by "[C].sig2" are represented by 6 bits of the specified configuration value, the single instance identified by "FPU0.sig3" is represented by 1 bit of the specified configuration value, and the single instance of "sig4(0 . . . 3)" is represented by 4 bits of the specified configuration value. Thus, utilizing concatenation syntax, the 21 bits collectively specified by LDial 524 can be specified by an equivalent 12-bit pattern.

Compact Dial expressions are constructed and parsed by the compiler in the same manner as compact signal expressions. For example, the configuration specification statement for CDial 710 of FIG. 7B can be rewritten utilizing compact Dial expression as follows:

```
CDial BusRatio ([FXU].BUSRATIO, [FPU].BUSRATIO, BUSRATIO)=
    {2:1 => 2:1, 2:1, 2:1;
     3:1 => 3:1, 3:1, 3:1;
     4:1 => 4:1, 4:1, 4:1
    };
```

Again, this configuration specification statement advantageously permits CDial 710 to automatically control any additional LDials named "Bus ratio" that are latter added to simulation model 300"" through the instantiation of additional FXU entities 304 or FPU entities 314 without any code modification.

Referring now to FIG. 10, there is depicted a high level logical flowchart of an exemplary method by which configuration compiler 808 parses each signal or Dial identification within a configuration specification statement in accordance with the present invention. As described above, each signal or Dial identification is constructed hierarchically from one or more fields separated by periods ("."). The last field specifies an instance name of a signal (e.g., "sig1") or Dial (e.g., "Bus_Ratio"), and the preceding fields narrow the scope from the default scope, which by convention is the scope of the design entity with which the Dial is associated.

As shown, the process begins at block 1000 and then proceeds to block 1002, which illustrates configuration compiler 808 determining whether the first or current field of the signal or Dial identification contains an entity identifier enclosed in brackets (e.g., "[A]"), that is, whether the identification is a compact expression. If so, the process passes to block 1020, which is described below. If not, configuration compiler 808 determines at block 1004 whether the identification is a full expression, by determining whether the first or current field of the identification is the last field of the identification. If so, the signal or Dial identification is a full expression, and the process passes to block 1010. If, on the other hand, the current field of the identification is not the last field, configuration compiler 808 narrows a current scope to the design entity instantiation identified in the current field of the identification, as depicted at block 1006. For example, if configuration compiler 808 were processing the identification "FPU0.SIG3" within the configuration specification statement of CDial 710 of FIG. 7B, configuration compiler 808 would narrow the scope from the default scope of top entity 302 to FPU entity instantiation 314. If the entity instantiation indicated by the current field of the identification exists, as shown at block 1008, the process returns to block 1002 after updating the current field to be the next field, as shown at block 1009. If, however, the entity instantiation specified by the current field does not exist within the current scope, configuration compiler 808 flags an error at block 1032 and terminates processing of the signal or Dial identification.

Referring again to block 1004, when configuration compiler 808 detects that it has reached the last field of a full expression, the process shown in FIG. 10 passes from block 1004 to block 1010. Block 1010 illustrates configuration compiler 1010 attempting to locate within the current scope the single signal or Dial instance having a name matching that specified in the last field of the signal or Dial identification. If configuration compiler 808 determines at block 1012 that no matching instance is found within the current scope, the process passes to block 1032, and configuration compiler 808 flags an error. However, if configuration compiler 808 locates the matching signal or Dial instance, then configuration compiler 808 makes an entry in configuration database 814 binding the signal or Dial instance to the parameters specified in the mapping table of the configuration specification statement of the Dial being processed, as shown at block 1014. Thereafter, processing of the signal or Dial identification terminates at block 1030.

With reference now to block 1020 and following blocks, the processing of a signal or Dial identification employing compact expression will now be described. Block 1020 depicts configuration compiler 808 attempting to locate, within each of one or more instances in the current scope of the entity indicated by the bracketed field, each Dial or signal instance matching that specified in the signal or Dial identification. For example, when processing the compact expression "FXU1.[A].sig1" for simulation model 300"" of FIG. 7B, configuration compiler 808, upon reaching the field "[A]", searches FXU1 for instantiations of entity A 306, and upon finding entity instantiations 306*a*0 and 306*a*1, searches within each of these two entity instantiations to locate signals instantiations sig1 514*a*0 and 514*a*1. If configuration compiler 808 determines at block 1022 that no matching signal or Dial instance is found within the current scope, the process passes to block 1032, which depicts configuration compiler 808 terminating processing of the signal or Dial identification after flagging an error. However, if configuration compiler 808 locates one or more matching signal or Dial instances, then the process passes from block 1022 to block 1024. Block 1024 illustrates configuration compiler 808 making one or more entries in configuration database 814 binding each matching signal or Dial instance to the parameters specified in the mapping table of the configuration specification statement of the Dial being processed. Thereafter, processing of the signal or Dial identification terminates at block 1030.

Utilizing the compact expressions supported by the present invention, the amount of code a designer must enter in a configuration specification statement can be advantageously reduced. The use of compact expressions not only reduces input requirements and the likelihood of input errors, but also simplifies code maintenance through the automatic application of specified configuration parameters to later entered instances of signals and Dials falling within a selected scope.

As described above, every Dial has a one-to-one mapping between each of its input values and a unique output value of the Dial. In other words, each input value has a unique output value different than the output value for any other input value. For CDials and LDials, the mapping table must explicitly enumerate each legal input value and its associated mapping.

The requirement that the input values must be explicitly enumerated in the mapping table limits the overall complexity of any given LDial or CDial. For example, consider the case of an integrated circuit (e.g., a memory controller) containing 10 to 20 configuration registers each having between 5 and 20 legal values. In many cases, these registers have mutual dependencies—the value loaded in one register can affect the legal possibilities of one or more of the other registers. Ideally, it would be convenient to specify values for all of the registers utilizing a Dial tree controlled by a single CDial. In this manner, the configuration of all of the 10 to 20 registers could be controlled as a group.

Unfortunately, given the assumptions set forth above, the 10 to 20 registers collectively may have over 300,000 legal combinations of values. The specification of a CDial in such a case, although theoretically possible, is undesirable and practically infeasible. Moreover, even if a looping construct could be employed to automate construction of the configuration specification statement of the CDial, the configuration specification statement, although informing simulation software which input values are legal, would not inform users how to set a CDial of this size.

In recognition of the foregoing, the configuration specification language of the present invention provides a "Dial group" construct. A Dial group is a collection of Dials among which the designer desires to create an association. The runtime APIs utilized to provide Dial input values observe this association by preventing the individual Dials within a Dial group from being set individually. In other words, all Dials in a Dial group must be set at the same time so that individual Dials are not set independently without concern for the interactions between Dials. Because software enforces an observance of the grouping of the Dials forming a Dial group, use of Dial groups also provides a mechanism by which a designer can warn the "downstream" user community that an unstated set of interdependencies exists between the Dials comprising the Dial group.

Figure 11A:
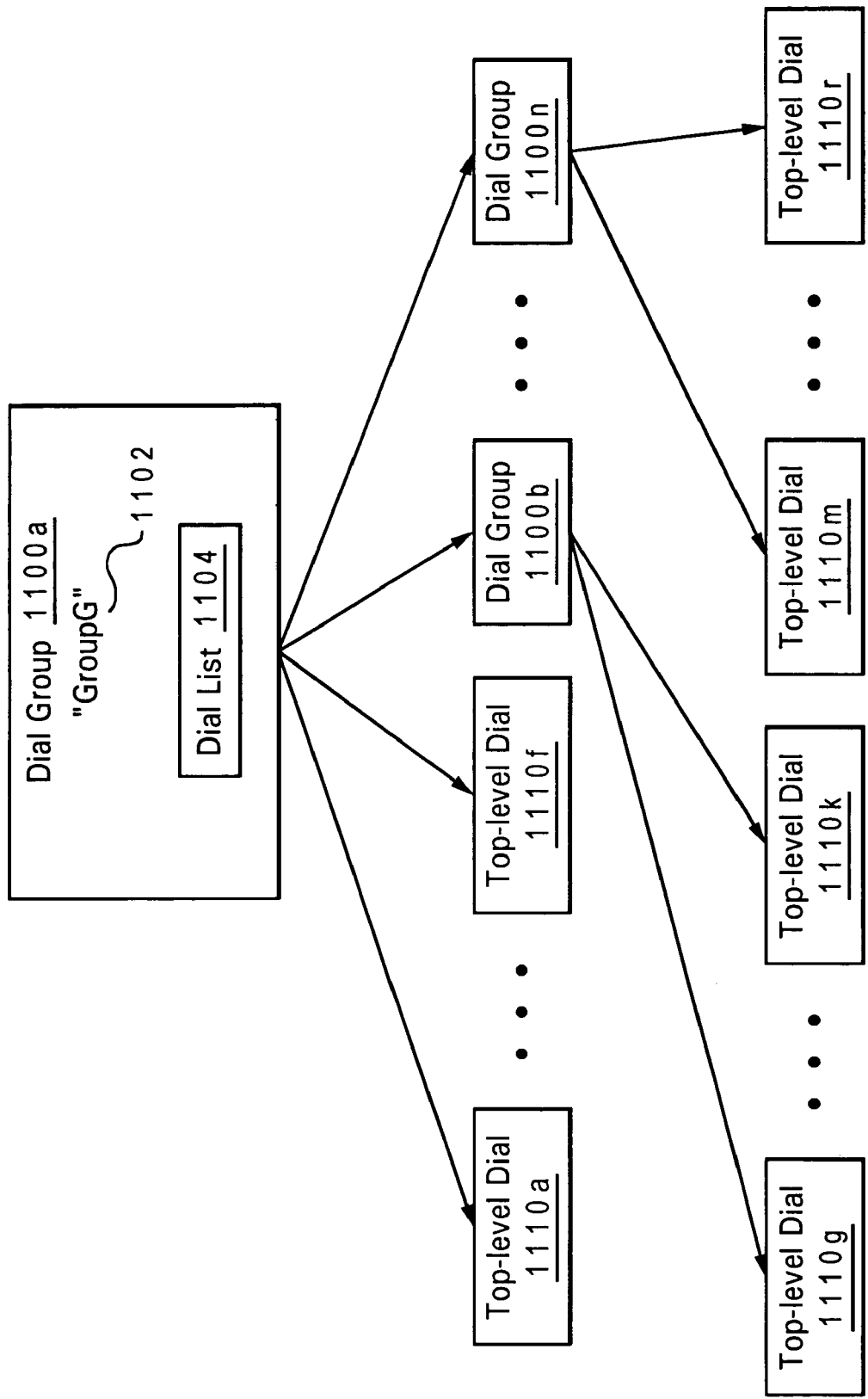
FIG. 11A depicts a diagrammatic representation of a Dial group.

With reference now to FIG. 11A, there is illustrated a diagrammatic representation of a Dial group 1100a. A Dial group 1100a is defined by a group name 1102 (e.g., "GroupG") and a Dial list 1104 listing one or more Dials or other Dial groups. Dial groups do not have any inputs or outputs. The Dials listed within Dial list 1104, which are all top-level Dials 1110a–1110f, may be LDials, CDials and/or IDials.

FIG. 11A illustrates that a Dial group 1100a may be implemented as a hierarchical Dial group that refers to one or more other Dial groups 1100b–1100n in its Dial list 1104. These lower-level Dial groups in turn refer to one or more top-level Dials 1110g–1110k and 1110m–1110r (or other Dial groups) in their respective Dial lists.

One motivation for implementing Dial groups hierarchically is to coordinate configuration of groups of Dials spanning organizational boundaries. For example, consider a digital system in which 30 Dials logically belong in a Dial group and 10 of the Dials are contained within a first design entity that is the responsibility of a first designer and 20 of the Dials are contained within a second design entity that is the responsibility of a second designer. Without a hierarchical Dial group, a single Dial group explicitly listing all 30 Dials in its Dial list 1104 would have to be specified at a higher level of the design hierarchy encompassing both of the first and second design entities. This implementation would be inconvenient in that the designer (or design team) responsible for the higher-level design entity would have to know all of the related Dials in the lower-level design entities and specifically identify each of the 30 Dials in the Dial list 1104 of the Dial group.

An alternative hierarchical approach would entail creating a first Dial group containing the 10 Dials within the first design entity, a second Dial group containing the 20 Dials within the second design entity, and a third higher-level Dial group that refers to the first and second Dial groups. Importantly, the Dial list 1104 of the higher-level Dial group must only refer to the two lower-level Dial groups, thus shielding designers responsible for higher levels of the design hierarchy from low-level details. In addition, code maintenance is reduced since changing which Dials belong to the two lower-level Dial groups would not affect the Dial list 1104 of the upper-level Dial group.

Dial groups are subject to a number of rules. First, no Dial or Dial group may be listed in the Dial list 1104 of more than one Dial group. Second, a Dial group must refer to at least one Dial or other Dial group in its Dial list 1104. Third, in its Dial list 1104, a Dial group can only refer to Dials or Dial groups within its scope, which by convention (and like the concept of scope as applied to Dials) is that of its associated design entity (i.e., the design entity itself and any lower level design entity within the design entity). Fourth, each Dial referred to in a Dial list 1104 of a Dial group must be a top-level Dial.

Figure 11B:
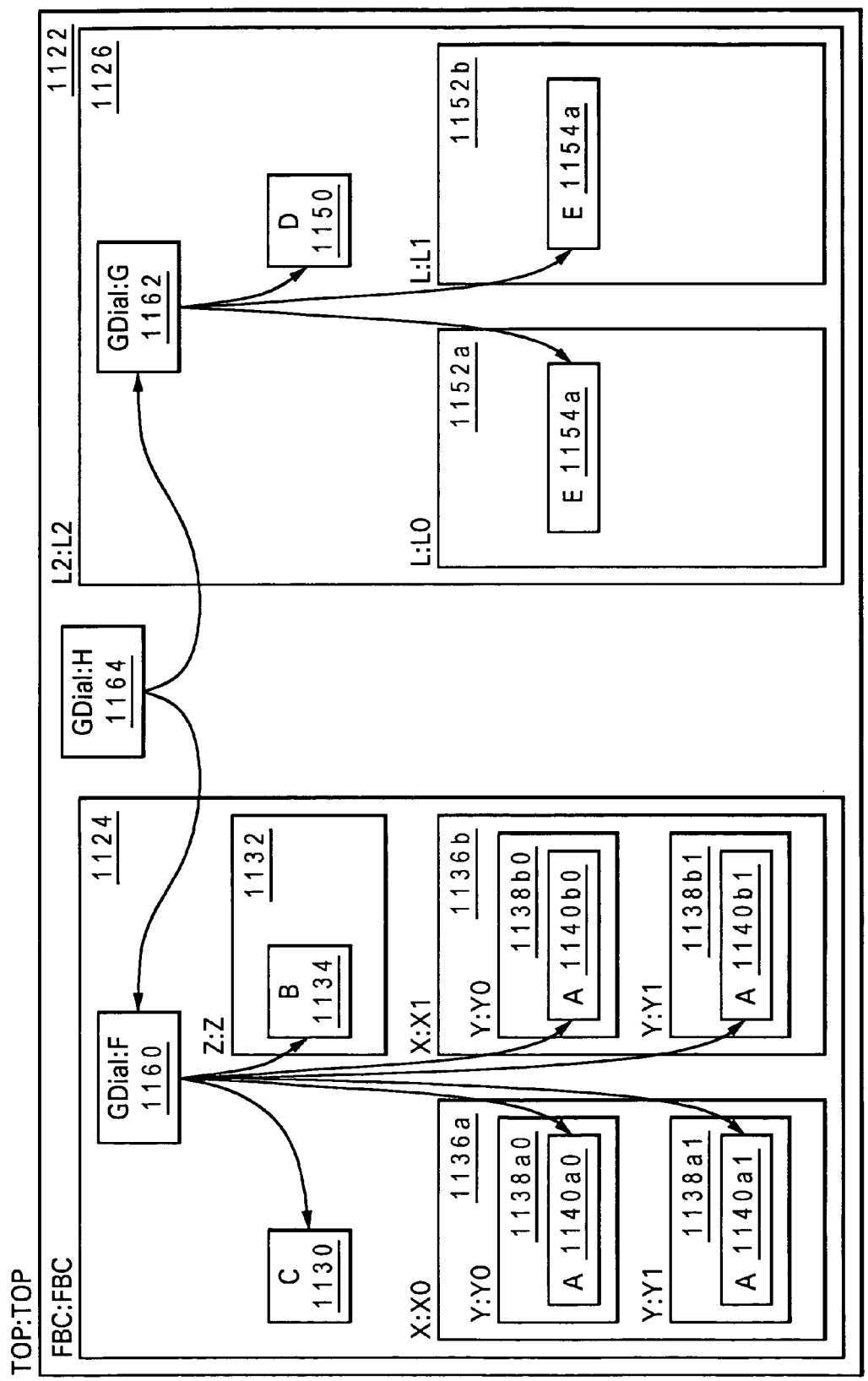
FIG. 11B illustrates an exemplary simulation model including Dials grouped in multiple hierarchically arranged Dial groups.

Referring now to FIG. 11B, there is depicted an exemplary simulation model 1120 illustrating the use of Dial groups. Exemplary simulation model 1120 includes a top-level design entity 1122 having instantiation identifier "TOP:TOP". Within top-level design entity 1122, two design entities 1124 and 1126 are instantiated, which have entity names FBC and L2, respectively. FBC entity instantiation 1124 in turn instantiates a Dial instance 1130 having Dial name "C", a Z entity instantiation 1132 containing a Dial instance 1134 having Dial name "B", and two instantiations of entity X 1136, which are respectively named "X0" and "X1". Each entity X instantiation 1136 contains two entity Y instantiations 1138, each further instantiating a Dial instance 1140 having Dial name "A". L2 entity instantiation 1126 contains a Dial instance 1150 having Dial name "D" and two entity L instantiations 1152, each containing a Dial instance 1154 having Dial name "E".

As shown, FBC entity instantiation 1124 has an associated Dial group instance 1160 having a group name "F". As indicated by arrows, Dial group instance 1160 includes each of Dials instances 1130, 1134 and 1140 within FBC entity instantiation 1124. L2 entity instantiation 1126 similarly has an associated Dial group instance 1162 that includes each of Dial instances 1150 and 1154 within L2 entity instantiation 1126. Both of these Dial group instances in turn belong to a higher-level Dial group instance 1164 having group name "H", which is associated with top-level design entity 1122.

Each Dial group instance is created by including within the HDL file of the associated design entity an appropriate configuration statement. For example, exemplary syntax for configuration statements creating Dial groups "F", "G" and "H" are respectively given as follows:

GDial F(C, [Z].B, [Y].A);
GDial G(D, [L].E);
GDial H(FBC.F, L2.G);

In each configuration statement, a Dial group is declared by the keyword "GDial", which is followed by string (e.g., "F") representing the group name. Within the parenthesis following the group name, the Dial list for the Dial group is specified. As indicated in the configuration statement for Dial group "H", the Dial list for a hierarchical Dial group specifies other Dial groups in the same manner as Dials. It should also be noted that the compact dial expression syntax discussed above can be employed in specifying Dials or Dial groups in the Dial list, as indicated in the configuration statements for Dial groups "F" and "G". In addition, default values may be applied to a Dial group by specifying a default value for each top-level Dial included in the Dial group.

Now that basic types of Dials, syntax for their specification, and the application and Dial groups have been described, a description of an exemplary implementation of configuration database 814 and its use will be provided. To promote understanding of the manner in which particular Dial instantiations (or multiple instantiations of a Dial) can be accessed in configuration database 814, a nomenclature for Dials within configuration database 814 will be described.

The nomenclature employed in a preferred embodiment of the present invention first requires a designer to uniquely name each Dial specified within any given design entity, i.e., the designer cannot declare any two Dials within the same design entity with the same Dial name. Observing this requirement prevents name collisions between Dials instantiated in the same design entity and promotes the arbitrary re-use of design entities in models of arbitrary size. This constraint is not too onerous in that a given design entity is usually created by a specific designer at a specific point in time, and maintaining unique Dial names within such a limited circumstance presents only a moderate burden.

Because it is desirable to be able to individually access particular instantiations of a Dial entity that may have multiple instantiations in a given simulation model (e.g., due to replication), use of a Dial name alone is not guaranteed to uniquely identify a particular Dial entity instantiation in a simulation model. Accordingly, in a preferred embodiment, the nomenclature for Dials leverages the unique instantiation identifier of the associated design entity required by the native HDL to disambiguate multiple instances of the same Dial entity with an "extended Dial identifier" for each Dial within the simulation model.

As an aside, it is recognized that some HDLs do not strictly enforce a requirement for unique entity names. For example, conventional VHDL entity naming constructs permit two design entities to share the same entity name, entity_name. However, VHDL requires that such identically named entities must be encapsulated within different VHDL libraries from which a valid VHDL model may be constructed. In such a circumstance, the entity_name is equivalent to the VHDL library name concatenated by a period (".") to the entity name as declared in the entity declaration. Thus, pre-pending a distinct VHDL library name to the entity name disambiguates entities sharing the same entity name. Most HDLs include a mechanism such as this for uniquely naming each design entity.

In a preferred embodiment, an extended Dial identifier that uniquely identifies a particular instantiation of a Dial entity includes three fields: an instantiation identifier field, a design entity name, and a Dial name. The extended Dial identifier may be expressed as a string in which adjacent fields are separated by a period (".") as follows:

<instantiation identifier>.<design entity name>.<Dial name>

In the extended Dial identifier, the design entity field contains the entity name of the design entity in which the Dial is instantiated, and the Dial name field contains the name declared for the Dial in the Dial configuration specification statement. As described above, the instantiation identifier specified in the instantiation identifier field is a sequence of instantiation identifiers, proceeding from the top-level entity of the simulation model to the direct ancestor design entity of the given Dial instance, with adjacent instance identifiers separated by periods ("."). Because no design entity can include two Dials of the same name, the instantiation identifier is unique for each and every instance of a Dial within the model.

The uniqueness of the names in the design entity name field is a primary distinguishing factor between Dials. By including the design entity name in the extended Dial identifier, each design entity is, in effect, given a unique namespace for the Dials associated with that design entity, i.e., Dials within a given design entity cannot have name collisions with Dials associated with other design entities. It should also be noted that it is possible to uniquely name each Dial by using the instantiation identifier field alone. That is, due to the uniqueness of instantiation identifiers, Dial identifiers formed by only the instantiation identifier field and the Dial name field will be necessarily unique. However, such a naming scheme does not associate Dials with a given design entity. In practice, it is desirable to associate Dials with the design entity in which they occur through the inclusion of the design entity field because all the Dials instantiations can then be centrally referenced without the need to ascertain the names of all the design entity instantiations containing the Dial.

As noted above, use of extended Dial identifiers permits the unique identification of a particular instantiation of a Dial and permits the re-use of design entities within any arbitrary model without risk of Dial name collisions. For example, referring again to FIG. 11B, Dial A entity instantiations 1140a0, 1140a1, 1140b0 and 1140b1 can be respectively uniquely identified by the following extended Dial identifiers:

FBC.X0.Y0.Y.A
FBC.X0.Y1.Y.A
FBC.X1.Y0.Y.A
FBC.X1.Y1.Y.A

Figure 12:
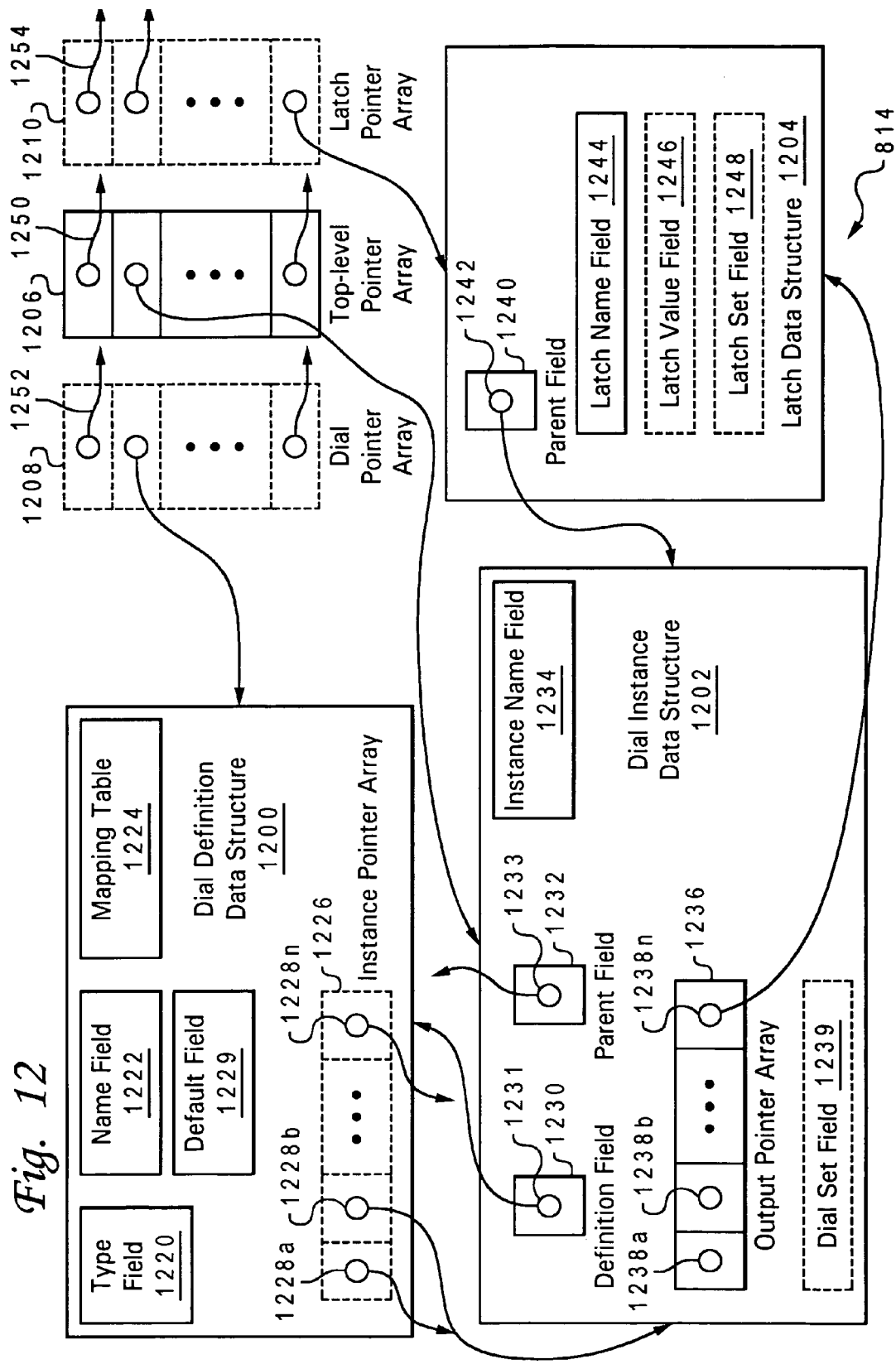
FIG. 12 depicts an exemplary embodiment of a simulation configuration database in accordance with the present invention.

With an understanding of a preferred nomenclature of Dials, reference is now made to FIG. 12, which is a diagrammatic representation of an exemplary format for a configuration database 814 created by configuration compiler 808. In this exemplary embodiment, configuration database 814 includes at least four different types of data structures: Dial definition data structures (DDDS) 1200, Dial instance data structures (DIDS) 1202, latch data structures 1204 and top-level pointer array 1206. Configuration database 814 may optionally include additional data structures, such as Dial pointer array 1208, latch pointer array 1210, instance pointer array 1226 and other data structures depicted in dashed-line illustration, which may alternatively be constructed in volatile memory when configuration database 814 is loaded, as described in the above-referenced application. Generating these additional data structures only after configuration database 814 is loaded into volatile memory advantageously promotes a more compact configuration database 814.

A respective Dial definition data structure (DDDS) 1200 is created within configuration database 814 for each Dial or Dial group in the digital system. Preferably, only one DDDS 1200 is created in configuration database 814 regardless of the number of instantiations of the Dial (or Dial group) in the digital system. As discussed below, information regarding particular instantiations of a Dial described in a DDDS 1200 is specified in separate DIDS 1202.

As shown, each DDDS 1200 includes a type field 1220 denoting whether DDDS 1200 describes a Dial or Dial group, and if a Dial, the type of Dial. In one embodiment, the value set for type field 1220 includes "G" for Dial group, "I" for integer Dial (IDial), "L" for latch Dial (LDial), and "C" for control Dial (CDial). DDDS 1200 further includes a name field 1222, which specifies the name of the Dial or Dial group described by DDDS 1200. This field preferably contains the design entity name of the Dial (or Dial group), followed by a period ("."), followed by the name of Dial (or Dial group) given in the configuration specification statement of the Dial (or Dial group). The contents of name field 1222 correspond to the design entity name and Dial name fields of the extended dial identifier for the Dial.

DDDS 1200 also includes a mapping table 1224 that contains the mapping from the input of the given Dial to its output(s), if required. For LDials and CDials, mapping table 1224 specifies relationships between input values and output values much like the configuration specification statements for these Dials. For Dial groups and IDials not having a split output, mapping table 1220 is an empty data structure and is not used. In the case of an IDial with a split output, mapping table 1220 specifies the width of the replicated integer field and the number of copies of that field. This information is utilized to map the integer input value to the various copies of the integer output fields. If the configuration specification statement for the Dial has a default specified, DDDS 1200 indicates the default value in default field 1229; if no default is specified, default field 1229 is NULL or is omitted.

Finally, DDDS 1200 may include an instance pointer array 1226 containing one or more instance pointers 1228a–1228n pointing to each instance of the Dial or Dial group defined by the DDDS 1200. Instance pointer array 1226 facilitates access to multiple instances of a particular Dial or Dial group.

As further illustrated in FIG. 12, configuration database 814 contains a DIDS 1202 corresponding to each Dial instantiation or Dial group instantiation within a digital design. Each DIDS 1202 contains a definition field 1230 containing a definition pointer 1231 pointing to the DDDS 1200 of the Dial for which the DIDS 1202 describes a particular instance. Definition pointer 1231 permits the Dial name, Dial type and mapping table of an instance to be easily accessed once a particular Dial instance is identified.

DIDS 1202 further includes a parent field 1232 that, in the case of an IDial, CDial or LDial, contains a parent pointer 1233 pointing to the DIDS 1202 of the higher-level Dial instance, if any, having an output logically connected to the input of the corresponding Dial instance. In the case of a Dial group, parent pointer 1233 points to the DIDS 1202 of the higher-level Dial group, if any, that hierarchically includes the present Dial group. If the Dial instance corresponding to a DIDS 1202 is a top-level Dial and does not belong to any Dial group, parent pointer 1233 in parent field 1232 is a NULL pointer. It should be noted that a Dial can be a top-level Dial, but still belong to a Dial group. In that case, parent pointer 1233 is not NULL, but rather points to the DIDS 1202 of the Dial group containing the top-level Dial.

Thus, parent fields 1232 of the DIDSs 1202 in configuration database 814 collectively describe the hierarchical arrangement of Dial entities and Dial groups that are instantiated in a digital design. As described below, the hierarchical information provided by parent fields 1232 advantageously enables a determination of the input value of any top-level Dial given the configuration values of the configuration latches ultimately controlled by that top-level Dial.

Instance name field 1234 of DIDS 1202 gives the fully qualified instance name of the Dial instance described by DIDS 1202 from the top-level design entity of the digital design. For Dial instances associated with the top-level entity, instance name field 1234 preferably contains a NULL string.

Finally, DIDS 1202 includes an output pointer array 1236 containing pointers 1238a–1238n pointing to data structures describing the lower-level instantiations associated with the corresponding Dial instance or Dial group instance. Specifically, in the case of IDials and LDials, output pointers 1238 refer to latch data structures 1204 corresponding to the configuration latches coupled to the Dial instance. For non-split IDials, the configuration latch entity referred to by output pointer 1238a receives the high order bit of the integer input value, and the configuration latch entity referred to by output pointer 1238n receives the low order bit of the integer input value. In the case of a CDial, output pointers 1238 refer to other DIDSs 1202 corresponding to the Dial instances controlled by the CDial. For Dial groups, output pointers 1238 refer to the top-level Dial instances or Dial group instances hierarchically included within the Dial group instance corresponding to DIDS 1202.

Configuration database 814 further includes a respective latch data structure 1204 for each configuration latch in simulation executable model 816 to which an output of an LDial or IDial is logically coupled. Each latch data structure 1204 includes a parent field 1240 containing a parent pointer 1242 to the DIDS 1200 of the LDial or IDial directly controlling the corresponding configuration latch. In addition, latch data structure 1204 includes a latch name field 1244 specifying the hierarchical latch name, relative to the entity containing the Dial instantiation identified by parent pointer 1242. For example, if an LDial X having an instantiation identifier a.b.c refers to a configuration latch having the hierarchical name "a.b.c.d.latch1", latch name field 1244 will contain the string "d.latch1". Prepending contents of an instance name field 1234 of the DIDS 1202 identified by parent pointer 1242 to the contents of a latch name field 1244 thus provides the fully qualified name of any instance of a given configuration latch configurable utilizing configuration database 814.

Still referring to FIG. 12, as noted above, configuration database 814 includes top-level pointer array 1206, and optionally, Dial pointer array 1208 and latch pointer array 1210. Top-level pointer array 1206 contains top-level pointers 1250 that, for each top-level Dial and each top-level Dial group, points to an associated DIDS 1202 for the top-level entity instance. Dial pointer array 1208 includes Dial pointers 1252 pointing to each DDDS 1200 in configuration database 814 to permit indirect access to particular Dial instances through Dial and/or entity names. Finally, latch pointer array 1210 includes latch pointers 1254 pointing to each latch data structure 1204 within configuration database 814 to permit easy access to all configuration latches.

When employing Dials and Dial Groups to simplify the configuration or control of a data processing system as described herein and in the above-referenced patent application, there are some cases in which the implementation of the underlying latches does not correspond precisely to the "logical" values to be placed within the latches. For example, linear feedback shift registers (LFSRs) are often utilized as counters in many systems. LFSRs count in a pseudo-random pattern that must be mapped manually to obtain a corresponding integer count value. Another case in which the "logical" or "natural" value of a quantity in a digital system may not match the corresponding "implementation" value is when a register stores an unaligned quantity, for example, address bits 16 through 56 of a 64-bit address.

In order to permit these types of values to be read and set utilizing the "logical" or "natural" values rather than the less intuitive "implementation" values, the present invention provides a mechanism to read and set Dials utilizing the "logical" or "natural" values rather than the "implementation" values. In this manner, the designer is insulated from the specific implementation of the underlying latches and is able to focus his or her attention on the logical correctness of the design itself.

With reference now to FIG. 13A, there is illustrated a representation of an exemplary mapping function 1300 that is invoked to map between a "logical" or "natural" value and an "implementation" latch value in accordance with a preferred embodiment of the present invention. Exemplary mapping function 1300 is a compiled, dynamically loadable module, which has a name 1302 (in this example, "mapX") by which mapping function 1300 is identified in Dial declaration statements. Each mapping function is preferably implemented with a respective dynamically loadable module, and the mapping functions needed for a particular simulation are loaded dynamically at runtime utilizing the mapping function names specified in the configuration specification language, as discussed further below.

Mapping function 1300 includes a set of routines written in C, C++ or some other suitable a high level language, namely, a read routine 1304 utilized to translate values during a read of a Dial having mapX as an associated mapping function, and a set routine 1308 utilized to translate values in conjunction with setting a Dial having mapX as an associated mapping function. Read routine 1304 may implement any desired value transformation, including a mathematical or logical transformation, shifting, padding or truncating bits, generation of pseudo-random values, mapping between enumerated values, etc. Set routine 1308 preferably implements the reverse transformation of read routine 1304.

As illustrated, read routine 1304 has a read entry point 1306. The name of the read entry point 1306 is "mapX_read (in, out)," where "mapX" is the name of mapping function 1300 and "in" and "out" are input and output parameters consisting of bits. When a Dial associated with mapping function mapX is read, read routine 1304 takes as input a bit field in the "in" parameter that corresponds to the values for the latches controlled by Dial. The routine returns through parameter "out" the transformed bit field.

Set entry point 1310 likewise has the name "mapX_set(in, out)," where "mapX" is again the name of mapping function 1300, parameter "in" corresponds to the input value, and parameter "out" corresponds to the transformed output value. This transformed output value is utilized to update the value of latches when the Dial is set.

As shown in FIG. 13B, the "menu" of mapping functions that may legally be associated with Dials in a design is preferably collected in a file, such as mapping control file 1320. In the exemplary embodiment shown in FIG. 13B, mapping control file 1320 includes a respective entry for each mapping function that has been defined. Each such entry includes five fields: a mapping function name field 1322 that specifies the name of the mapping function, read input and output width fields 1324 and 1326 that respectively specify that bit widths of the "in" and "out" parameters of the read entry point of the mapping function, and set input and output width fields 1328 and 1330 that respectively specify that bit widths of the "in" and "out" parameters of the set entry point of the mapping function.

In order to associate a mapping function with a particular Dial, the user specifies the name of the mapping function to be applied to the Dial in a configuration specification language statement within an HDL file 800 or configuration specification file 802. For example, expanding upon the syntax introduced above, a user may employ the following syntax:

--## IDial(1fsr_12) $_{my}$_idial(signal(0 to 11));

In this configuration specification language statement, the qualifier "1fsr_12" in parenthesis appended to the Dial declaration statement specifies the name of the mapping function to be applied to instances of this IDial. Because mapping functions are preferably a property of the Dial definition and apply to all instances of the Dial, the association of the Dial and the mapping function is recorded in the DDDS 1200, as described below with respect to FIG. 15.

In accordance with one embodiment of the present invention, mapping functions can be associated with any of three Dial types described above (i.e., IDials, LDials, and CDials) utilizing the syntax as described above, as well as additional Dial types described in the above-referenced patent application. However, mapping functions find their most advantageous usage in association with IDials and LDials, and the implementation of mapping functions within such dials will now be described.

For IDials or LDials, it is possible to implement the mapping function "above" or "below" the mapping table 1224 defined for the Dial. If the mapping function is implemented "above" mapping table 1224:

(1) For Dial set operations, the input Dial value is processed by the mapping function before the mapping indicating by mapping table 1224 is performed, and
(2) For Dial read operations, the mapping function processes the output of mapping table 1224.

The mapping functions would thus receive for an Ldial, an enumerated value as input and return an enumerated value as an output parameter. Likewise, for an IDial, the mapping function would receive a bit string value as input and return a bit string value as an output parameter.

As noted above, another alternative for LDials and IDials is to implement the mapping function "below" mapping table 1224. In this case:

(1) For Dial set operations, the bit pattern produced by mapping table 1224 is further processed by the mapping function before being applied to the latches driven by the Dial, and
(2) For Dial read operations, the bit pattern within the latches controlled by the dial are first processed by the read mapping function before being passed to mapping table 1224 for further processing.

The mapping functions for both LDials and IDials would thus receive as input a bit string and produce as output a bit string. In the case of a mapping function associated with an LDial, the widths of the input and output parameters for both the set and read entry points of the mapping function are equal and equal to the number of latches controlled by the LDial. In the case of an IDial, the read input bit width and the set output bit width for the mapping function equal the number of latches controlled by the IDial or replicated portion of the IDial with split output. However, the set input bit width of the set entry point and the read output bit width of the read entry point of the mapping function, while generally equal in width, need not be equal, and furthermore need not equal the number of latches controlled by the Dial.

Mapping functions may similarly be implemented for CDials. If the mapping function for a CDial is implemented below mapping table 1224, the mapping function would receive a set of enumerated values as input and output an altered set of enumerated values for both set and read operations. Because, in general, creating such mapping functions would be at least as complex and similar in nature to defining a new mapping table 1224, it is presently preferred to implement mapping functions for CDials, if at all, above mapping table 1224.

If a mapping function for a CDial is defined above mapping table 1224, the mapping function receives as input a single enumerated value and returns a single enumerated value. Such mapping functions do not provide significant additional function that cannot be similarly achieved by altering mapping table 1224 directly. Therefore, while it is possible to apply the teachings of the present invention to CDials, it is generally preferred to utilize mapping functions in conjunction with LDials and, in particular, IDials.

Further, to promote uniformity in the parameter types of mapping functions, in what follows, mapping functions for LDials and IDials will be demonstrated as being "below" mapping table 1224. Those skilled in the art will appreciate the alterations necessary to practice the present invention for CDials and LDials or IDials with mapping functions placed above mapping table 1224.

Figure 14:
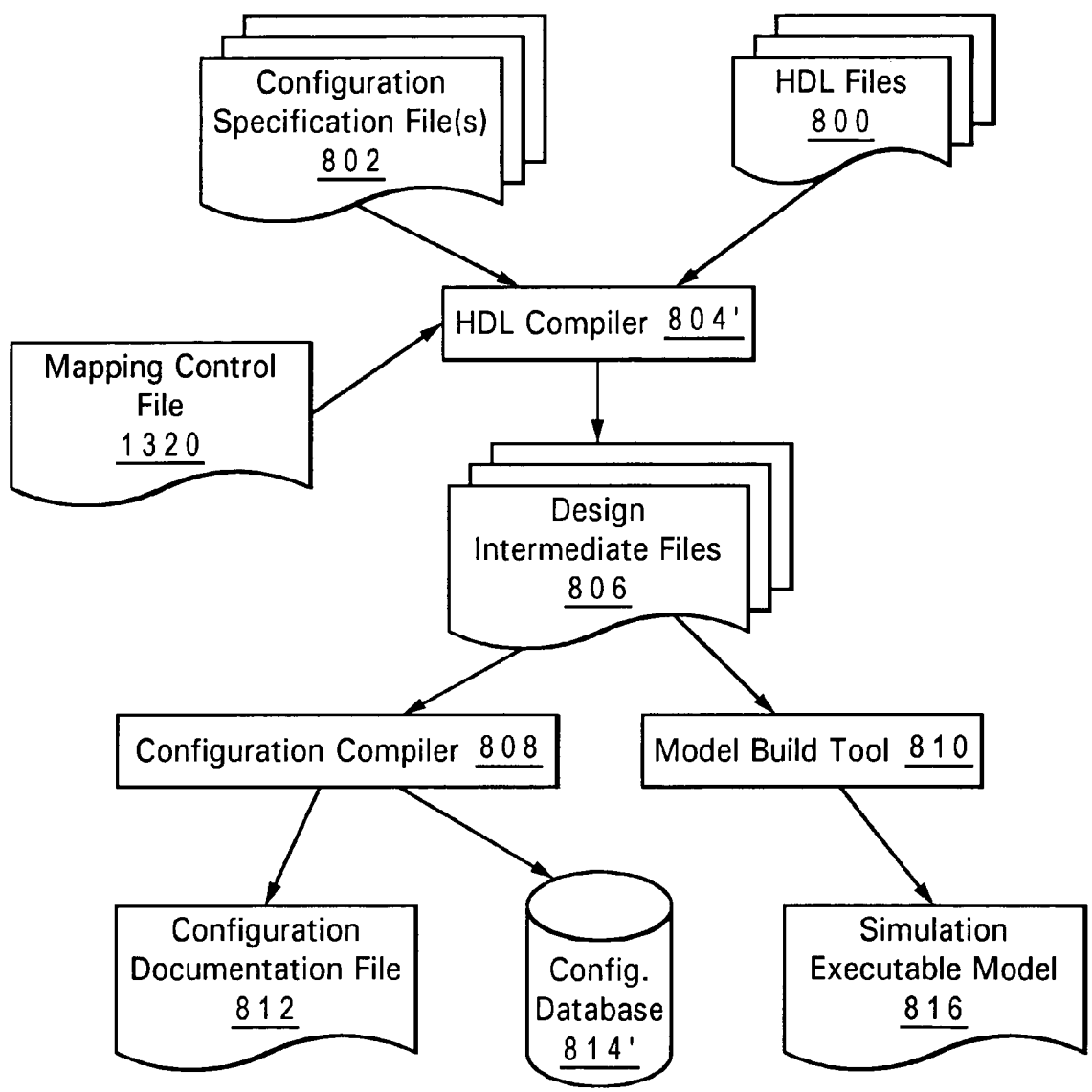
FIG. 14 is a high level flow diagram of a model build process utilized to produce a simulation executable model and associated simulation configuration database in accordance with an embodiment of the present invention supporting mapping functions.

Referring now to FIG. 14, there is illustrated there is depicted a high level flow diagram of a model build process in which mapping functions are dynamically bound to Dial definitions in accordance with a preferred embodiment of the present invention. As indicated by like reference numerals, the process shown in FIG. 14 is substantially similar to that described above with respect to FIG. 8, with the differences noted below.

As indicated by prime notation, HDL compiler 804' is substantially similar to HDL compiler 804 of FIG. 8, but in accordance with the present invention has been modified to process configuration specification language statements within configuration specification file 802 and/or HDL files 800 that specify an association between a Dial and a mapping function. When HDL compiler 804' processes a configuration specification language statement (e.g., a Dial declaration) indicating an association between a mapping function and a Dial, HDL compiler 804' examines mapping control file 1320 to ensure the mapping function exists and has the compatible bit widths for its input and output parameters. For example, for an IDial, HDL compiler 804' verifies by reference to output width field 1326 of the relevant entry in mapping control file 1320 that the output bit width of the mapping function matches the number of output latches of the IDial. Similarly, for an LDial, HDL compiler 804 verifies that the input and output bit widths indicated in input and output width fields 1324 and 1326 of the relevant entry of mapping control file 1320 match the mapping table 1224 bit size and the number of controlled latches for the LDial. If a mapping function declared in a configuration specification language statement does not exist or if any bit width is incorrect, the HDL compiler 804' terminates with an error.

The remainder of the model build process shown in FIG. 14 is identical to that described above except for the addition of data structures to configuration database 814' by configuration compiler 808 to support mapping functions. These data structures are described below with respect to FIG. 15.

Figure 15:
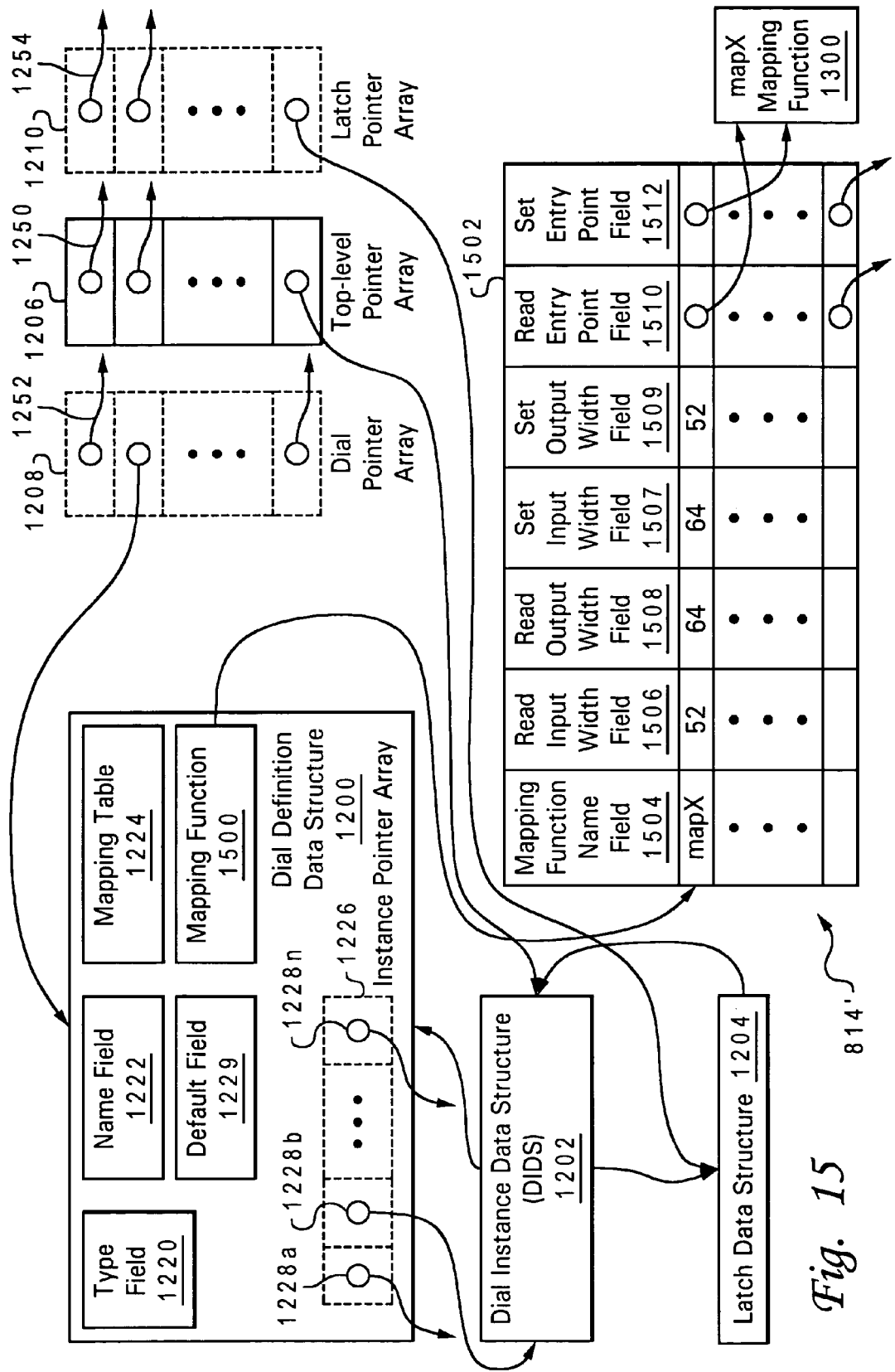
FIG. 15 illustrates an exemplary embodiment of a simulation configuration database in accordance with an embodiment of the present invention that supports the association of mapping functions with Dials.

With reference now to FIG. 15, there is illustrated a high level logical representation of a configuration database 814' in accordance with one embodiment of the present invention. As again indicated by prime notation, configuration database 814' is substantially similar to configuration database 814 of FIG. 8, with the exception of the addition of data structures to support mapping functions in accordance with the present invention.

In particular, configuration database 814' is augmented to include a mapping function table 1502. Mapping function table 1502 preferably includes a respective entry for each mapping function actually associated with a Dial by a configuration specification language statement within configuration specification files 802 or HDL files 800. Thus, mapping control file 1320 may list 100 different mapping functions that are available, but if the configuration specification language code compiled during the model build process calls out only five mapping functions, mapping function table 1502 will contain only five entries. As depicted, each entry in mapping function table 1502 preferably includes seven fields:

(1) a mapping function name field 1504 indicating the name of the mapping function (e.g., "mapX"), (2) a read input width field 1506 indicating the bit width of the input parameter (e.g., 52 bits) of the read entry point, (3) a read output width field 1508 indicating the bit width of the output parameter (e.g., 64 bits) of the read entry point, (4) a set input width field 1507 indicating the bit width of the input parameter (e.g., 64 bits) of the read entry point, (5) a set output width field 1509 indicating the bit width of the output parameter (e.g., 52 bits) of the read entry point,(6) a read entry point field 1510 containing a pointer pointing to the read entry point 1306 of the mapping function 1300, and (7) a set entry point field 1512 containing a pointer pointing to the set entry point 1310 of the mapping function 1300.

Width fields 1506–1509 are used to manage the parameters when Dials are read and set (reading and setting Dials is discussed further below with reference to FIG. 19A through FIG. 21).

At least the DDDSs 1200 of Dials with which a mapping function is associated are also augmented to include a mapping function pointer 1500. In the DDDSs 1200 of such Dials, mapping function pointer 1500 points to an entry of mapping function table 1502 that specifies the name of the associated mapping function.

Once a configuration database 814 or 814' is constructed, the contents of configuration database 814 or 814' can be loaded into volatile memory, such as system memory 18 of data processing system 8 of FIG. 1, in order to appropriately configure a simulation model for simulation. In general, data structures 1200, 1202, 1204 and 1206 can be loaded directly into system memory 18, and may optionally be augmented with additional fields, as described in the above-referenced application. However, as noted above, if it is desirable for the non-volatile image of configuration database 814 to be compact, it is helpful to generate additional data structures, such as Dial pointer array 1208, latch pointer array 1210 and instance pointer arrays 1226, in the volatile configuration database image in system memory 18.

Figure 16:
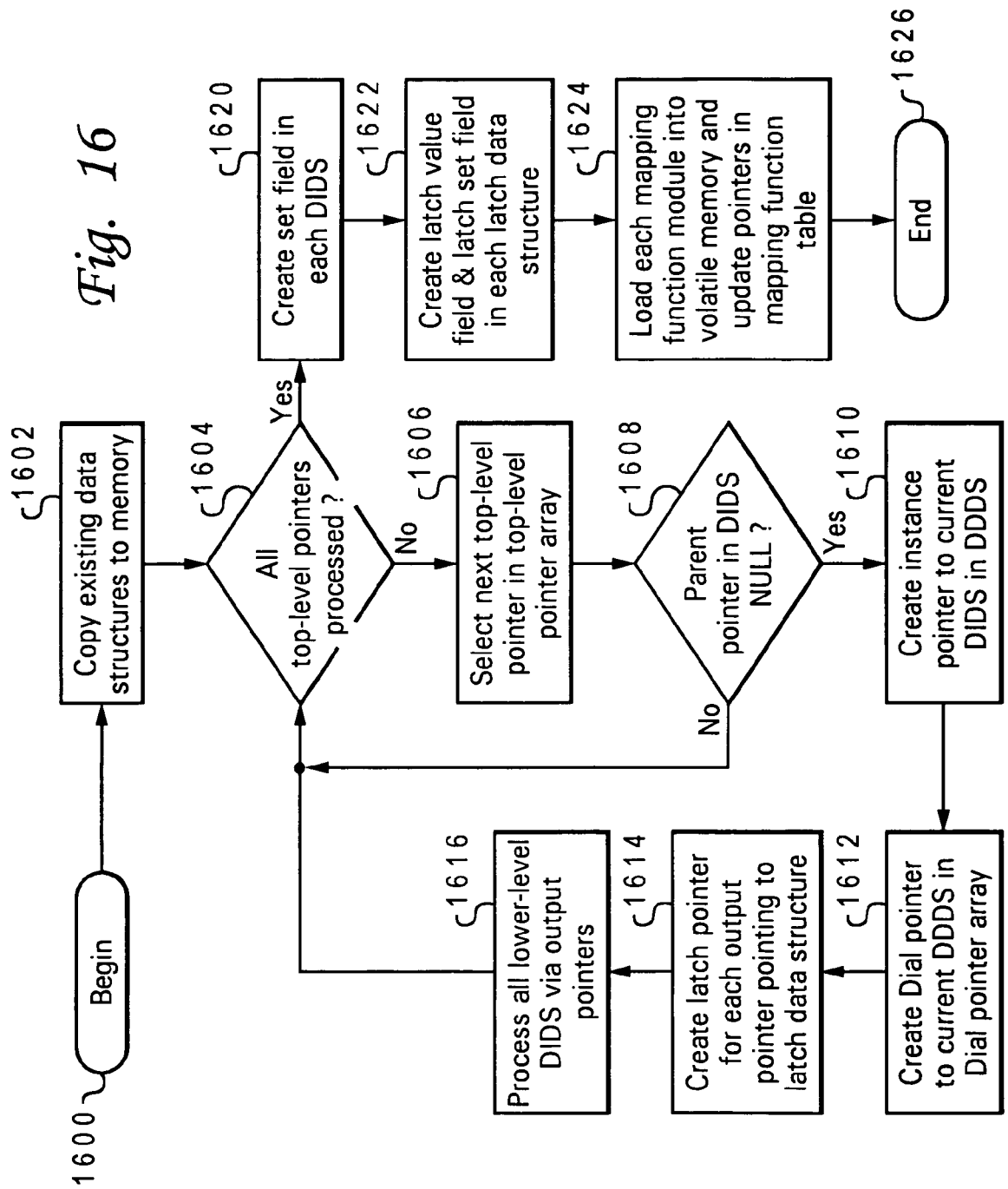
FIG. 16 is a high level logical flowchart of a illustrative method by which a configuration database is expanded within volatile memory of a data processing system in accordance with the present invention.

Referring now to FIG. 16, there is depicted a high level logical flowchart of a method by which configuration database 814 is expanded within volatile memory of a data processing system, such as system memory 18 of data processing system 8. Because FIG. 16 depicts logical steps rather than operational steps, it should be understood that many of the steps illustrated in FIG. 16 may be performed concurrently or in a different order than that shown.

As illustrated, the process begins at block 1600 and then proceeds to block 1602, which illustrates data processing system 6 copying the existing data structures within configuration database 814' from non-volatile storage (e.g., disk storage or flash memory) into volatile system memory 18. Next, at block 1604, a determination is made whether all top-level pointers 1250 within top-level pointer array 1206 of configuration database 814' have been processed. If so, the process passes to block 1620, which is discussed below. If not, the process proceeds to block 1606, which illustrates selection from top-level array 1206 of the next top-level pointer 1250 to be processed.

A determination is then made at block 1608 of whether or not parent pointer 1233 within the DIDS 1202 identified by the selected top-level pointer 1250 is a NULL pointer. If not, which indicates that the DIDS 1202 describes a top-level Dial belonging to a Dial group, the process returns to block 1604, indicating that the top-level Dial and its associated lower-level Dials will be processed when the Dial group to which it belongs is processed.

In response to a determination at block 1608 that the parent pointer 1233 is a NULL pointer, data processing system 8 creates an instance pointer 1228 to the DIDS 1202 in the instance array 1226 of the DDDS 1200 to which definition pointer 1231 in definition field 1230 of DIDS 1202 points, as depicted at block 1610. Next, at block 1612, data processing system 8 creates a Dial pointer 1252 to the DDDS 1200 of the top-level Dial within Dial pointer array 1208, if the Dial pointer 1252 is not redundant. In addition, as shown at block 1614, data processing system 8 creates a latch pointer 1254 within latch pointer array 1210 pointing to each latch data structure 1204, if any, referenced by an output pointer 1238 of the DIDS 1202 of the top-level Dial. As shown at block 1616, each branch at each lower level of the Dial tree, if any, headed by the top-level Dial referenced by the selected top-level pointer 1250 is then processed similarly by performing the functions illustrated at block 1610–1616 until a latch data structure 1204 terminating that branch is found and processed. The process then returns to block 1604, representing the processing of each top-level pointer 1250 within top-level pointer array 1206.

In response to a determination at block 1604 that all top-level pointers 1250 have been processed, the process illustrated in FIG. 16 proceeds to block 1620. Block 1620 illustrates the creation of a Dial set field 1239 in each DIDS 1620 in the configuration database. Dial set field 1239 is a Boolean-valued field that in initialized to FALSE and is updated to TRUE when the associated Dial instance is explicitly set. In addition, as depicted at block 1622, data processing system 8 creates a latch value field 1246 and latch set field 1248 in each latch data structure 1204 to respectively indicate the current set value of the associated configuration latch and to indicate whether the configuration latch has been explicitly set. Although the creation of the three fields indicated at blocks 1620–1622 is illustrated separately from the processing depicted at blocks 1604–1616 for purposes of clarity, it will be appreciated that it is more efficient to create Dial set field 1239 as each DIDS 1202 is processed and to create latch value and latch set fields 1246, 1248 as the latch data structures 1204 at the bottom of each Dial tree are reached.

Following block 1622, the process proceeds to block 1624, which illustrates the loading into system memory 18 of each of the mapping functions listed within mapping function table 1502 utilizing the mapping function names specified within mapping function name fields 1504. Read and set entry pointer fields 1510 and 1512 within mapping function table 1502 are then updated to reflect the locations of the corresponding mapping function entry points within system memory 18. The process of loading the configuration database into volatile memory thereafter terminates at block 1626.

Figure 17:
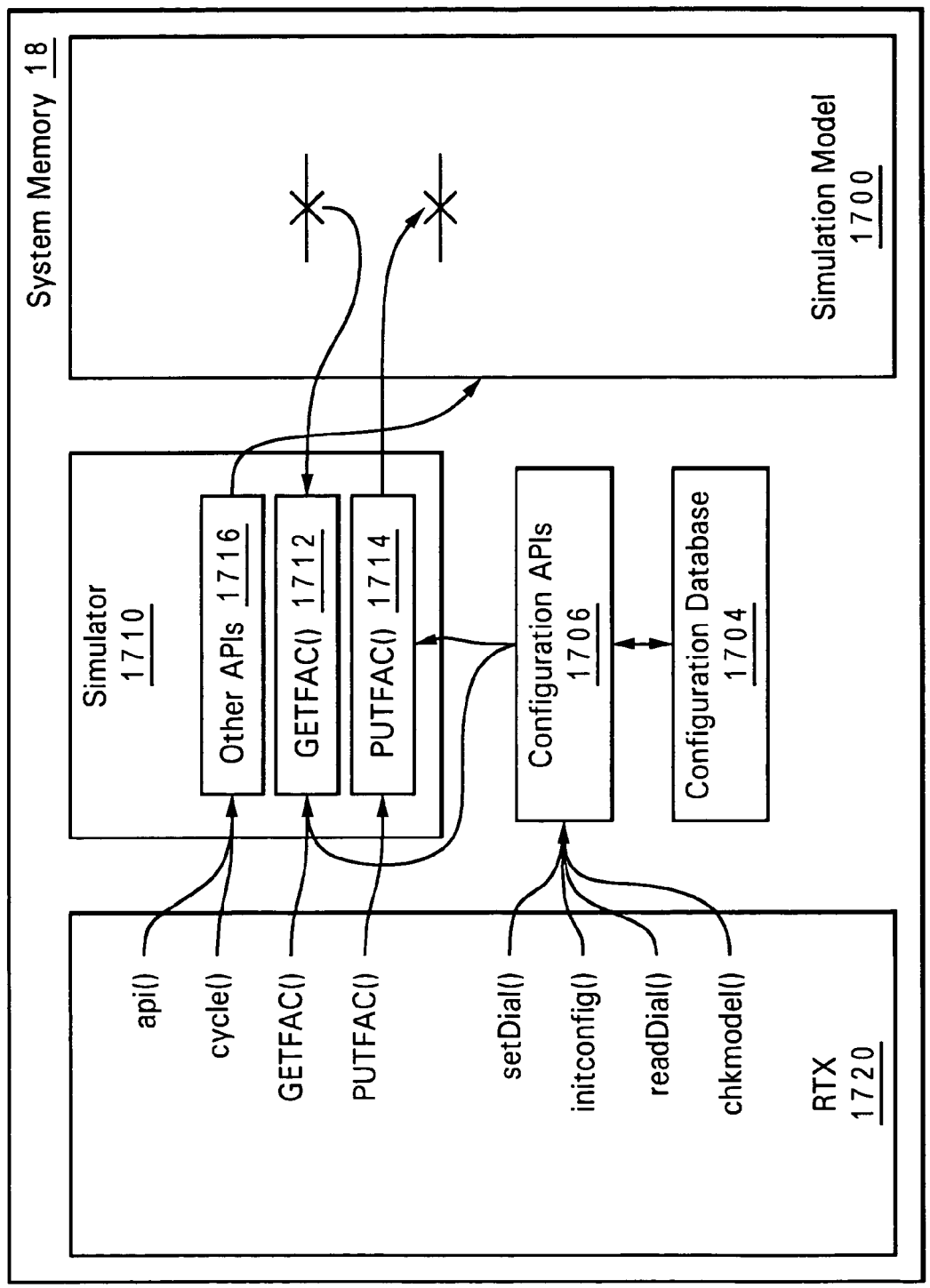
FIG. 17 is a block diagram depicting the contents of volatile system memory during a simulation run of a simulation model in accordance with the present invention.

With the configuration database loaded into volatile memory, a simulation model can be configured and utilized to simulate a digital design through the execution of simulation software. With reference to FIG. 17, there is illustrated a block diagram depicting the contents of system memory 18 (FIG. 1) during a simulation run of a simulation model. As shown, system memory 18 includes a simulation model 1700, which is a logical representation of the digital design to be simulated, as well as software including configuration APIs 1706, a simulator 1710 and an RTX (Run Time executive) 1720.

Simulator 1710 loads simulation models, such as simulation model 1700, into system memory 18. During a simulation run, simulator 1710 resets, clocks and evaluates simulation model 1700 via various APIs 1716. In addition, simulator 1710 reads values in simulation model 1700 utilizing GETFAC API 1712 and writes values to simulation model 1700 utilizing PUTFAC API 1717. Although simulator 1710 is implemented in FIG. 17 entirely in software, it will be appreciated in what follows that the simulator can alternatively be implemented at least partially in hardware.

Configuration APIs 1706 comprise software, typically written in a high level language such as C or C++, that support the configuration of simulation model 1700. These APIs, which are dynamically loaded by simulator 1710 as needed, include a first API that loads configuration model 814' from non-volatile storage and expands it in the manner described above with reference to FIG. 16 to provide a memory image of configuration database 1704. Configuration APIs 1706 further include additional APIs to access and manipulate configuration database 1704, as described in detail below.

RTX 1720 controls simulation of simulation models, such as simulation model 1700. For example, RTX 1720 loads test cases to apply to simulation model 1700. In addition, RTX 1720 delivers a set of API calls to configuration APIs 1706 and the APIs provided by simulator 1710 to initialize, configure, and simulate operation of simulation model 1700. During and after simulation, RTX 1720 also calls configuration APIs 1706 and the APIs provided by simulator 1710 to check for the correctness of simulation model 1700 by accessing various Dials, configuration latches, counters and other entities within simulation model 1700.

RTX 1720 has two modes by which it accesses Dials instantiated within simulation model 1700: interactive mode and batch mode. In interactive mode, RTX 1720 calls a first set of APIs to read from or write to one or more instances of a particular Dial within configuration database 1704. The latch value(s) obtained by reference to configuration database 1704 take immediate effect in simulation model 1700. In batch mode, RTX 1720 calls a different second set of APIs to read or write instantiations of multiple Dials in configuration database 1704 and then make any changes to simulation model 1700 at the same time.

In either interactive or batch mode, RTX 1720 must employ some syntax in its API calls to specify which Dial or Dial group instances within simulation model 1700 are to be accessed. Although a number of different syntaxes can be employed, including conventional regular expressions employing wildcarding, in an illustrative embodiment the syntax utilized to specify Dial or Dial group instances in API calls is similar to the compact expression hereinbefore described. A key difference between the compact expressions discussed above and the syntax utilized to specify Dial or Dial group instances in the RTX API calls is that, in the illustrative embodiment, Dial and Dial group instances are specified in the RTX API calls by reference to the top-level design entity of simulation model 1700 rather than relative to the design entity in which the Dial or Dial group is specified.

In the illustrative embodiment, each RTX API call targeting one or more Dial or Dial group instances in simulation model 1700 specifies the Dial or Dial group instances utilizing two parameters: an instance qualifier and a dial-name qualifier. To refer to only a single Dial or Dial group instantiation, the instance qualifier takes the form "a.b.c.d", which is the hierarchical instantiation identifier of the design entity in which the single Dial or Dial group instantiation occurs. To refer to multiple Dial or Dial group instances, the instance qualifier takes the form "a.b.c.[X]", which identifies all instantiations of entity X within the scope of entity instance a.b.c. In the degenerate form, the instance qualifier may simply be "[X]", which identifies all instantiations of entity X anywhere within simulation model 1700.

The dialname qualifier preferably takes the form "Entity.dialname", where "Entity" is the design entity in which the Dial or Dial group is instantiated and "dialname" is the name assigned to the Dial or Dial group in its configuration specification statement. If bracketed syntax is employed to specify the instance qualifier, the "Entity" field can be dropped from the dialname qualifier since it will match the bracketed entity name.

Figure 18:
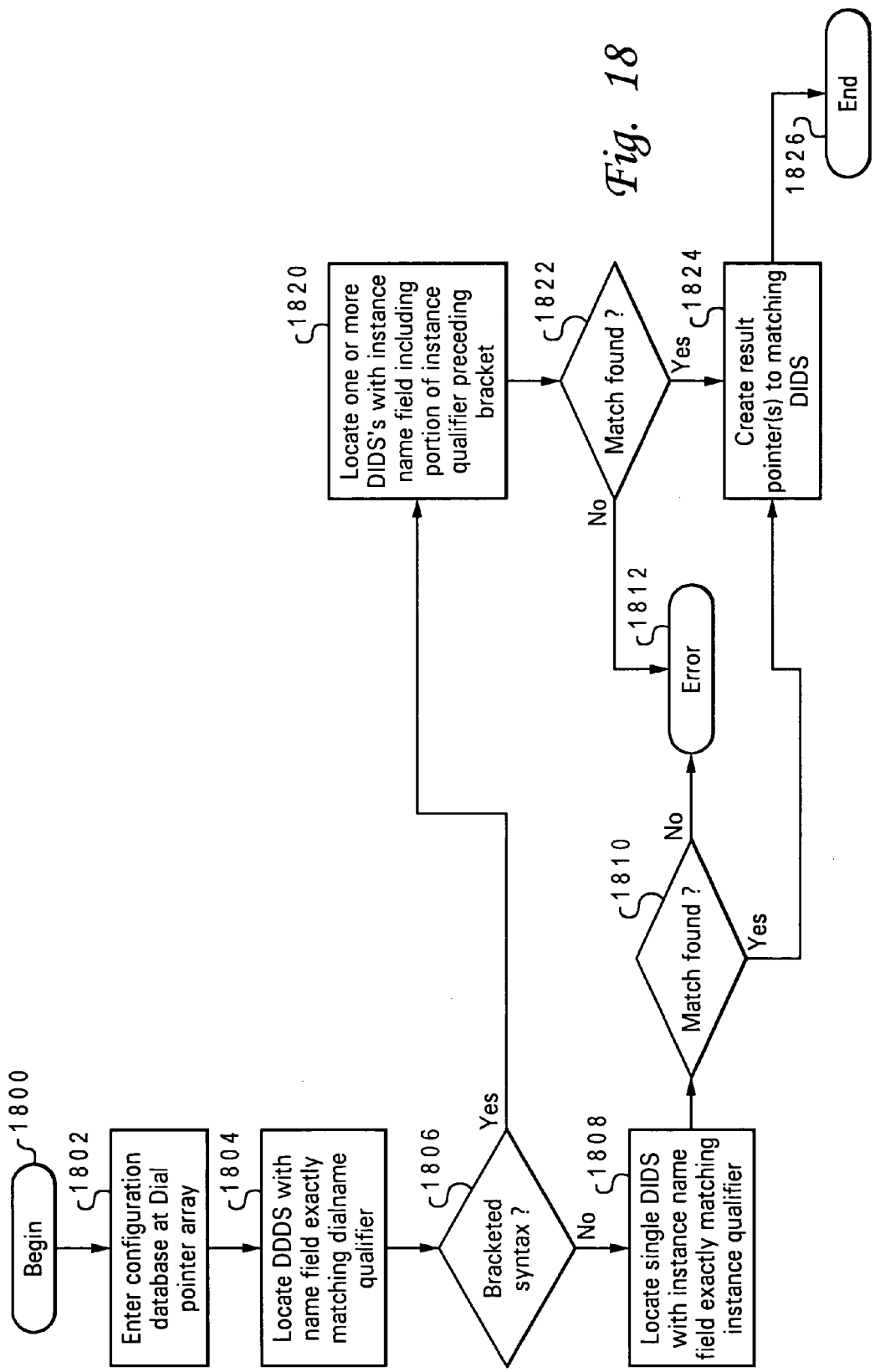
FIG. 18 is a high level logical flowchart of an exemplary method of locating one or more Dial instance data structure (DIDS) in a configuration database that are identified by a instance qualifier and dialname qualifier supplied in an API call.

Referring now to FIG. 18 there is depicted a high level logical flowchart of an exemplary process by which configuration APIs 1706 locate particular Dial or Dial group instances in configuration database 1704 based upon an instance qualifier and dialname qualifier pair in accordance with the present invention. As shown, the process begins at block 1800 in response to receipt by a configuration API 1706 of an API call from RTX 1720 containing an instance qualifier and a dialname qualifier as discussed above. In response to the API call, the configuration API 1706 enters configuration database 1704 at Dial pointer array 1208, as depicted at block 1802, and utilizes Dial pointers 1252 to locate a DDDS 1200 having a name field 1222 that exactly matches the specified dialname qualifier, as illustrated at block 1804.

Next, at block 1806, the configuration API 1706 determines whether the instance qualifier employs bracketed syntax, as described above. If so, the process passes to block 1820, which is described below. However, if the instance qualifier does not employ bracketed syntax, the configuration API 1706 follows the instance pointers 1228 of the matching DDDS 1200 to locate the single DIDS 1202 having an instance name field 1234 that exactly matches the specified instance qualifier. As indicated at blocks 1510–1512, if no match is found, the process terminates with an error. However, if a matching DIDS 1202 is located, a temporary "result" pointer identifying the single matching DIDS 1202 is created at block 1824. The process thereafter terminates at block 1826.

Returning to block 1580, if bracketed syntax is employed, the configuration API 1706 utilizes instance pointers 1228 of the matching DDDS 1200 to locate one or more DIDSs 1202 of Dial or Dial group instances within the scope specified by the prefix portion of the instance identifier preceding the bracketing. That is, a DIDS 1202 is said to "match" if the instance name field 1234 of the DIDS 1202 contains the prefix portion of the instance qualifier. Again, if no match is found, the process passes through block 1822 and terminates with an error at block 1812. However, if one or more DIDSs 1202 "match" the instance qualifier, temporary result pointers identifying the matching DIDSs 1202 are constructed at block 1824. The process shown in FIG. 18 thereafter terminates at block 1826.

Figure 19A:
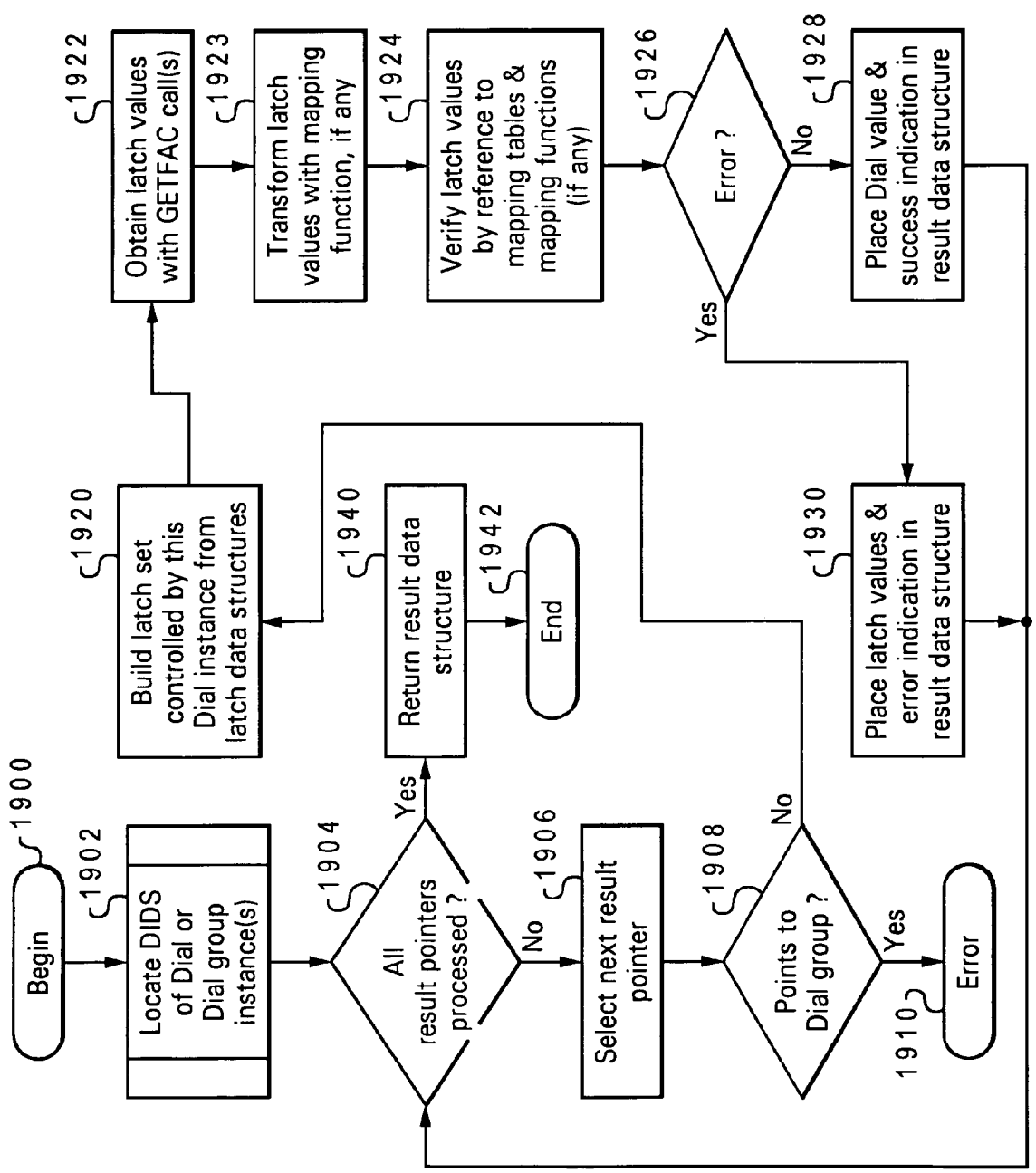
FIG. 19A is a high level logical flowchart of an illustrative method of reading a Dial instance in an interactive mode during simulation of a digital design in accordance with the present invention.

With reference now to FIG. 19A, there is illustrated a high level logical flowchart of an exemplary process by which RTX 1720 reads a value of one or more Dial instances in interactive mode, in accordance with the present invention. As shown, the process begins at block 1900 in response to receipt by a configuration API 1706 of a read_Dial( ) API call by RTX 1720. As indicated at block 1902, a configuration API 1706 responds to the read_Dial( ) API call by locating within configuration database 1704 one or more DIDSs 1202 of Dial instances responsive to the API call utilizing the process described above with reference to FIG. 15.

The process then enters a loop at block 1904 in which each of the temporary result pointers generated by the process of FIG. 18 is processed. If all of the result pointers returned by the process of FIG. 18 have been processed, the process passes to block 1940, which is described below. If not, the process proceeds from block 1906 to block 1908, which illustrates the configuration API 1706 selecting a next result pointer to be processed. Next, at block 1908, the configuration API 1706 determines by reference to type field 1220 of the DDDS 1200 associated with the DIDS 1202 identified by the current result pointer whether the DIDS 1202 corresponds to a Dial group. If so, the process illustrated in FIG. 19A terminates with an error condition at block 1910 indicating that RTX 1720 has utilized the wrong API call to read a Dial instance.

In response to a determination at block 1908 that the DIDS 1202 identified by the current result pointer does not correspond to a Dial group instance, the process proceeds to block 1920. Block 1920 depicts configuration API 1706 utilizing output pointers 1238 of the DIDS 1202 (and those of any lower-level DIDS 1202 in the Dial tree) to build a data set containing the latch names from the latch name fields 1244 of latch data structures 1204 corresponding to all configuration latches ultimately controlled by the Dial instance specified in the API call. Next, as depicted at block 1922, the configuration API 1706 makes one or more API calls to GETFAC( ) API 1712 of simulator 1710 to obtain from simulation model 1700 the latch value(s) of all of the configuration latches listed in the data set constructed at block 1920.

Following block 1922, the process proceeds to block 1923, which illustrates configuration API 1706 checking the DDDS 1200 of the Dial instance specified in the API call for the presence of a non-NULL mapping function pointer 1500. If DDDS 1200 contains a NULL mapping function pointer, no mapping function is called, and the process simply passes to block 1924. If, however, DDDS 1200 contains a non-NULL mapping function pointer 1500, configuration API 1706 invokes the mapping function within mapping function table 1502 indicated by mapping function pointer 1500 to transform the latch value(s) obtained at block 1922. As discussed above, the mapping function is invoked by calling the read entry point 1306 utilizing the latch values as the "in" parameter. The mapping function transforms the latch value(s) and returns transformed values as the "out" parameter.

Configuration API 1706 then verifies the possibly transformed latch values by reference to configuration database 1704, as shown at block 1924. In order to verify the latch values, configuration API 1706 utilizes mapping tables 1224 and mapping functions (if any) to propagate the latch values up the Dial tree from the corresponding latch data structures through intermediate DIDSs 1202, if any, until an input value for the requested Dial instance is determined. If at any point in this verification process, a Dial instance's output value generated by the verification process does not correspond to one of the legal values enumerated in its mapping table 1224, an error is detected at block 1926. Accordingly, the latch values read from simulation model 1700 and an error indication are placed in a result data structure, as illustrated at block 1930. If no error is detected, the Dial input value generated by the verification process and a success indication are placed in the result data structure, as shown at block 1928.

As indicated by the process returning to block 1904, the above-described process is repeated for each temporary result pointer returned by the process of FIG. 18. Once all result pointers have been processed, the process passes from block 1904 to blocks 1940–1942, which illustrate the configuration API 1706 returning the result data structure to RTX 1720 and then terminating.

RTX 1720 reads Dial instances in interactive mode utilizing the method of FIG. 19A, for example, to initialize checkers that monitor portions of simulation model 1700 during simulation runs. The Dial settings of interest include not only those of top-level Dial instances, but also those of lower-level Dial instances affiliated with the portions of the simulation model 1700 monitored by the checkers.

Figure 19B:
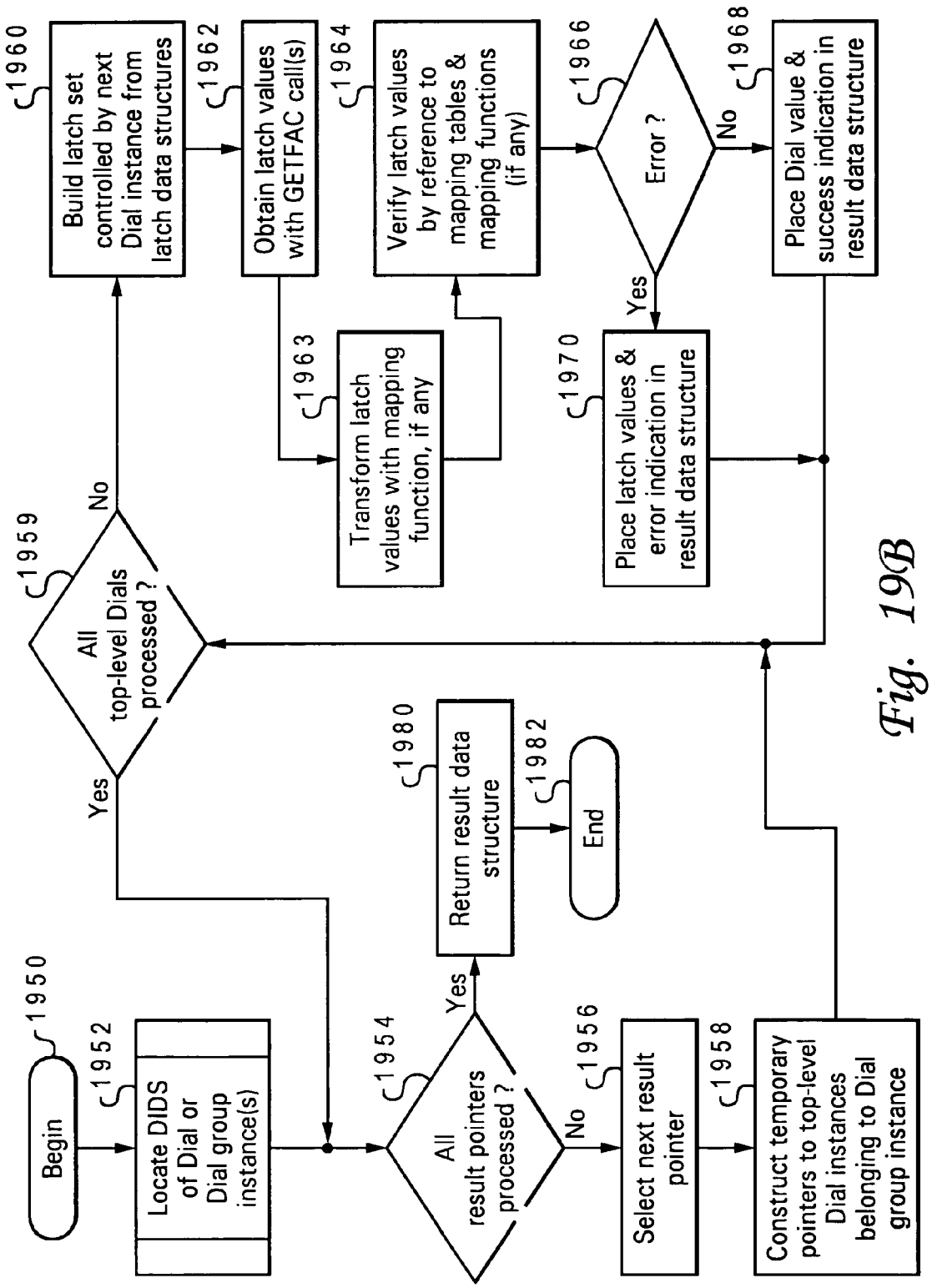
FIG. 19B is a high level logical flowchart of an exemplary method of reading a Dial group instance in an interactive mode during simulation of a digital design in accordance with the present invention.

Referring now to FIG. 19B, there is illustrated a high level logical flowchart of an exemplary process by which RTX 1720 reads a value of one or more Dial group instances in interactive mode, in accordance with the present invention. As can be seen by comparison of FIGS. 19A and 19B, the process of reading a Dial group instance is similar to the process of reading a Dial instance, but returns the value of one or more top-level Dial instances of possibly different Dial entities rather than one or more instances of the same Dial entity.

As shown, the process shown in FIG. 19B begins at block 1950 in response to receipt by a configuration API 1706 of a read_Dial_group( ) API call by RTX 1720. As indicated at block 1952, a configuration API 1706 responds to the read_Dial_group( ) API call by locating within configuration database 1704 one or more DIDSs 1202 of Dial group instances responsive to the API call utilizing the process described above with reference to FIG. 18.

The process then enters a loop at block 1954 in which each of the temporary result pointers generated by the process of FIG. 18 is processed. If all of the result pointers returned by the process of FIG. 18 have been processed, the process passes to block 1980, which is described below. If not, the process proceeds from block 1954 to block 1956, which illustrates the configuration API 1706 selecting a next result pointer to be processed. Next, at block 1958, the configuration API 1706 identifies and creates temporary pointers to all of the top-level Dial instances belonging to the Dial group instance corresponding to the DIDS 1202 referenced by the current result pointer. The top-level Dial instances are identified by locating the highest-level DIDS 1202 for each output pointer 1238 for which the type field 1220 in the associated DDDS 1220 specifies a type other than Dial group. In other words, the configuration API 1706 may have to search down through one or more hierarchical Dial groups to locate the relevant top-level Dial instances.

The process illustrated in FIG. 19B then enters a loop beginning at block 1959 in which each of the top-level Dial instances belonging to the Dial group corresponding to the Dial group DIDS 1202 referenced by the current result pointer is individually processed to obtain the value(s) of the top-level Dial instance(s). The process next proceeds to block 1960, which depicts configuration API 1706 utilizing output pointers 1238 of the DIDS 1202 of the first (or next) top-level Dial instance (and those of any lower-level DIDS 1202 in the Dial tree) to build a data set containing the latch names from the latch name fields 1244 of latch data structures 1204 corresponding to all configuration latches ultimately controlled by the top-level Dial instance. Next, as depicted at block 1962, the configuration API 1706 makes one or more API calls to GETFAC( ) API 1712 of simulator 1710 to obtain from simulation model 1700 the latch values of all of the configuration latches listed in the data set constructed at block 1960.

Following block 1962, the process proceeds to block 1963, which illustrates configuration API 1706 checking the DDDS 1200 of the Dial instance specified in the API call for the presence of a non-NULL mapping function pointer 1500. If DDDS 1200 contains a NULL mapping function pointer, no mapping function is called, and the process simply passes to block 1924. If, however, DDDS 1200 contains a non-NULL mapping function pointer 1500, configuration API 1706 invokes the mapping function within mapping function table 1502 indicated by mapping function pointer 1500 to transform the latch value(s) obtained at block 1962. As discussed above, the mapping function is invoked by calling the read entry point 1306 utilizing the latch values as the "in" parameter. The mapping function transforms the latch value(s) and returns transformed values as the "out" parameter.

At block 1964, configuration API 1706 then verifies the possibly transformed latch values obtained from simulation model 1700 by reference to configuration database 1704, utilizing the same technique described above with reference to block 1924 of FIG. 19A. If at any point in this verification process, a Dial instance's output value generated by the verification process does not correspond to one of the legal values enumerated in its mapping table 1224, an error is detected at block 1966. Accordingly, the latch values read from simulation model 1700 and an error indication are placed in a result data structure, as illustrated at block 1970. If no error is detected, the Dial input value generated by the verification process and a success indication are placed in the result data structure, as shown at block 1968.

Following either block 1968 or block 1970, the process returns to block 1959, which represents a determination of whether or not all top-level Dials belonging to the Dial group corresponding to the DIDS 1202 referenced by the current result pointer have been processed. If not, the process returns to block 1960, which has been described. However, if all top-level Dials have been processed, the process returns to block 1954, which illustrates a determination of whether or not all result pointers have been processed. If not, the next result pointer is processed at block

1956 and following blocks, which have been described. If, however, all result pointers have been processed, the process passes to block 1980–1682, which illustrates the configuration API 1706 returning the result data structure to RTX 1720 and then terminating.

Reading Dial and Dial group instances in a batch mode of RTX 1720 is preferably handled by configuration APIs 1706 in the same manner as interactive mode, with one exception. Whereas in interactive mode latch values are always read from simulation model 1740 via calls to GETFAC( ) API 1712 at blocks 1622 and 1662, in batch mode a latch value is preferably obtained from latch value field 1246 of a latch data structure 1204 in configuration database 1704 if latch set field 1248 indicates that the corresponding configuration latch has been set. If the configuration latch has not been set, the latch value is obtained from simulation model 1740 by a call to GETFAC( ) API 1712. This difference ensures that Dial settings made in batch mode, which may not yet have been reflected in simulation model 1700, are correctly reported.

Figure 20A:
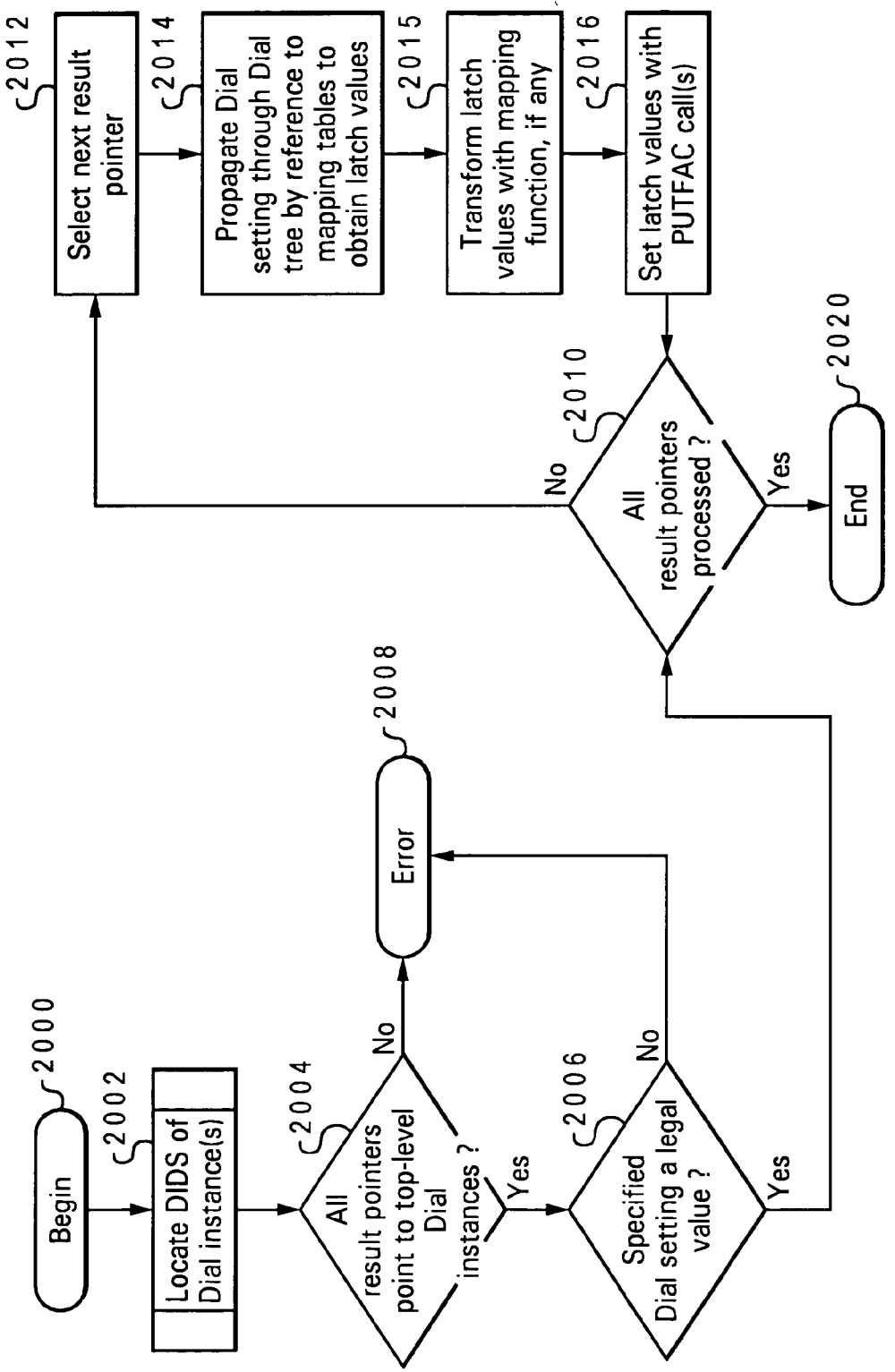
FIG. 20A is a high level logical flowchart of an illustrative method of setting a Dial instance in an interactive mode during simulation of a digital design in accordance with the present invention.

With reference now to FIG. 20A, there is illustrated a high level logical flowchart of an exemplary process by which an RTX sets a Dial instance in an interactive mode in accordance with the present invention. The process begins at block 2000 in response to receipt by a configuration API 1706 of a set_Dial( ) API call from RTX 1720. In response to the set_Dial( ) API call, the configuration API 1706 first locates and generates temporary result pointers pointing to the DIDS 1202 of the Dial instance(s) specified in the set_Dial( ) API call utilizing the technique described above with reference to FIG. 18, as illustrated at block 2002. Next, the configuration API 1706 determines at block 2004 whether or not all of the temporary result pointers point to DIDSs 1202 of top-level Dial instances. This determination can be made, for example, by examining the parent pointer 1233 of each such DIDS 1202 (and that of any higher level DIDS 1202 linked by a parent pointer 1233) and the type fields 1220 of the associated DDDSs 1200. The DIDS 1202 of a top-level Dial instance will have either a NULL parent pointer 1233 or a non-NULL parent pointer 1233 pointing to another DIDS 1202 that the type field 1220 of the associated DDDS 1200 indicates represents a Dial group. If any of the DIDSs 1202 referenced by the result pointers does not correspond to a top-level Dial instance, the process terminates at block 2008 with an error condition.

In response to a determination at block 2004 that all of the DIDSs 1202 referenced by the result pointers correspond to top-level Dial instances, a further determination is made at block 2006 whether or not the specified value to which the Dial instance(s) are to be set is one of the values specified in the mapping table 1224 of the associated DDDS 1200. If not, the process terminates with an error at block 2008. However, in response to a determination at block 2006 that the specified value to which the Dial instance(s) are to be set is one of the legal values, the process enters a loop including blocks 1710–1716 in which each result pointer is processed to set a respective Dial instance.

At block 2010, configuration API 1706 determines whether or not all result pointers have been processed. If so, the process terminates at block 2020. If, however, additional result pointers remain to be processed, the next result pointer to be processed is selected at block 2012. Next, at block 2014, configuration API 1706 propagates the Dial setting specified in the set_Dial( ) API call down the Dial tree headed by the top-level Dial instance associated with the DIDS 1202 referenced by the current result pointer. In order to propagate the desired Dial setting, mapping table 1224 in the DDDS 1200 associated with the DIDS 1202 referenced by the current result pointer is first referenced, if necessary, (i.e., for CDials and LDials) to determine the output values for each of output pointers 1238 in the output pointer array 1236 of the DIDS 1202 referenced by the current result pointer. These output values are propagated down the Dial tree as the input values of the next lower-level Dial instances, if any, corresponding to the DIDSs 1202 referenced by output pointers 1238. This propagation continues until a latch value is determined for each configuration latch terminating the Dial tree (which are represented in configuration database 1704 by latch data structures 1204).

Following block 2014, the process proceeds to block 2015, which illustrates configuration API 1706 checking the DDDS 1200 of the Dial instance specified in the API call for the presence of a non-NULL mapping function pointer 1500. If DDDS 1200 contains a NULL mapping function pointer, no mapping function is called, and the process simply passes to block 2016. If, however, DDDS 1200 contains a non-NULL mapping function pointer 1500, configuration API 1706 invokes the mapping function within mapping function table 1502 indicated by mapping function pointer 1500 to transform the latch value(s) obtained at block 2014. As discussed above, the mapping function is invoked by calling the set entry point 1310 utilizing the latch values as the "in" parameter. The mapping function transforms the latch value(s) and returns transformed values as the "out" parameter.

As shown at block 2016, as each (possibly transformed) latch value for a configuration latch is determined, the configuration API 1706 makes a call to PUTFAC( ) API 1714 to set the configuration latch in simulation model 1700 to the determined value utilizing the latch name specified within the latch name field 1244 of the corresponding latch data structure 1204.

Thereafter, the process returns to block 2010, which represents the processing of the top-level Dial corresponding to the next result pointer. After all result pointers are processed, the process terminates at block 2020.

Figure 20B:
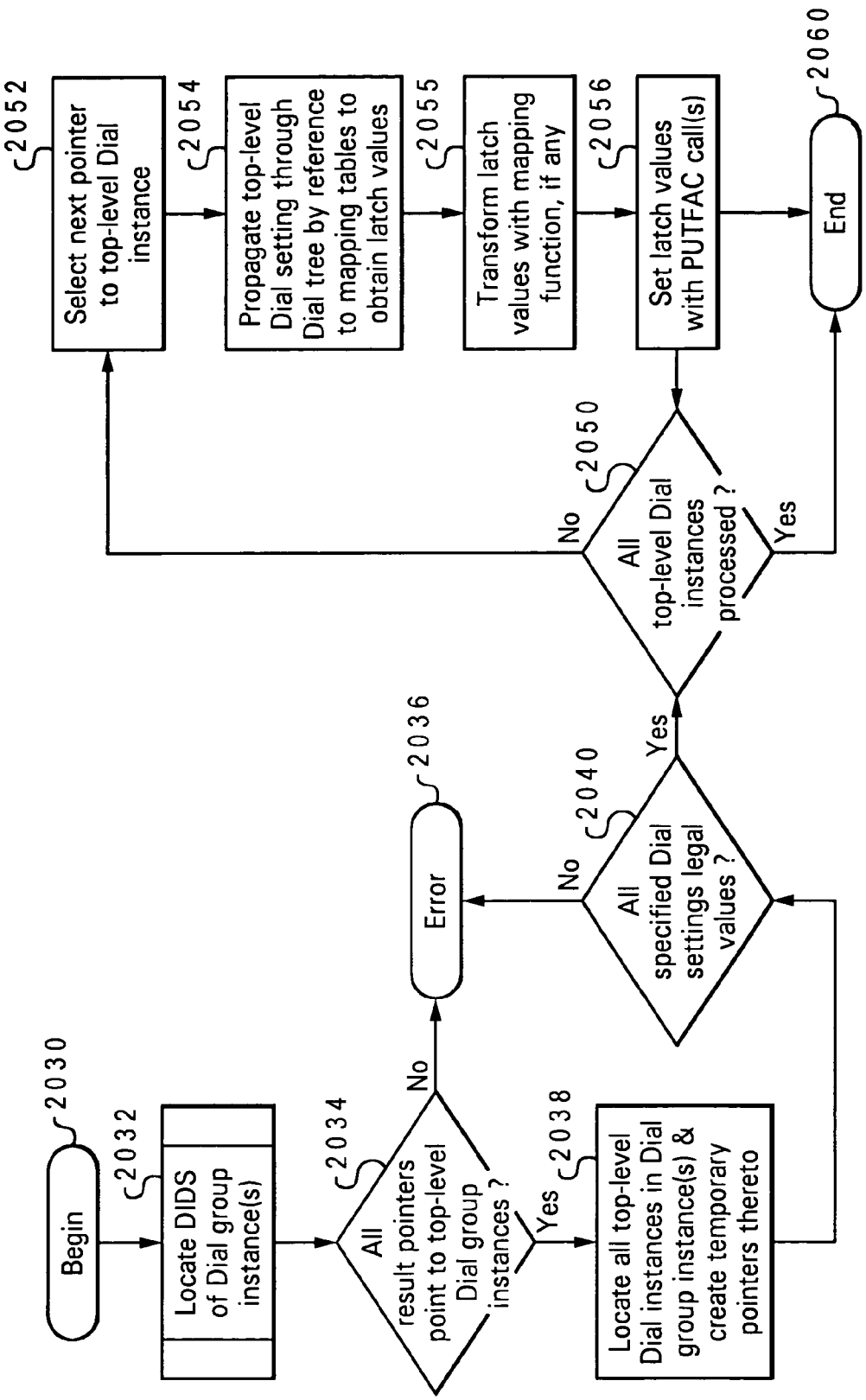
FIG. 20B is a high level logical flowchart of an exemplary method of setting a Dial group instance in an interactive mode during simulation of a digital design in accordance with the present invention.

Referring now to FIG. 20B, there is depicted a high level logical flowchart of an illustrative process by which an RTX sets a Dial group in an interactive mode in accordance with the present invention. The process begins at block 2030 in response to receipt by a configuration API 1706 of a set_Dial_group( ) API call from an RTX 1720. In response to the set_Dial_group( ) API call, the configuration API 1706 first locates and generates temporary result pointers pointing to the DIDS 1202 of the Dial group instance(s) specified in the set_Dial_group( ) API call utilizing the technique described above with reference to FIG. 18, as depicted at block 2032. Next, the configuration API 1706 determines at block 2034 whether or not all of the temporary result pointers point to DIDSs 1202 of top-level Dial group instances. This determination can be made, for example, by examining the parent pointer 1233 of each such DIDS 1202 to ascertain whether the parent pointer 1233 is NULL. If any of the DIDSs 1202 referenced by the result pointers does not correspond to a top-level Dial group (i.e., has a non-NULL parent pointer 1233), the process terminates at block 2036 with an error condition.

In response to a determination at block 2034 that each of the DIDSs 1202 referenced by the result pointers corresponds to a top-level Dial group, the process passes to blocks 2038–2040. Block 2038 illustrates configuration API 1706 locating all of the top-level Dial instances within each Dial group for which the corresponding DIDS 1202 is referenced by a result pointer. Then, as depicted at block

2040, the configuration API 1706 determines whether or not the specified value to which each top-level Dial instance is to be set is one of the values specified in the mapping table 1224 of the corresponding DDDS 1200. If not, the process terminates with an error at block 2036.

In the illustrated embodiment, the prevalidation steps illustrated at blocks 2034, 2038 and 2040 are performed prior to setting any Dial instances because it is deemed preferable to implement setting a Dial group instance as an atomic operation that either successfully sets all relevant top-level Dial instances or completely fails. In this manner, a complex condition in which some top-level Dial instances within the Dial group instance are set and others are not can be avoided.

In response to a determination at block 2040 that the specified value to which each top-level Dial instance is to be set is one of the legal values, the process enters a loop including blocks 2050–2056 in which each result pointer is processed to set the top-level Dial instance(s) belonging to each Dial group instance.

At block 2050, the configuration API 1706 determines whether or not all result pointers have been processed. If so, the process terminates at block 2060. If, however, additional result pointers remain to be processed, the next result pointer to be processed is selected at block 2052. Next, at block 2054, configuration API 1706 propagates the Dial setting specified for each top-level Dial in the set_Dial_group( ) API call down the Dial trees of the top-level Dial instances belonging to the Dial group instance corresponding to the DIDS 1202 referenced by the current result pointer. The propagation of Dial settings down the Dial trees is performed in the same manner discussed above with reference to block 2014 of FIG. 20A.

Following block 2054, the process proceeds to block 2055, which illustrates configuration API 1706 checking the DDDS 1200 of the Dial instance specified in the API call for the presence of a non-NULL mapping function pointer 1500. If DDDS 1200 contains a NULL mapping function pointer, no mapping function is called, and the process simply passes to block 2016. If, however, DDDS 1200 contains a non-NULL mapping function pointer 1500, configuration API 1706 invokes the mapping function within mapping function table 1502 indicated by mapping function pointer 1500 to transform the latch value(s) obtained at block 2054. As discussed above, the mapping function is invoked by calling the set entry point 1310 utilizing the latch values as the "in" parameter. The mapping function transforms the latch value(s) and returns transformed values as the "out" parameter.

As shown at block 2056, as each possibly transformed latch value for a configuration latch is determined, the configuration API 1706 makes a call to PUTFAC( ) API 1714 to set the configuration latch in simulation model 1700 to the determined value utilizing the latch name specified within the latch name field 1244 of the corresponding latch data structure 1204. Thereafter, the process returns to block 2050, which represents the processing of the top-level Dial corresponding to the next result pointer, if any.

Figure 21:
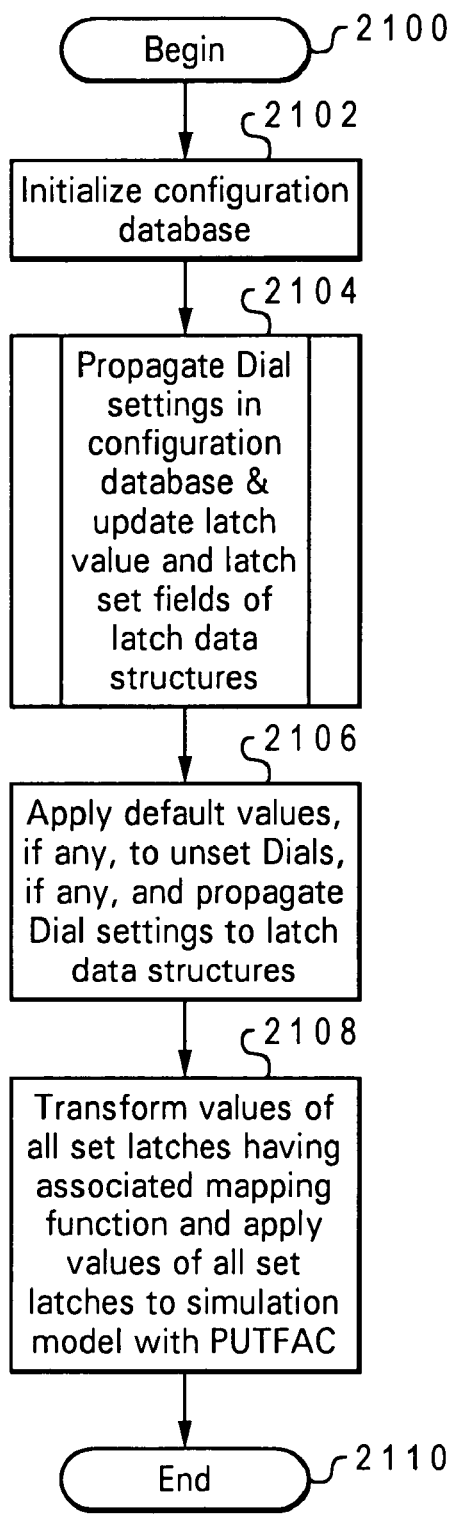
FIG. 21 is a high level logical flowchart of an illustrative method of setting a Dial instance or Dial group instance in a batch mode during simulation of a digital design in accordance with the present invention.

With reference now to FIG. 21, there is illustrated a high level logical flowchart of an exemplary method of setting Dial and Dial group instances in batch mode in accordance with the present invention. As illustrated, the process begins at block 2100 and thereafter proceeds to block 2102, which illustrates RTX 1720 initializing configuration database 1704 by calling a configuration API 1706 (e.g., start_batch( )) in order to initialize configuration database 1704. The start_batch( ) API routine initializes configuration database 1704, for example, by setting each Dial set field 1239 and latch set field 1248 in configuration database 1704 to FALSE. By resetting all of the "set" fields in configuration database 1704, the Dials and configuration latches that are not set by the current batch mode call sequence can be easily detected, as discussed below.

Following initialization of configuration database 1704, RTX 1720 issues a batch mode set_Dial( ) or set_Dial_group( ) API call to enter settings for Dial instances and their underlying configuration latches into configuration database 1704. A configuration API 1706 responds to the API call in the same manner described above with respect to FIG. 20A (for setting Dial instances) or FIG. 20B (for setting Dial group instances), with two exceptions. First, when any top-level or lower-level Dial instances are set, whether as a result of a set_Dial( ) or set_Dial_group( ) API call, the Dial set field 1239 of the corresponding DIDS 1202 is set to TRUE. Second, no latch values are written to simulation model 1700 by the "set" API routines, as illustrated at blocks 2016 and 2056 of FIGS. 20A–20B. Instead, the latch values are written into latch value fields 1246 of the latch data structure 1204 corresponding to each affected configuration latch, and the latch set field 1248 is updated to TRUE. In this manner, the Dial instances and configuration latches that are explicitly set by the API call can be readily identified during subsequent processing. It should be noted that as Dial instances are set by the propagation of settings down Dial trees, any mapping functions associated with the Dial instances (as indicated by mapping function pointer 1500 in the associated DDDS 1200 ) are applied to transform values, as discussed above.

Following block 2104, the process passes to block 2106, which illustrates RTX 1720 calling an end_batch( ) API routine among configuration APIs 1706 to complete the batch mode access. As illustrated at block 2106, the end_batch( ) API routine first applies default values, if any, to any Dial instances not explicitly set at block 2104, if a default mode is enabled (e.g., through a parameter of the end_batch( ) API call or an operational parameter of RTX 1720). To apply default values, the end_batch( ) API routine locates all unset top-level Dial instances (i.e., those for which Dial set field 1239 is FALSE) in configuration database 1704 and applies the default value, if any, specified in the default field 1229 of the associated DDDS 1200. These default values are propagated down the Dial tree of each affected top-level Dial (applying the mapping function, if any, associated with each Dial instance) and utilized to set latch value fields 1246, Dial set field 1239 and latch set field 1248 in the manner described above with reference to block 2104. The end_batch( ) API routine then traverses the Dial tree of each top-level CDial that remains unset following the application of default values to top-level Dials and applies the default value of the next highest-level Dial instance in each branch of the Dial tree that has a specified default value. Again, these default values are propagated down the Dial tree of each affected lower-level Dial (applying the relevant mapping functions) and utilized to set latch value fields 1246, Dial set field 1239 and latch set field 1248 in the manner described above with reference to block 2104. This methodology of applying default values allows default values higher in a Dial tree to have precedence over default values lower in the Dial tree.

After default values have been optionally applied as illustrated at block 2106, the end_batch( ) API routine utilizes latch pointer array 1210 to examine each latch data structure 1204 in configuration database 1704. For each latch data structure 1204 in which latch set field 1248 has the value TRUE, the end_batch( ) API routine issues a call to PUTFAC( ) API 1714 of simulator 1710 to update simulation model 1700 with the latch value contained in latch value field 1246. Thereafter, the batch process terminates at block 2110.

Configuration APIs 1706 preferably further include a find_unset_latch( ) API that, following a batch mode setting of Dial or Dial group instances in configuration database 1704, audits all of the latch data structures 1204 in configuration database 1204 by reference to latch pointer array 1210 in order to detect configuration latches that have not been configured by an explicit or default setting (i.e., those having latch set field 1248 set to FALSE). For each such unset configuration latch, the find_unset_latch( ) API preferably returns the fully qualified instance name of the configuration latch from latch name field 1244 in the corresponding latch data structure 1204 and the fully qualified instantiation identifier of the top-level Dial instance that controls the unset latch. The find_unset_latch( ) API thus provides an automated mechanism for a user to verify that all Dial and latch instances requiring an explicit or default setting are properly configured for a simulation run.

Configuration APIs 1706 preferably further include a check_model( ) API that, when called, utilizes top-level pointer array 1206 to verify by reference to the appropriate mapping tables 1224 that each top-level CDial and LDial instance in simulation model 1700 is set to one of its legal values. Any top-level LDial or CDial set to an illegal value is returned by the check_model( ) API.

The Dial and Dial group primitives introduced by the present invention can be employed not only to configure a simulation model of a digital design as described above, but also to configure hardware realizations of the digital design for laboratory testing and customer use. In accordance with an important aspect of the present invention, hardware realizations of the digital design are configured by reference to a hardware configuration database, which like configuration databases 814' and 1704 discussed above, is derived from configuration specification statements coded by the designers. The hardware configuration database may then be utilized to read and set latches within a hardware realization of a digital design according to the process hereinbefore described. In this manner, continuity in configuration methodology exists from design, through simulation and laboratory testing, to commercial deployment of a digital design. Because the derivation and use of a hardware configuration database is described in detail in the above-referenced application, it is not described further herein.

As described above, the present invention provides improved methods, systems and program products supporting the association of arbitrary mapping functions within configuration constructs, such as Dials, in a digital design. By employing mapping functions in this way, users may advantageously interact with a simulation model or hardware implementation of a digital design by reading and setting values of Dial instances utilizing intuitive "logical" or "natural" values, rather than implementation-specific values.

While the invention has been particularly shown as described with reference to a preferred embodiment, it will be understood by those skilled in the art that various changes in form and detail may be made therein without departing from the spirit and scope of the invention. For example, it will be appreciated that the concepts disclosed herein may be extended or modified to apply to other types of configuration constructs having different rules than the particular exemplary embodiments disclosed herein. In addition, although aspects of the present invention have been described with respect to a computer system executing software that directs the functions of the present invention, it should be understood that present invention may alternatively be implemented as a program product for use with a data processing system. Programs defining the functions of the present invention can be delivered to a data processing system via a variety of signal-bearing media, which include, without limitation, non-rewritable storage media (e.g., CD-ROM), rewritable storage media (e.g., a floppy diskette or hard disk drive), and communication media, such as digital and analog networks. It should be understood, therefore, that such signal-bearing media, when carrying or encoding computer readable instructions that direct the functions of the present invention, represent alternative embodiments of the present invention.

In addition, it will be appreciated that mapping functions in accordance with the present invention are not restricted to use with IDials, LDials and CDials, but are instead applicable to other type of Dials, for example, the read-only Dials disclosed in the above-referenced patent application.

What is claimed is:

1. A method in a data processing system of associating a mapping function with a configuration construct of a digital design defined by one or more hardware description language (HDL) files, said method comprising:

in an HDL statement within one of one or more HDL flies representing a digital design, specifying a configuration latch within a design entity forming at least a portion of the digital design;

in the one or more HDL files, specifying a Dial defining a relationship between each of a plurality of Dial input values of the Dial and a respective one of a plurality of different Dial output values of the Dial;

in the one or more HDL files, including a statement that instantiates an instance of said Dial in association with said configuration latch such that a one-to-one correspondence exists between a configuration value contained within said configuration latch and a Dial input value of said instance of said Dial; and in the one or more HDL files, including a statement associating the Dial with said mapping function that applies a selected transformation to Dial input values read from or written to said instance of said Dial wherein the selected transformation is selected from a set of transformations consisting of a mathematical transformation, logical transformation, a shift and generation of pseudo-random value.

2. The method of claim 1, wherein including a statement associating the Dial with said mapping function comprises including a statement associating the Dial with a mathematical transformation.

3. The method of claim 1, wherein including a statement associating the Dial with said mapping function comprises including a statement associating the Dial with a transformation that shifts a value to which said mapping function is applied.

4. The method of claim 1, wherein specifying a Dial comprises specifying an Integer Dial (IDial) for which said plurality of Dial input values are integer values.

5. The method of claim 4, wherein said mapping function comprises generation of a pseudo-random integer value.

6. The method of claim 1, wherein said Dial comprises a read-only Dial.

7. A data processing system, comprising:

processing resources; and data storage coupled to said processing resources and including an electronic computer-aided design (ECAD) tool executable by said processing resources, said ECAD tool including:

means for specifying, in an HDL statement within one or more HDL files representing a digital design, a configuration latch within a design entity forming at least a portion of the digital design;

means for specifying, in the one or more HDL files, a Dial defining a relationship between each of a plurality of Dial input values of the Dial and a respective one of a plurality of different Dial output values of the Dial;

means for including, within the one or more HDL files, a statement instantiating instance of said Dial in association with said configuration latch such that a one-to-one correspondence exists between a configuration value contained within said configuration latch and Dial input value of said instance of said Dial; and means for including, within the one or more HDL files, a statement associating the Dial with a mapping function that applies a selected transformation to Dial input values read from or written to said instance of said Dial wherein the selected transformation is selected from a set of transformations consisting of a mathematical transformation, logical transformation, a shift and generation of pseudo-random value.

8. The data processing system of claim 7, wherein said means for including a statement associating the Dial with said mapping function comprises means for including a statement associating the Dial with a mathematical transformation.

9. The data processing system of claim 7, wherein said means for including a statement associating the Dial with said mapping function comprises means for including a statement associating the Dial wit a transformation tat shifts a value to which said mapping function is applied.

10. The data processing system of claim 7, wherein said means for specifying a Dial comprises means for specifying an Integer Dial (IDial) for which said plurality of Dial input values are integer values.

11. The data processing system of claim 10, wherein said mapping function comprises generation of a pseudo-random integer value.

12. The data processing system of claim 7, wherein said Dial comprises a read-only Dial.

13. A program product for associating a mapping function with a configuration construct of a digital design defined by one or more hardware description language (RDL) files, said program product comprising a computer usable medium including:

means for specifying, in an HDL statement within one or more HDL flies representing a digital design, a configuration latch within a design entity forming at least a portion of the digital design;

means for specifying, in the one or more HDL files, a Dial defining a relationship between each of a plurality of Dial input values of the Dial and a respective one of a plurality of different Dial output values of the Dial;

means for including, within the one or more HDL files, a statement instantiating instance of said Dial in association with said configuration latch such that a one-to-one correspondence exists between a configuration value contained within said configuration latch and a Dial input value of said instance of said Dial; and means for including, within the one or more HDL files, a statement associating the Dial with said mapping function that applies a selected transformation to Dial input values read from or written to said instance of said Dial wherein the selected transformation is selected from a set of transformations consisting of a mathematical transformation, logical transformation, a shift and generation of pseudo-random value.

14. The program product of claim 13, wherein said means for including a statement associating the Dial with said mapping function comprises means for including a statement associating the Dial with a mathematical transformation.

15. The program product of claim 13, wherein said means for including a statement associating the Dial with said mapping function comprises means for including a statement associating the Dial with a transformation that shifts a value to which said mapping function is applied.

16. The program product of claim 13, wherein said means for specifying a Dial comprises means for specifying an Integer Dial (IDial) for which said plurality of Dial input values are integer values.

17. The program product of claim 16, wherein said mapping function comprises generation of a pseudo-random integer value.

18. The program product of claim 13, wherein said Dial comprises a read-only Dial.

\* \* \* \* \*